US012635303B2

(12) United States Patent
Yun et al.

(10) Patent No.: US 12,635,303 B2
(45) Date of Patent: May 19, 2026

(54) DISPLAY DEVICE

(71) Applicant: Samsung Display Co., LTD., Yongin-si (KR)

(72) Inventors: Hae Ju Yun, Hwaseong-si (KR); Won Tae Kim, Suwon-si (KR); Soo Hyun Moon, Suwon-si (KR); Jun Seok Min, Suwon-si (KR); Woo Guen Jang, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 625 days.

(21) Appl. No.: 18/063,036

(22) Filed: Dec. 7, 2022

(65) Prior Publication Data

US 2023/0261144 A1 Aug. 17, 2023

(30) Foreign Application Priority Data

Feb. 14, 2022 (KR) ........................ 10-2022-0019009

(51) Int. Cl.
H10H 20/831 (2025.01)
H10H 20/851 (2025.01)
(Continued)

(52) U.S. Cl.
CPC .... H10H 20/8312 (2025.01); H10H 20/8514 (2025.01); H10H 20/857 (2025.01); H10H 29/142 (2025.01)

(58) Field of Classification Search
CPC ............. H10H 20/8312; H10H 20/813; H10H 20/8513; H10H 29/142; H10H 20/8514; H10H 20/857
See application file for complete search history.

(56) References Cited

U.S. PATENT DOCUMENTS 11,004,835 B2 5/2021 Pschenitzka
11,694,998 B2 7/2023 Pschenitzka
(Continued)

FOREIGN PATENT DOCUMENTS

EP 3 913 683 A1 11/2021
TW 202014047 A * 4/2020 ........... H10H 29/882
(Continued)

OTHER PUBLICATIONS

Partial European Search Report issued in corresponding application No. EP 23156652.2, dated Jul. 13, 2023, 12 pages.

Primary Examiner — Monica D Harrison
Assistant Examiner — Jacob T Nelson
(74) Attorney, Agent, or Firm — Womble Bond Dickinson (US) LLP

(57) ABSTRACT

A display device includes: sub-pixels including first and second electrodes extending in a first direction and spaced apart in a second direction and a plurality of light emitting elements on and electrically connected to the first and second electrodes; a bank layer extending around a region at where the light emitting elements are arranged; and a plurality of wavelength conversion layers and light transmitting layers in the region bounded by the bank layer. The sub-pixels include: a first sub-pixel including a first wavelength conversion layer overlapping the light emitting elements in the region bounded by the bank layer; and a second sub-pixel including a second wavelength conversion layer, a third wavelength conversion layer containing different wavelength conversion particles that the second wavelength conversion layer, and a first light transmitting layer, each of which overlaps some of the light emitting elements, in the region bounded by the bank layer.

18 Claims, 38 Drawing Sheets

(51) Int. Cl.
    *H10H 20/857*      (2025.01)
    *H10H 29/14*       (2025.01)

(56)           References Cited

U.S. PATENT DOCUMENTS

| 12,218,112 | B2 | 2/2025 | Pschenitzka | |
| 2020/0043976 | A1* | 2/2020 | Kim | H10H 20/856 |
| 2025/0140763 | A1 | 5/2025 | Pschenitzka | |

FOREIGN PATENT DOCUMENTS

| WO | 2020033206 | A1 | 2/2020 |
| WO | WO 2022/019547 | A1 | 1/2022 |
| WO | WO 2022/025395 | A1 | 2/2022 |

\* cited by examiner

PX

SPX1   SPX2   SPX3   SPX4

EMA1 EMA2 EMA3 EMA4

10

NDA

DPA

DR1

DR2

EMA: EMA1, EMA2, EMA3, EMA4

PX

SPX1 SPX2 SPX3 SPX4

BA

TA1 TA2 TA3 TA4

10

NDA DPA

TA: TA1, TA2, TA3, TA4

EMA: EMA1, EMA2, EMA3, EMA4

TA: TA1, TA2, TA3, TA4

RME: RME1, RME2
CNE: CNE1, CNE2

RME: RME1, RME2
CNE: CNE1, CNE2

CFL: CFL2, CFL3, CFL4

RME: RME1, RME2
CNE: CNE1, CNE2
EMA: EMA1, SEA, EMA3, EMA4
SEA: SEA1, SEA2, SEA3

WCL: WCL1, WCL2, WCL3, WCL4     RME: RME1, RME2
TPL: TPL1, TPL2     TA: TA1, TA2, TA3, TA4
    TA2: STA1, STA2, STA3

CFL: CFL2, CFL3, CFL4

EMA: EMA1, EMA2, EMA3, EMA4

EMA: EMA1, EMA2, EMA3, EMA4

RME: RME1, RME2, RME3, RME4, RME5, RME6
CNE: CNE1, CNE2, CNE3, CNE4, CNE5, CNE6
ED: ED1, ED2, ED3

RME: RME1, RME2
CNE: CNE1, CNE2

CFL: CFL2, CFL3, CFL4

RME: RME1, RME2
STA: STA1, STA2, STA3, STA4

CFL: CFL2, CFL3, CFL4

RME: RME1, RME2, RME3, RME4
CNE: CNE1, CNE2, CNE3, CNE4, CNE5
ED: ED1, ED2, ED3, ED4

RME: RME1, RME2, RME3, RME4
CNE: CNE1, CNE2, CNE3, CNE4
ED: ED1, ED2

RME: RME1, RME2, RME3, RME4
CNE: CNE1, CNE2, CNE3, CNE4

10_6

SPX1   RME1   RME3   RME2   RME4   SPX2

UBN

WCL2
STA1

WCL1
TA1

WCL3
STA2

TDL1
STA3

EMA

SA

ROP

DR1
DR2

RME: RME1, RME2, RME3, RME4
ED: ED1, ED2, ED3, ED4

DISPLAY DEVICE

CROSS-REFERENCE TO RELATED APPLICATION

This application claims priority to and the benefit of Korean Patent Application No. 10-2022-0019009, filed on Feb. 14, 2022, in the Korean Intellectual Property Office, the entire content of which is herein incorporated by reference.

BACKGROUND

1. Field

Aspects of embodiments of the disclosure relate to a display device.

2. Description of the Related Art

The importance of display devices has steadily increased with the development of multimedia technology. In response thereto, various types of display devices, such as an organic light emitting diode (OLED) displays, a liquid crystal display (LCD), and the like have been developed and are used.

From among devices for displaying an image, there is a self-light emitting display device including a light emitting element. The self-light emitting display device may include an organic light emitting display device using an organic material as a light emitting material as a light emitting element, an inorganic light emitting display device using an inorganic material as a light emitting material, or the like.

SUMMARY

Embodiments of the disclosure provide an inorganic light emitting diode display having a novel pixel arrangement structure.

However, aspects and features of the disclosure are not restricted to that set forth above. The above and other aspects and features of the disclosure will become more apparent to one of ordinary skill in the art to which the disclosure pertains by referencing the detailed description of the disclosure given below.

According to an embodiment of the disclosure, a display device includes: a plurality of sub-pixels including a first electrode and a second electrode extending in a first direction and spaced apart from each other in a second direction and a plurality of light emitting elements on and electrically connected to the first electrode and the second electrode; a bank layer extending around a region at where the light emitting elements of the sub-pixels are arranged; and a plurality of wavelength conversion layers and light transmitting layers in the region bounded by the bank layer. The sub-pixels include: a first sub-pixel including a first wavelength conversion layer overlapping the light emitting elements in the region bounded by the bank layer; and a second sub-pixel including a second wavelength conversion layer, a third wavelength conversion layer, and a first light transmitting layer, each of which overlaps some of the light emitting elements, in the region bounded by the bank layer. The second wavelength conversion layer and the third wavelength conversion layer of the second sub-pixel contain different wavelength conversion particles.

The light emitting elements overlapping the second wavelength conversion layer, the third wavelength conversion layer, and the first light transmitting layer of the second sub-pixel, respectively, may be on the same first and second electrodes.

The first wavelength conversion layer may overlap each of the light emitting elements in the first sub-pixel and may contain first wavelength conversion particles identical to those of the second wavelength conversion layer.

Each of the second wavelength conversion layer, the third wavelength conversion layer, and the first light transmitting layer of the second sub-pixel may overlap different portions of the first electrode and the second electrode.

The bank layer may divide the region at where the light emitting elements of the second sub-pixel are arranged into a plurality of sub-emission areas, and the second wavelength conversion layer, the third wavelength conversion layer, and the first light transmitting layer may be in each of the sub-emission areas.

The display device may further include a first color filter layer on the first wavelength conversion layer of the first sub-pixel, a second color filter layer on the second wavelength conversion layer, a third color filter layer on the third wavelength conversion layer, and a fourth color filter layer on the first light transmitting layer of the second sub-pixel. At least two of the second color filter layer, the third color filter layer, and the fourth color filter layer may partially overlap each other.

The second wavelength conversion layer, the third wavelength conversion layer, and the first light transmitting layer may be spaced apart from each other in the first direction.

The second wavelength conversion layer, the third wavelength conversion layer, and the first light transmitting layer may be arranged in the first direction and may be in contact with each other.

The second color filter layer and the third color filter layer may be arranged to partially overlap each other. The display device may further include a color pattern on an overlapping portion of the second color filter layer and the third color filter layer, and the color pattern may contain the same colorant as that of the fourth color filter layer.

The second wavelength conversion layer, the third wavelength conversion layer, and the first light transmitting layer of the second sub-pixel may be arranged in the first direction, the third wavelength conversion layer may partially overlap each of the second wavelength conversion layer and the first light transmitting layer, and the third color filter layer may partially overlap each of the second color filter layer and the fourth color filter layer.

The sub-pixels may further include a third sub-pixel including a fourth wavelength conversion layer overlapping the light emitting elements in the region bounded by the bank layer, and the fourth wavelength conversion layer may contain second wavelength conversion particles identical to those of the third wavelength conversion layer.

The sub-pixels may further include a fourth sub-pixel including a second light transmitting layer overlapping the light emitting elements in the region bounded by the bank layer.

The fourth wavelength conversion layer of the third sub-pixel may overlap the plurality of light emitting elements in the third sub-pixel, and the second light transmitting layer of the fourth sub-pixel may overlap the plurality of light emitting elements in the fourth sub-pixel.

According to another embodiment of the disclosure, a display device includes: a plurality of sub-pixels including a first electrode and a second electrode extending in a first direction and spaced apart from each other in a second direction and a plurality of light emitting elements on the first electrode and the second electrode and electrically connected to the first electrode and the second electrode; a bank layer extending around a region at where the light emitting elements of the sub-pixels are arranged; and a light transmitting layer in the region bounded by the bank layer. The sub-pixels include: a first sub-pixel electrically connected to the first electrode and the second electrode and including a first light emitting element configured to emit light of a first color; and a second sub-pixel including a first light emitting element electrically connected to the first electrode and the second electrode and configured to emit light of the first color, a second light emitting element configured to emit light of a second color different from the first color, and a third light emitting element configured to emit light of a third color different from the first color and the second color. The second sub-pixel includes: a third electrode and a fourth electrode electrically connected to the second light emitting element and spaced apart from the first electrode and the second electrode in the first direction, respectively; and a fifth electrode and a sixth electrode electrically connected to the third light emitting element and spaced apart from the third electrode and the fourth electrode in the first direction, respectively.

The light transmitting layer in the first sub-pixel may overlap the first light emitting element of the first sub-pixel, and the light transmitting layer in the second sub-pixel may overlap each of the first light emitting element, the second light emitting element, and the third light emitting element of the second sub-pixel.

The first light emitting element, the second light emitting element, and the third light emitting element of the second sub-pixel may be spaced apart from each other in the first direction, the bank layer may extend around each of a region at where the first light emitting element is arranged, a region at where the second light emitting element is arranged, and a region at where the third light emitting element is arranged in the second sub-pixel, and the light transmitting layer in the second sub-pixel may be in the region bounded by the bank layer in the second sub-pixel.

The sub-pixels may further include a third sub-pixel electrically connected to the first electrode and the second electrode and including the second light emitting element configured to emit light of the second color, and the light transmitting layer in the third sub-pixel may overlap the second light emitting element of the third sub-pixel.

The sub-pixels may further include a fourth sub-pixel electrically connected to the first electrode and the second electrode and including the third light emitting element configured to emit light of the third color, and the light transmitting layer in the fourth sub-pixel may overlap the third light emitting element of the fourth sub-pixel.

The second sub-pixel may include a first transistor electrically connected to the first electrode, a second transistor electrically connected to the third electrode, and a third transistor electrically connected to the fifth electrode, and the first transistor, the second transistor, and the third transistor may each be electrically connected to a first voltage line configured to receive a first power voltage.

Each of the second electrode of the first sub-pixel and the second electrode, the fourth electrode, and the sixth electrode of the second sub-pixel may be electrically connected to a second voltage line configured to receive a second power voltage different from the first power voltage, and the first sub-pixel may include one transistor electrically connected to the first electrode and the first voltage line.

However, aspects and features of the disclosure are not limited to the aforementioned aspects and features, and various other aspects and features are included in the disclosure.

BRIEF DESCRIPTION OF THE DRAWINGS

The above and other aspects and features of the disclosure will become more apparent by describing, in detail, embodiments thereof with reference to the attached drawings, in which.

DETAILED DESCRIPTION

Figure 1:
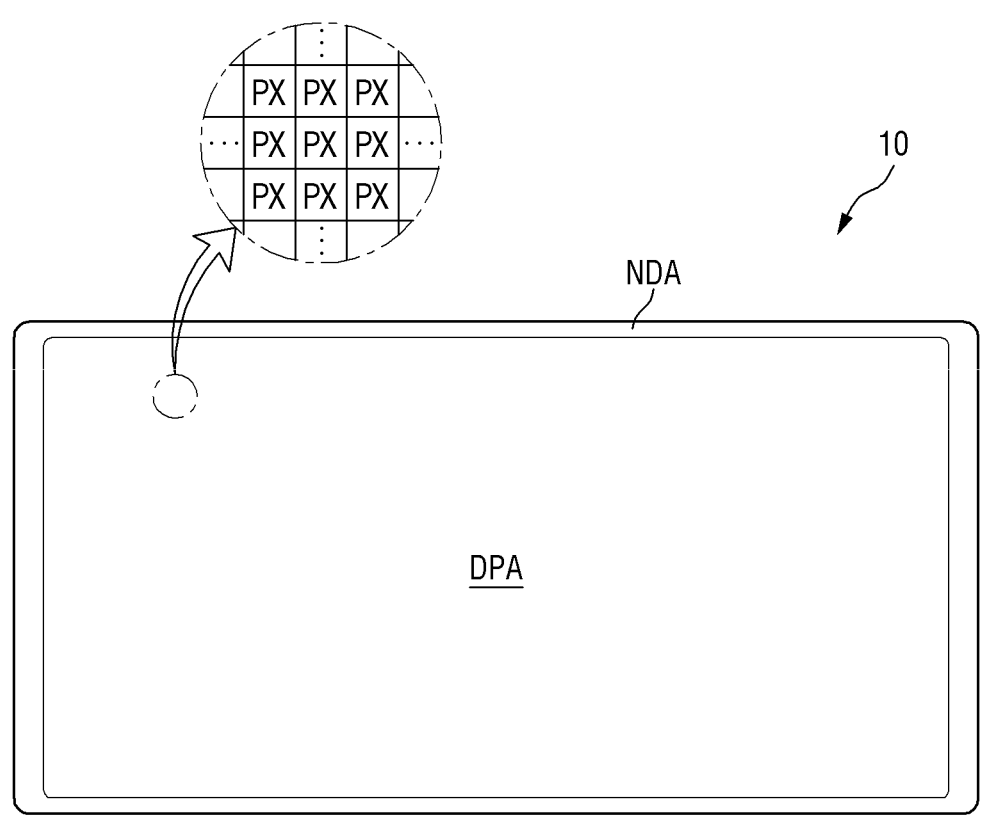
FIG. 1 is a schematic plan view of a display device according to one embodiment.
Figure 1:
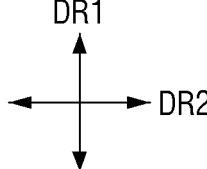

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete and will fully convey the scope of the invention to those skilled in the art.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

In the figures, dimensions of the various elements, layers, etc. may be exaggerated for clarity of illustration. The same reference numerals designate the same elements. As used herein, the term "and/or" includes any and all combinations of one or more of the associated listed items. Further, the use of "may" when describing embodiments of the disclosure relates to "one or more embodiments of the disclosure." Expressions, such as "at least one of," when preceding a list of elements, modify the entire list of elements and do not modify the individual elements of the list. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing embodiments of the disclosure and is not intended to be limiting of the disclosure. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

Hereinafter, embodiments will be described with reference to the accompanying drawings.

FIG. 1 is a schematic plan view of a display device according to one embodiment.

Referring to FIG. 1, a display device 10 displays (e.g., is configured to display) a moving image and/or a still image. The display device 10 may refer to (or may represent) any electronic device providing (or including) a display screen. Examples of the display device 10 may include a television, a laptop computer, a monitor, a billboard, an Internet-of-Things (IOT) device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game machine, a digital camera, a camcorder, and the like, which provide a display screen.

The display device 10 includes a display panel which provides a display screen. Examples of the display panel may include an inorganic light emitting diode display panel, an organic light emitting display panel, a quantum dot light emitting display panel, a plasma display panel, and a field emission display panel. In the following description, the display device 10 is described as being an inorganic light emitting diode display panel as an example, but the disclosure is not limited thereto and other display panels may be applied within the same scope of technical spirit.

The shape of the display device 10 may be variously modified (or variously changed). For example, the display device 10 may have a rectangular shape elongated in a horizontal direction, a rectangular shape elongated in a vertical direction, a square shape, a quadrilateral shape with rounded corners (e.g., vertices), another polygonal shape, and a circular shape. The shape of a display area DPA of the display device 10 may be similar to the overall shape of the display device 10. FIG. 1 illustrates an embodiment in which the display device 10 has a rectangular shape elongated in a second direction DR2.

The display device 10 may include the display area DPA and a non-display area NDA. The display area DPA is an area where a screen (or image) can be displayed, and the non-display area NDA is an area where a screen (or image) is not displayed. The display area DPA may be referred to as an active region, and the non-display area NDA may be referred to as a non-active region. The display area DPA may substantially occupy the center of the display device 10.

The non-display area NDA may be disposed around the display area DPA. The non-display area NDA may completely or partially surround, in a plan view, (e.g., may completely or partially extend around a periphery of) the display area DPA. The display area DPA may have a rectangular shape, and the non-display area NDA may be disposed adjacent to the four sides of the display area DPA. The non-display area NDA may form a bezel of the display device 10. Wires or circuit drivers included in the display device 10 may be disposed in the non-display area NDA or external devices may be mounted thereon.

Figure 2:
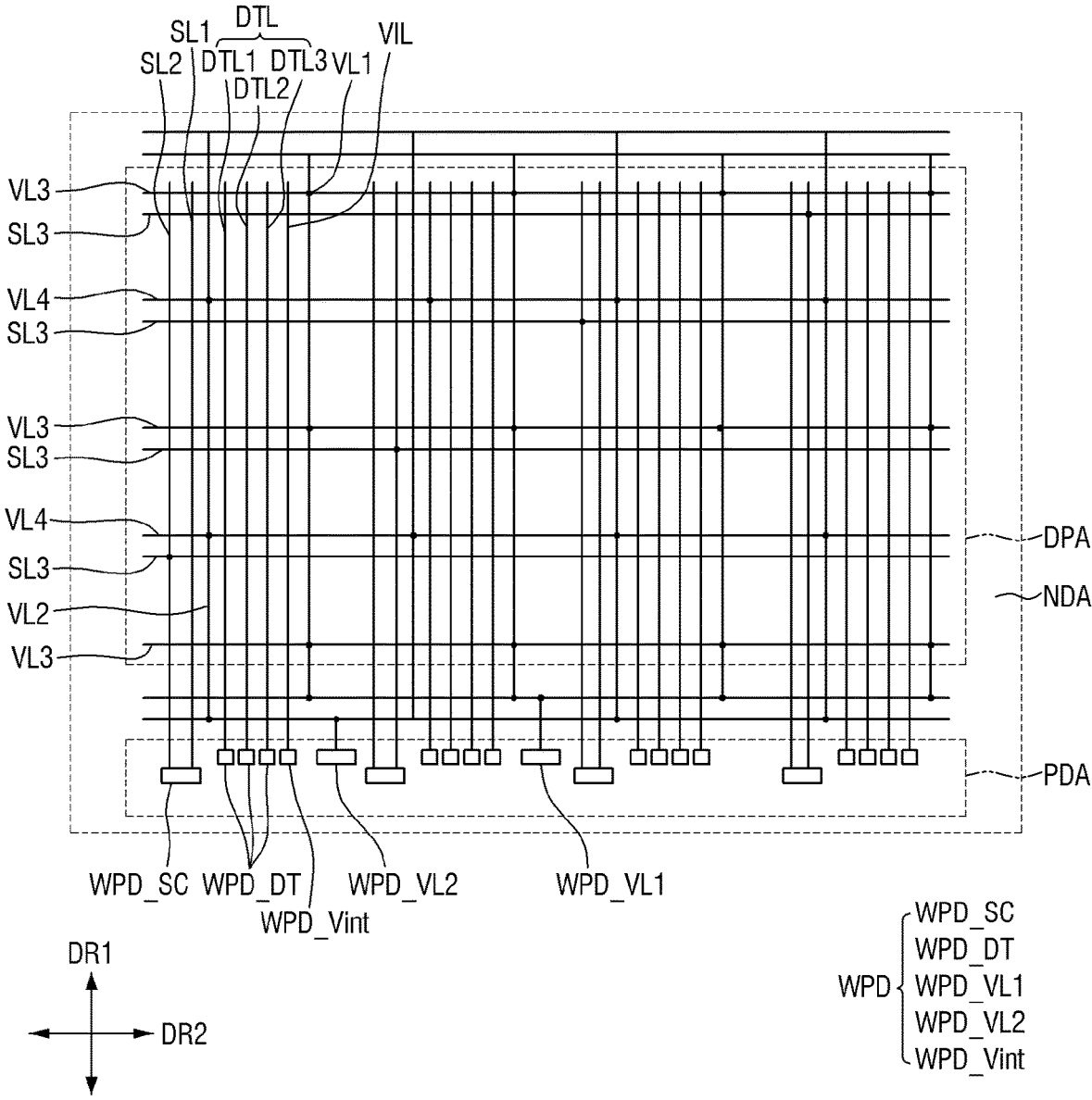
FIG. 2 is a plan view illustrating schematic arrangement of wires of a display device according to one embodiment.

FIG. 2 is a plan view illustrating schematic arrangement of wires of a display device according to one embodiment.

Referring to FIG. 2, the display device 10 may include a plurality of wires. The display device 10 may include a plurality of scan lines SL (e.g., SL1, SL2, and SL3), a plurality of data lines DTL (e.g., DTL1, DTL2, and DTL3), an initialization voltage line VIL, and a plurality of voltage lines VL (e.g., VL1, VL2, VL3, and VL4). Other wires may be further provided in the display device 10. The plurality of wires may include wires formed of a first conductive layer and extending in a first direction DR1 and wires formed of a third conductive layer and extending in the second direction DR2. However, the extension directions of the wires are not limited thereto.

The first scan line SL1 and the second scan line SL2 may be disposed to extend in the first direction DR1. The first scan line SL1 and the second scan line SL2 may be disposed adjacent to each other and spaced apart from the different first scan line SL1 and second scan line SL2 in the second direction DR2. The first scan line SL1 and the second scan line SL2 may be connected to a scan line pad WPD_SC connected to a scan driver. The first scan line SL1 and the second scan line SL2 may be disposed to extend from the pad area PDA disposed in the non-display area NDA to (or into) the display area DPA.

The third scan line SL3 may be disposed to extend in the second direction DR2 and may be disposed to be spaced apart from the other third scan line SL3 in the first direction DR1. One third scan line SL3 may be connected to one or more first scan lines SL1 or one or more second scan lines SL2. The plurality of scan lines SL may have (or may form) a mesh structure in (or over) the entire surface of the display area DPA but is not limited thereto.

The term "connected" as used herein may mean not only that one member is connected to another member through a physical contact, but also that one member is connected to another member through yet another member. This may also be understood as one part and the other part as being integral elements or as being connected into (or forming) an integrated element via another element. Furthermore, if one element is connected to another element, this may be construed as a meaning including an electrical connection via another element in addition to a direct, physical connection.

The data lines DTL may be disposed to extend in the first direction DR1. The data line DTL includes a first data line DTL1, a second data line DTL2, and a third data line DTL3, and each one of the first to third data lines DTL1, DTL2, and DTL3 forms a group and are disposed adjacent to each other. Each of the data lines DTL1, DTL2, and DTL3 may be disposed to extend from the pad area PDA disposed in the non-display area NDA to (or into) the display area DPA. However, the disclosure is not limited thereto, and the plurality of data lines DTL may be spaced apart from each other at equal intervals between a first voltage line VL1 and a second voltage line VL2, to be described later.

The initialization voltage line VIL may be disposed to extend in the first direction DR1. The initialization voltage line VIL may be disposed between the data lines DTL and the first voltage line VL1. The initialization voltage line VIL may be disposed to extend from the pad area PDA disposed in the non-display area NDA to (or into) the display area DPA.

The first voltage line VL1 and the second voltage line VL2 are disposed to extend in the first direction DR1, and the third voltage line VL3 and the fourth voltage line VL4 are disposed to extend in the second direction DR2. The first voltage line VL1 and the second voltage line VL2 may be alternately disposed in the second direction DR2, and the third voltage line VL3 and the fourth voltage line VL4 may be alternately disposed in the first direction DR1. The first voltage line VL1 and the second voltage line VL2 may be disposed to extend in the first direction DR1 to cross the display area DPA. Some of the wires of the third voltage line VL3 and the fourth voltage line VL4 may be disposed in the display area DPA and other wires may be disposed in the non-display area NDA positioned on both sides of the display area DPA in the first direction DR1, respectively. The first voltage line VL1 and the second voltage line VL2 may be formed of the first conductive layer, and the third voltage line VL3 and the fourth voltage line VL4 may be formed of the third conductive layer disposed on a layer different from the first conductive layer. The first voltage line VL1 may be connected to at least one third voltage line VL3, the second voltage line VL2 may be connected to at least one fourth voltage line VL4, and the plurality of voltage lines VL may have (or may form) a mesh structure in (or over) the entire display area DPA. However, the disclosure is not limited thereto.

The first scan line SL1, the second scan line SL2, the data line DTL, the initialization voltage line VIL, the first voltage line VL1, and the second voltage line VL2 may be electrically connected to at least one line pad WPD. Each line pad WPD may be disposed in the non-display area NDA. In one embodiment, each of the line pads WPD may be disposed in the pad area PDA positioned on a lower side in the drawing, which is the other side of the display area DPA in the first direction DR1. The first scan line SL1 and the second scan line SL2 are connected to the scan line pad WPD_SC disposed in the pad area PDA, and the plurality of data lines DTL are connected to different data line pads WPD_DT. The initialization voltage line VIL is connected to an initialization line pad WPD_Vint, the first voltage line VL1 is connected to a first voltage line pad WPD_VL1, and the second voltage line VL2 is connected to a second voltage line pad WPD_VL2. The external devices may be mounted on the line pads WPD. The external devices may be mounted on the line pads WPD by applying (or via) an anisotropic conductive film, ultrasonic bonding, or the like. In FIG. 2, each of the line pads WPD is illustrated as being disposed on the pad area PDA disposed on the lower side of the display area DPA, but the disclosure is not limited thereto. Some of the plurality of line pads WPD may be disposed in any one area on the upper side or on the left and right sides of the display area DPA.

Each pixel PX or sub-pixel SPXn (n being an integer of 1 to 3) of the display device 10 includes a pixel driving circuit. The above-described wires may pass through each pixel PX or the periphery thereof to apply a driving signal to each pixel driving circuit. The pixel driving circuit may include transistors and capacitors. The number of transistors and capacitors of each pixel driving circuit may be variously modified. According to one embodiment, in each sub-pixel SPXn of the display device 10, the pixel driving circuit may have a 3T1C structure including three transistors and one capacitor. Hereinafter, a pixel driving circuit having the 3T1C structure will be described as an example, but the disclosure is not limited thereto and the pixel driving circuit may have other structures, such as a 2T1C structure, a 7T1C structure, and a 6T1C structure.

Figure 3:
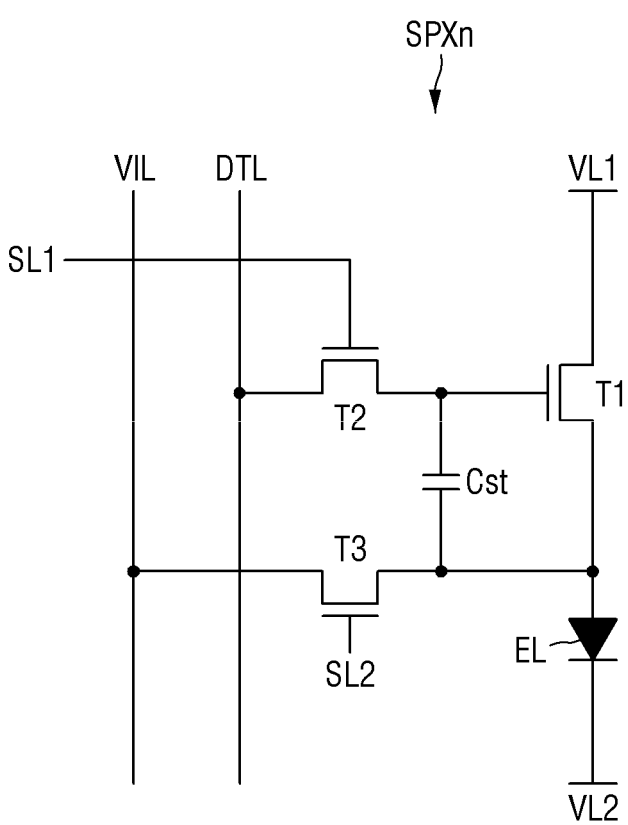
FIGS. 3 and 4 are pixel circuit diagrams of a sub-pixel disposed in a display device according to embodiments.
Figure 4:
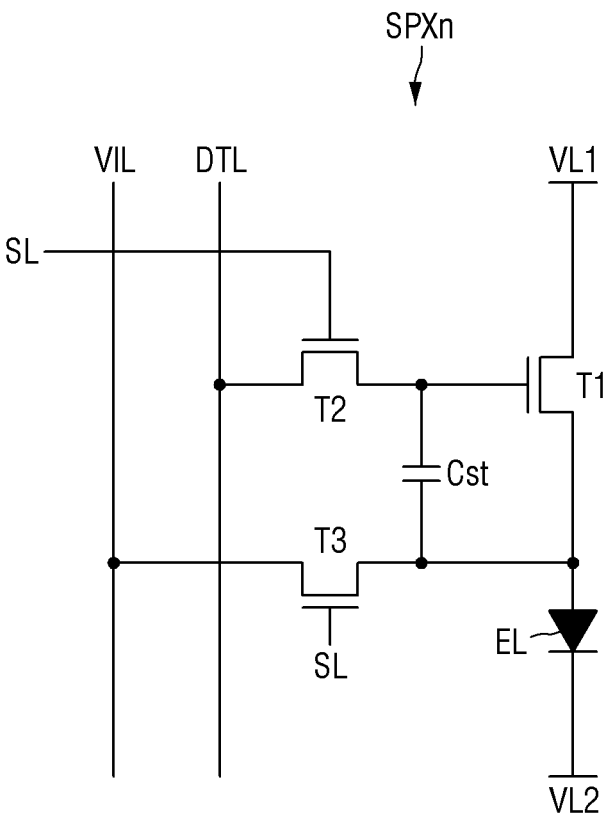

FIGS. 3 and 4 are pixel circuit diagrams of a sub-pixel disposed in a display device according to embodiments.

Referring to FIG. 3, each sub-pixel SPXn of the display device 10 according to one embodiment includes three transistors T1, T2 and T3 and one storage capacitor Cst in addition to a light emitting diode EL.

The light emitting diode EL emits light by (or according to) a current supplied through a first transistor T1. The light emitting diode EL includes a first electrode, a second electrode, and at least one light emitting element disposed between them. The light emitting element may emit light of a specific wavelength band by electrical signals transmitted from the first electrode and the second electrode.

One end of the light emitting diode EL may be connected to the source electrode of the first transistor T1, and the other end thereof may be connected to the second voltage line VL2 to which a low potential voltage (hereinafter, a second power voltage) lower than a high potential voltage (hereinafter, a first power voltage) of the first voltage line VL1 is supplied.

The first transistor T1 adjusts a current flowing from the first voltage line VL1, to which the first power voltage is supplied, to the light emitting diode EL according to the voltage difference between the gate electrode and the source electrode. For example, the first transistor T1 may be a driving transistor for driving the light emitting diode EL. The gate electrode of the first transistor T1 may be connected to the source electrode of the second transistor T2, the source electrode of the first transistor T1 may be connected to the first electrode of the light emitting diode EL, and the drain electrode of the first transistor T1 may be connected to the first voltage line VL1 to which the first power voltage is applied.

The second transistor T2 is turned on by a scan signal of a first scan line SL1 to connect the data line DTL to the gate electrode of the first transistor T1. The gate electrode of the second transistor T2 may be connected to the first scan line SL1, the source electrode thereof may be connected to the gate electrode of the first transistor T1, and the drain electrode thereof may be connected to the data line DTL.

The third transistor T3 is turned on by a scan signal of the second scan line SL2 to connect the initialization voltage line VIL to one end of the light emitting diode EL. The gate electrode of the third transistor T3 may be connected to the second scan line SL2, the drain electrode thereof may be connected to the initialization voltage line VIL, and the source electrode thereof may be connected to one end of the light emitting diode EL or to the source electrode of the first transistor T1.

The source electrode and the drain electrode of each of the transistors T1, T2, and T3 are not limited to those described above, and vice versa. Each of the transistors T1, T2, and T3 may be formed of a thin film transistor. In FIG. 3, each of the transistors T1, T2, and T3 is illustrated as being formed of an N-type metal oxide semiconductor field effect transistor (MOSFET), but the disclosure is not limited thereto. For example, in another embodiments, each of the transistors T1, T2, and T3 may be formed of a P-type MOSFET. In some embodiments, some of the transistors T1, T2, and T3 may be formed of an N-type MOSFET and the others may be formed of a P-type MOSFET.

The storage capacitor Cst is formed between the gate electrode and the source electrode of the first transistor T1. The storage capacitor Cst stores a voltage difference between a gate voltage and a source voltage of the first transistor T1.

In the embodiment shown in FIG. 3, the gate electrode of the second transistor T2 may be connected to the first scan line SL1, and the gate electrode of the third transistor T3 may be connected to the second scan line SL2. The first scan line SL1 and the second scan line SL2 may be different scan lines, and the second transistor T2 and the third transistor T3 may be turned on in response to scan signals applied from different scan lines. However, the disclosure is not limited thereto.

Referring to FIG. 4, the gate electrodes of the second transistor T2 and the third transistor T3 may be connected to the same scan line SL. The second transistor T2 and the third transistor T3 may be concurrently (or simultaneously) turned on by a scan signal applied from the same scan line.

Figure 5:
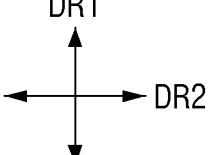
FIG. 5 is a plan view illustrating arrangement of pixels and an emission area of a display device according to one embodiment.
Figure 6:
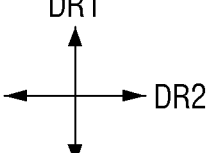
FIG. 6 is a plan view illustrating arrangement of pixels and a light transmitting area of a display device according to one embodiment.

FIG. 5 is a plan view illustrating an arrangement of pixels and an emission area of a display device according to one embodiment. FIG. 6 is a plan view illustrating an arrangement of pixels and a light transmitting area of a display device according to one embodiment.

Referring to FIGS. 5 and 6, the display device 10 may include a plurality of pixels PX. The plurality of pixels PX may be arranged in a matrix. For example, different pixels PX may be arranged in the first direction DR1 and the second direction DR2. Each pixel PX may have a rectangular or square shape in a plan view. However, the disclosure is not limited thereto, and the pixels PX may have a rhombic shape in which each side is inclined with respect to one direction. The pixels PX may be arranged in a stripe type or an island type. In addition, each of the pixels PX may include one or more light emitting elements that emit light of a specific wavelength band to display a specific color.

Each of the pixels PX may include a plurality of sub-pixels SPXn. For example, one pixel PX may include a first sub-pixel SPX1, a second sub-pixel SPX2, a third sub-pixel SPX3, and a fourth sub-pixel SPX4. The first sub-pixel SPX1, the second sub-pixel SPX2, the third sub-pixel SPX3, and the fourth sub-pixel SPX4 may be arranged to be spaced apart from each other in the second direction DR2. Each of the first sub-pixel SPX1, the second sub-pixel SPX2, the third sub-pixel SPX3, and the fourth sub-pixel SPX4 may be repeatedly arranged in the first direction DR1. However, the disclosure is not limited thereto. The layout and arrangement of the sub-pixels SPXn may vary depending on the arrangement and shape of the pixels PX of the display device 10. Although it is illustrated in the drawing that one pixel PX includes four sub-pixels SPXn, the disclosure is not limited thereto, and the pixel PX may include a greater number of sub-pixels SPXn.

The sub-pixels SPXn may include emission areas EMA1, EMA2, EMA3, and EMA4 and a non-emission area. The emission area EMA may be an area in which the light emitting element ED is disposed to generate light of a specific wavelength band. The non-emission area may be a region in which the light emitting element ED is not disposed and a region from which light is not emitted because light emitted from the light emitting element ED does not reach it. The first sub-pixel SPX1 may include a first emission area EMA1, the second sub-pixel SPX2 may include a second emission area EMA2, the third sub-pixel SPX3 may include a third emission area EMA3, and the fourth sub-pixel SPX4 may include a fourth emission area EMA4. The non-emission area of the pixel PX may be an area other than the emission areas EMA1, EMA2, EMA3, and EMA4 of the sub-pixels SPXn.

The sub-pixels SPXn may include light transmitting areas TA1, TA2, TA3, and TA4 respectively corresponding to the emission areas EMA1, EMA2, EMA3, and EMA4 and a light blocking area BA corresponding to the non-emission area. The light transmitting areas TA1, TA2, TA3, and TA4 may be areas of the sub-pixels SPXn in which lights generated from the emission areas EMA1, EMA2, EMA3, and EMA4 is emitted, and the light blocking area BA may be an area in which light is not emitted. The first sub-pixel SPX1 may include a first light transmitting area TA1, the second sub-pixel SPX2 may include a second light transmitting area TA2, the third sub-pixel SPX3 may include a third light transmitting area TA3, and the fourth sub-pixel SPX4 may include a fourth light transmitting area TA4. The light blocking area BA of the pixel PX may be an area other than the light transmitting areas TA1, TA2, TA3, and TA4 of the sub-pixels SPXn.

The light transmitting areas TA1, TA2, TA3, and TA4 of the sub-pixels SPXn may, but not necessarily, correspond to the emission areas EMA1, EMA2, EMA3 and EMA4, respectively. For example, the light transmitting areas TA1, TA2, TA3, and TA4 of the sub-pixels SPXn may not overlap the emission areas EMA1, EMA2, EMA3, and EMA4, respectively, and/or may not have the same shape as those of the light emission areas EMA1, EMA2, EMA3, and EMA4, respectively. In the pixel PX and the sub-pixels SPXn of the display device 10, the emission areas EMA1, EMA2, EMA3, and EMA4 may be areas in which light emitting elements ED (shown in FIG. 9), to be described later, are disposed to emit light, and the light transmitting areas TA1, TA2, TA3, and TA4 may be areas in which the light is emitted and displayed in the sub-pixels SPXn.

The display device 10 may include the emission areas EMA1, EMA2, EMA3, and EMA4 in which light is emitted and the light transmitting areas TA1, TA2, TA3 and TA4 in which the light is emitted. Different color light may be emitted in the emission areas EMA1, EMA2, EMA3, and EMA4 and the light transmitting areas TA1, TA2, TA3, and TA4 of the sub-pixels SPXn. For example, in the display device 10, the light emitting elements ED disposed in each sub-pixel SPXn may emit light of the same color, whereas lights emitted from the sub-pixels SPXn may have different colors.

Figure 7:
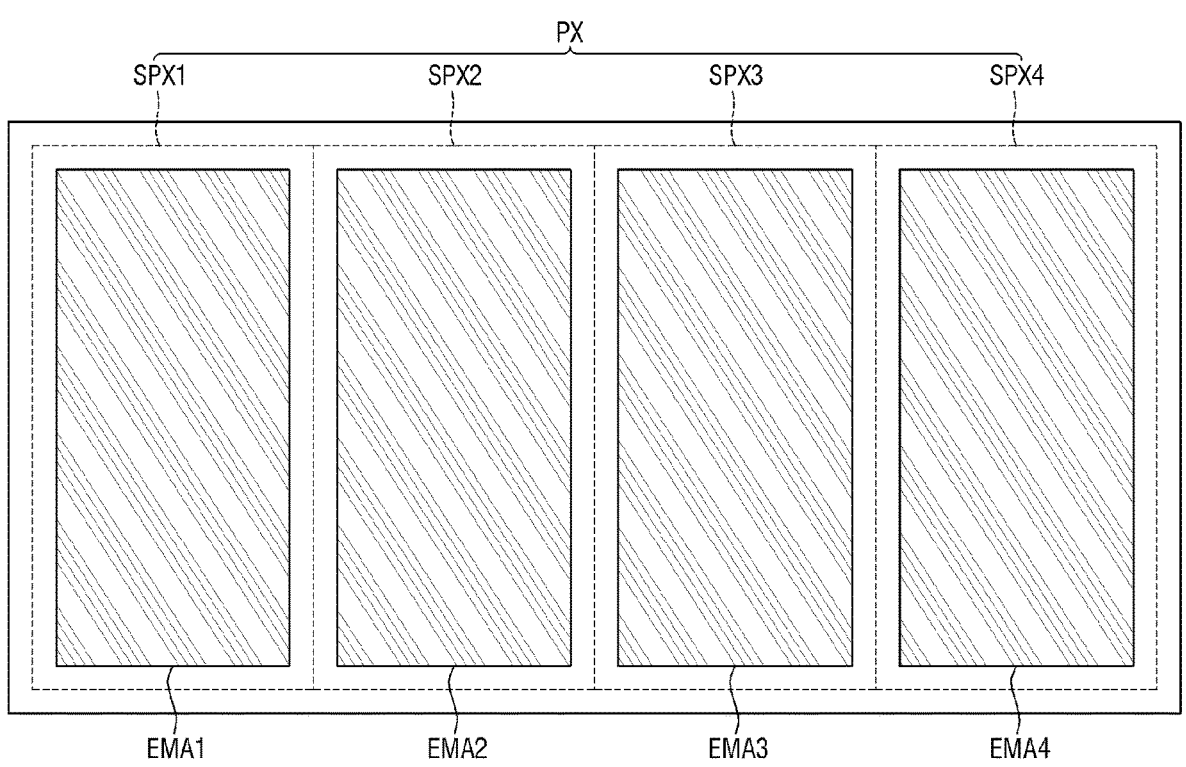
FIG. 7 is a plan view schematically illustrating emission areas of one pixel according to one embodiment.
Figure 8:
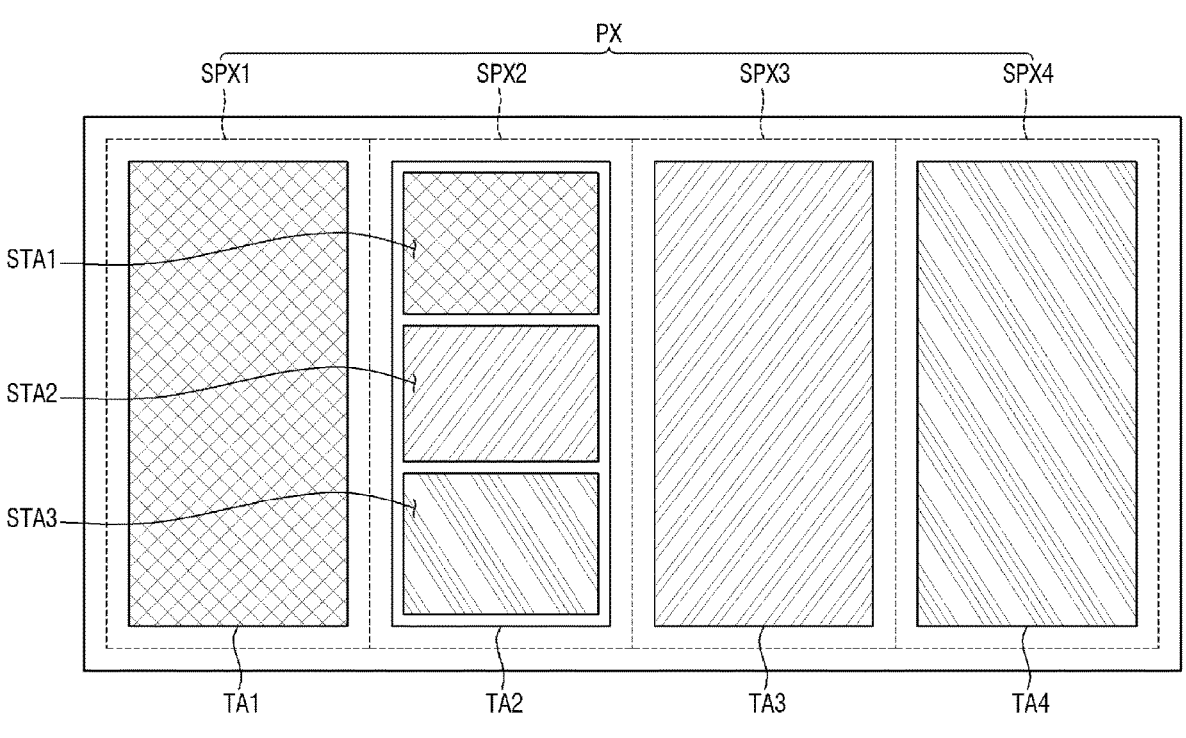
FIG. 8 is a plan view schematically illustrating light transmitting areas of one pixel according to one embodiment.

FIG. 7 is a plan view schematically illustrating emission areas of one pixel according to one embodiment. FIG. 8 is a plan view schematically illustrating light transmitting areas of one pixel according to one embodiment.

Referring to FIGS. 7 and 8, in the display device 10, the light emitted from the emission areas EMA1, EMA2, EMA3, and EMA4 of the sub-pixels SPXn may have the same color (e.g., substantially the same central wavelength band). However, the light emitted from the emission area EMA# may be converted to light having different colors (e.g., different central wavelength bands) by a color control structure (shown in, e.g., FIGS. 12 to 14) disposed in the sub-pixel SPXn and emitted from the light transmitting area TA #.

For example, the first sub-pixel SPX1 may emit light of a first color, the third sub-pixel SPX3 may emit light of a second color, and the fourth sub-pixel SPX4 may emit light of a third color. The second sub-pixel SPX2 may emit each of the light of the first color, the light of the second color, and the light of the third color, or may emit light of a fourth color that is mixed light thereof. For example, the first color may be red, the second color may be green, and the third color may be blue. However, the sub-pixels SPXn may include the same type of light emitting elements ED, and the emission areas EMA# may emit light of the same color (e.g., blue light of the third color). Some of the blue light of the third color emitted by the light emitting elements ED of the sub-pixels SPXn may be emitted and converted to light having a color different from the third color (e.g., a different central wavelength band) by the color control structure disposed in the sub-pixel SPXn.

In accordance with one embodiment, the light emitted from the light emitting element ED disposed in the first sub-pixel SPX1 may be converted to red light of the first color and emitted from the first light transmitting area TA1, and the light emitted from the light emitting element ED disposed in the third sub-pixel SPX3 may be converted to green light of the second color and emitted from the third light transmitting area TA3. The light emitted from the light emitting element ED disposed in the fourth sub-pixel SPX4 may be emitted as the blue light of the third color from the fourth light transmitting area TA4 without being converted.

Some of the light emitted from the light emitting element ED disposed in the second sub-pixel SPX2 may be converted to red light of the first color, some may be converted to green light of the second color, and some may be emitted as blue light of the third color. In the second light transmitting area TA2 of the second sub-pixel SPX2, each of the red light of the first color, the green light of the second color, and the blue light of the third color may be emitted, or mixed light thereof may be emitted. The second light transmitting area TA2 of the second sub-pixel SPX2 may include a first sub light transmitting area STA1 in which light of the first color is emitted, a second sub light transmitting area STA2 in which light of the second color is emitted, and a third sub light transmitting area STA3 in which light of the third color is emitted. In the second light transmitting area TA2 of the second sub-region SPX2, the first to third sub light transmitting areas STA1, STA2, and STA3 may be disposed to be spaced apart from each other in the first direction DR1 or may be disposed to be in contact with each other. However, even when the second light transmitting area TA2 includes the plurality of sub light transmitting areas STA1, STA2, and STA3, the sub light transmitting areas STA1, STA2, and STA3 may not be distinguished by physical interfaces. The plurality of sub light transmitting areas STA1, STA2, and STA3 illustrated in the drawing, which are the areas distinguished to correspond to the color control structures (shown in, e.g., FIGS. 12 to 14) disposed in the second sub-pixel SPX2, to be described later, may form one second light transmitting area TA2 without being physically distinguished in the second sub-pixel SPX2 of the display device 10. However, the disclosure is not limited thereto, and the second light transmitting area TA2 may include the plurality of sub light transmitting areas STA1, STA2, and STA3 that are physically spaced apart from each other depending on the structure of the bank layer BNL disposed in the second sub-pixel SPX2.

In the display device 10, each of the pixels PX may include, in addition to the sub-pixels (e.g., the first sub-pixel SPX1, the third sub-pixel SPX3, and the fourth sub-pixel SPX4) emitting lights of different colors, the sub-pixel (e.g., the second sub-pixel SPX2) emitting lights of different colors simultaneously or emitting mixed light thereof. This may vary depending on the arrangement of the light emitting elements ED of the sub-pixels SPXn of the display device 10 and the arrangement of the color control structures.

Hereinafter, the structure of the pixel PX and the sub-pixels SPXn disposed in the display device 10 will be described in detail.

Figure 9:
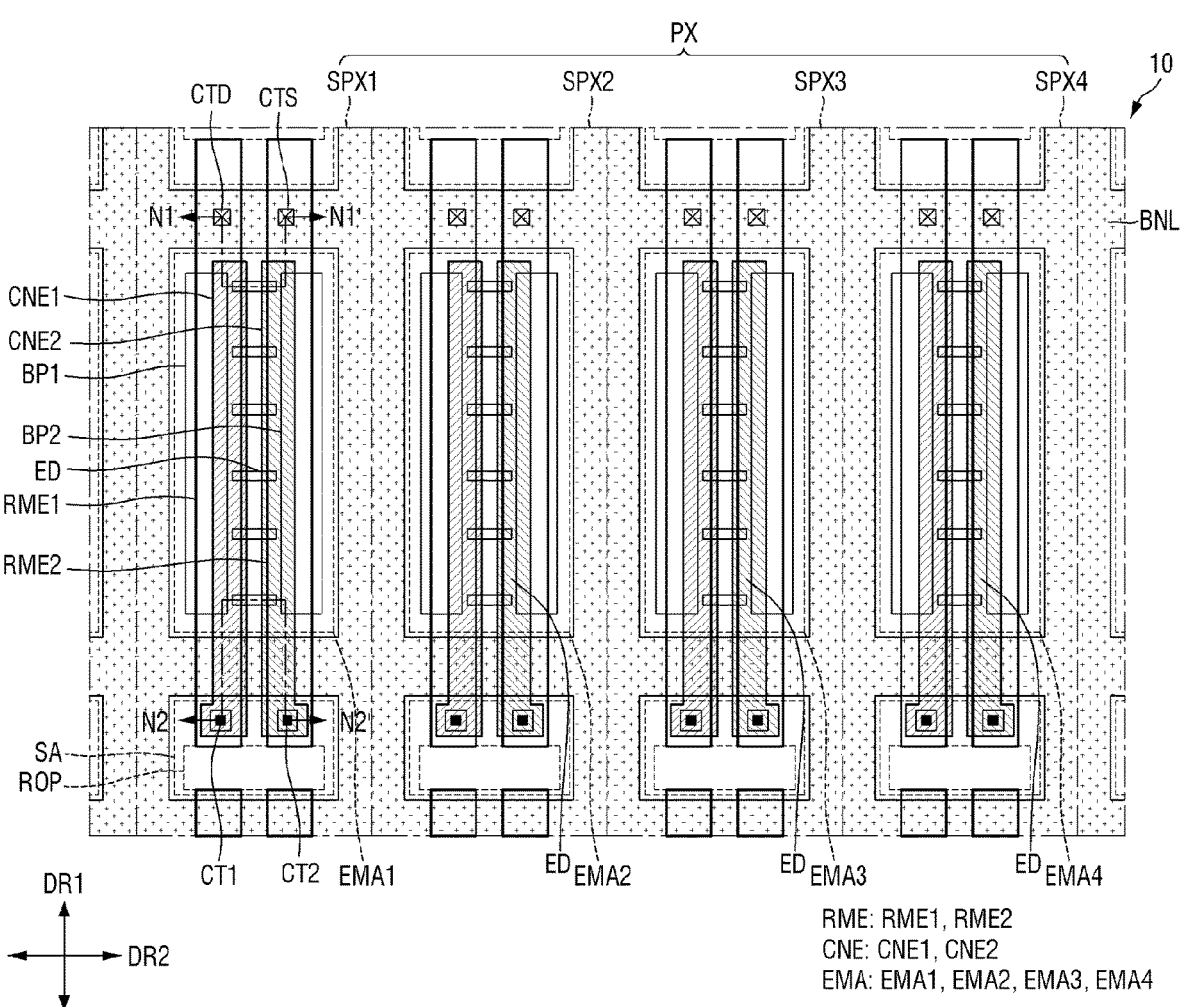
FIG. 9 is a plan view illustrating one pixel of a display device according to one embodiment.

FIG. 9 is a plan view illustrating one pixel of a display device according to one embodiment.

FIG. 9 illustrates a planar arrangement of electrodes RME (e.g., RME1 and RME2), barrier walls BP1 and BP2, a bank layer BNL, a plurality of light emitting elements ED, and connection electrodes CNE (e.g., CNE1 and CNE2) disposed in one pixel PX of the display device 10.

Referring to FIG. 9, each of the pixels PX of the display device 10 may include a plurality of sub-pixels SPXn. For example, one pixel PX may include the first sub-pixel SPX1, the second sub-pixel SPX2, the third sub-pixel SPX3, and the fourth sub-pixel SPX4. The description of the arrangement of the sub-pixels SPXn and the colors displayed by the sub-pixels SPXn are the same as described above. Although the second sub-pixel SPX2, which emits different color light simultaneously or emitting mixed light thereof, is illustrated as being disposed between the first sub-pixel SPX1 and the third sub-pixel SPX3, the disclosure is not limited thereto. The position of the second sub-pixel SPX2 may vary.

Each sub-pixel SPXn of the display device 10 may include an emission area EMA and a non-emission area. The emission area EMA may be an area in which the light emitting element ED is disposed to emit light of a specific wavelength band. The non-emission area may be a region in which the light emitting element ED is not disposed and a region from which light is not emitted because light emitted from the light emitting element ED does not reach it.

The emission area EMA may include the region in which the light emitting element ED is disposed and a region adjacent to the light emitting element ED in which the light emitted from the light emitting element ED is emitted. For example, the emission area EMA may further include a region in which the light emitted from the light emitting element ED is reflected or refracted by another member and emitted. The plurality of light emitting elements ED may be disposed in each sub-pixel SPXn, and the emission area may include an area where the light emitting elements ED are disposed and an area adjacent thereto.

Although the sub-pixels SPXn are illustrated as having emission areas EMA that are substantially identical in size, the disclosure is not limited thereto. In some embodiments, the emission areas EMA of the sub-pixels SPXn may have different sizes according to a color or wavelength band of light emitted from the light emitting element ED disposed in each sub-pixel.

Each sub-pixel SPXn may further include a sub-region SA disposed in the non-emission area. The sub-region SA of the corresponding sub-pixel SPXn may be disposed on the lower side of the emission area EMA in a plan view, which is the other side in the first direction DR1. The emission area EMA and the sub-region SA may be alternately arranged along the first direction DR1, and the sub-region SA may be disposed between the emission areas EMA of different sub-pixels SPXn spaced apart from each other in the first direction DR1. For example, the emission area EMA and the sub-region SA may be alternately arranged in the first direction DR1, and each of the emission area EMA and the sub-region SA may be repeatedly arranged in the second direction DR2. However, the disclosure is not limited thereto, and the arrangement of the emission areas EMA and the sub-regions SA of the plurality of pixels PX may be different from that shown in FIG. 9.

Light may not be emitted from the sub-region SA because the light emitting element ED is not disposed in the sub-region SA, but an electrode RME disposed in each sub-pixel SPXn may be partially disposed in the sub-region SA. The electrodes RME disposed in different sub-pixels SPXn may be separated at a separation portion ROP of the sub-region SA.

The display device 10 may include the plurality of electrodes RME (e.g., RME1 and RME2), the barrier walls BP1 and BP2, the bank layer BNL, the light emitting elements ED, and the connection electrodes CNE (e.g., CNE1 and CNE2).

The plurality of barrier walls BP1 and BP2 may be disposed in the emission area EMA of each sub-pixel SPXn. The barrier walls BP1 and BP2 may extend substantially in the first direction DR1 and may be disposed to be spaced apart from each other in the second direction DR2.

For example, the barrier walls BP1 and BP2 may include a first barrier wall BP1 and a second barrier wall BP2 spaced apart from each other in the second direction DR2 in the emission area EMA of each sub-pixel SPXn. The first barrier wall BP1 may be disposed on the left side with respect to the center of the emission area EMA in a plan view, which is one side in the second direction DR2, and the second barrier walls BP2 may be disposed on the right side with respect to the center of the emission area EMA in a plan view, which is the other side in the second direction DR2, while being spaced apart from the first barrier wall BP1. The first barrier wall BP1 and the second barrier wall BP2 may be alternately disposed along the second direction DR2 and may be disposed in an island-like pattern in the display area DPA. The plurality of light emitting elements ED may be arranged between the first barrier wall BP1 and the second barrier wall BP2.

The lengths of the first barrier wall BP1 and the second barrier wall BP2 in the first direction DR1 may be the same and may be smaller than the length of the emission area EMA, which is surrounded, in a plan view, by (or is defined by) the bank layer BNL, in the first direction DR1. The first barrier wall BP1 and the second barrier wall BP2 may be spaced apart from a portion of the bank layer BNL extending in the second direction DR2. However, the disclosure is not limited thereto, and the barrier walls BP1 and BP2 may be integrated with the bank layer BNL or may partially overlap the portion of the bank layer BNL extending in the second direction DR2. In such embodiments, the lengths of the barrier walls BP1 and BP2 in the first direction DR1 may be greater than or equal to the length of the emission area EMA in the first direction DR1.

Although it is illustrated in the drawing that two barrier walls BP1 and BP2 are arranged for each sub-pixel SPXn, the disclosure is not limited thereto. The number and the shape of the barrier walls BP1 and BP2 may vary depending on the number and/or the arrangement structure of the electrodes RME.

The plurality of electrodes RME (e.g., RME1 and RME2) have a shape extending in (e.g., primarily extending in) one direction and are disposed for each sub-pixel SPXn. The plurality of electrodes RME1 and RME2 may extend in the first direction DR1 to be disposed across the emission area EMA of the sub-pixel SPXn and the sub-region SA and may be disposed to be spaced apart from each other in the second direction DR2. The plurality of electrodes RME may be electrically connected to the light emitting elements ED, to be described later. However, the disclosure is not limited thereto, and the electrodes RME may not be electrically connected to the light emitting element ED.

The display device 10 may include the first electrode RME1 and the second electrode RME2 arranged in each sub-pixel SPXn. The first electrode RME1 is located on the left side with respect to the center of the emission area EMA in a plan view, and the second electrode RME2 is located on the right side with respect to the center of the emission area EMA in a plan view while being spaced apart from the first electrode RME1 in the second direction DR2. The first electrode RME1 may be disposed on the first barrier wall BP1, and the second electrode RME2 may be disposed on the second barrier wall BP2. The first electrode RME1 and the second electrode RME2 may be partially arranged in the corresponding sub-pixel SPXn and the sub-region SA over (e.g., overlapping) the bank layer BNL. The first electrode RME1 and the second electrode RME2 of different sub-pixels SPXn may be spaced or separated from each other at the separation portion ROP disposed in the sub-region SA of any one sub-pixel SPXn.

Although the two electrodes RME1 and RME2 are illustrated as having a shape extending in the first direction DR1 for each sub-pixel SPXn, the disclosure is not limited thereto. For example, the display device 10 may have a shape in which a greater number of electrodes RME are disposed in one sub-pixel SPXn or the electrodes RME are partially bent and have different widths depending on positions.

The bank layer BNL may be disposed to surround, in a plan view, the plurality of sub-pixels SPXn, the emission area EMA, and the sub-region SA. The bank layer BNL may be disposed at the boundary between the sub-pixels SPXn adjacent in the first direction DR1 and the second direction DR2 and may also be disposed at the boundary between the emission area EMA and the sub-region SA. The sub-pixels SPXn, the emission area EMA, and the sub-region SA of the display device 10 may be the areas distinguished by the arrangement of the bank layer BNL. The gaps between the plurality of sub-pixels SPXn, the emission areas EMA, and the sub-regions SA may vary depending on the width of the bank layer BNL.

The bank layer BNL may include portions extending in the first direction DR1 and the second direction DR2 in a plan view to be arranged in a grid pattern over the entire surface of the display area DPA. The bank layer BNL may be disposed along the boundaries between the sub-pixels SPXn to delimit the neighboring sub-pixels SPXn. The bank layer BNL may also be arranged to surround, in a plan view, the emission area EMA and the sub-region SA disposed for each sub-pixel SPXn to delimit (or separate) them from each other. As will be described later, the bank layer BNL may form an area in which the color control structures of the display device 10 are disposed.

The plurality of light emitting elements ED may be arranged in the emission area EMA. The light emitting elements ED may be disposed between the barrier walls BP1 and BP2 and may be arranged to be spaced apart from each other in the first direction DR1. In one embodiment, the plurality of light emitting elements ED may have a shape extending in one direction, and both ends (e.g., opposite ends) thereof may be disposed on different electrodes RME. The length of the light emitting element ED may be greater than the gap between the electrodes RME spaced apart from each other in the second direction DR2. The extension direction of the light emitting elements ED may be substantially perpendicular to the first direction DR1 in which the electrodes RME extend. However, the disclosure is not limited thereto, and the light emitting element ED may extend in the second direction DR2 or in a direction oblique to the second direction DR2.

The plurality of connection electrodes CNE (e.g., CNE1 and CNE2) may be disposed on the plurality of electrodes RME and the barrier walls BP1 and BP2. The plurality of connection electrodes CNE may have a shape extending in one direction and may be disposed to be spaced apart from each other. The connection electrodes CNE may be in contact with the light emitting element ED and may be electrically connected to the electrode RME or a conductive layer disposed thereunder.

The connection electrodes CNE may include the first connection electrode CNE1 and the second connection electrode CNE2 disposed in each sub-pixel SPXn. The first connection electrode CNE1 may have a shape extending in the first direction DR1 and may be disposed on the first electrode RME1 or the first barrier wall BP1. The first connection electrode CNE1 may partially overlap the first electrode RME1 and may be disposed across the emission area EMA and the sub-region SA over the bank layer BNL. The second connection electrode CNE2 may have a shape extending in the first direction DR1 and may be disposed on the second electrode RME2 or the second barrier wall BP2. The second connection electrode CNE2 may partially overlap the second electrode RME2 and may be disposed across the emission area EMA and the sub-region SA over the bank layer BNL.

Figure 10:
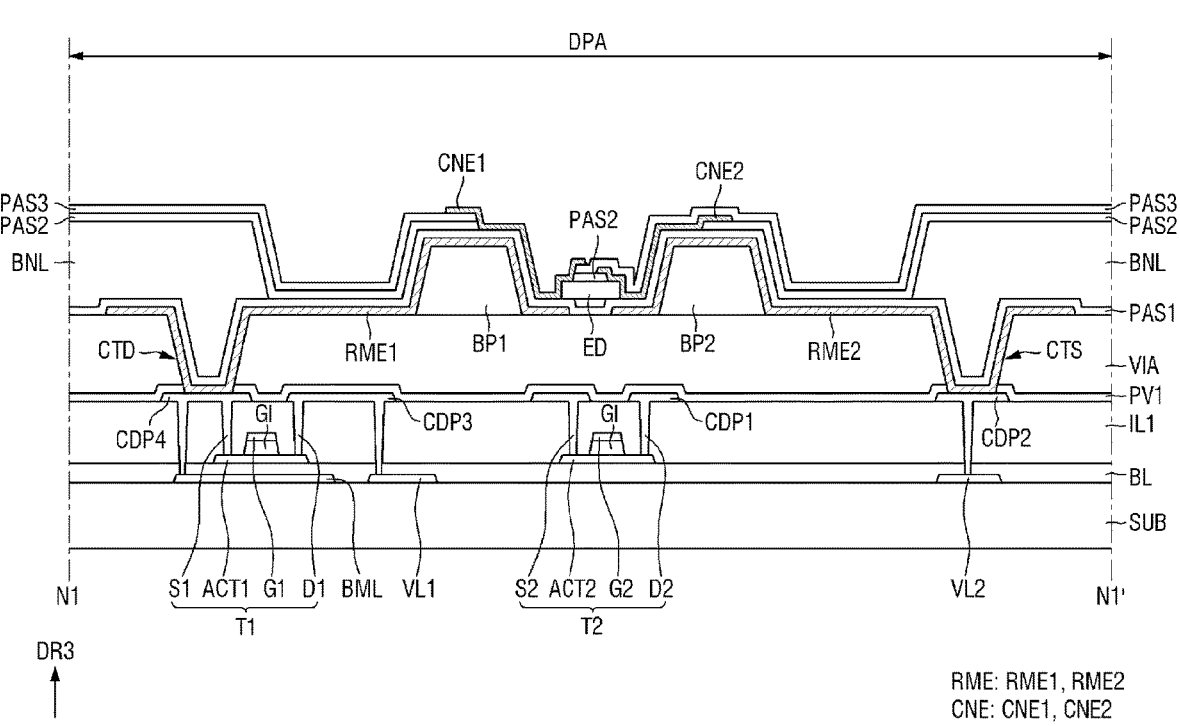
FIG. 10 is a cross-sectional view taken along the line N1-N1' of FIG. 9.
Figure 11:
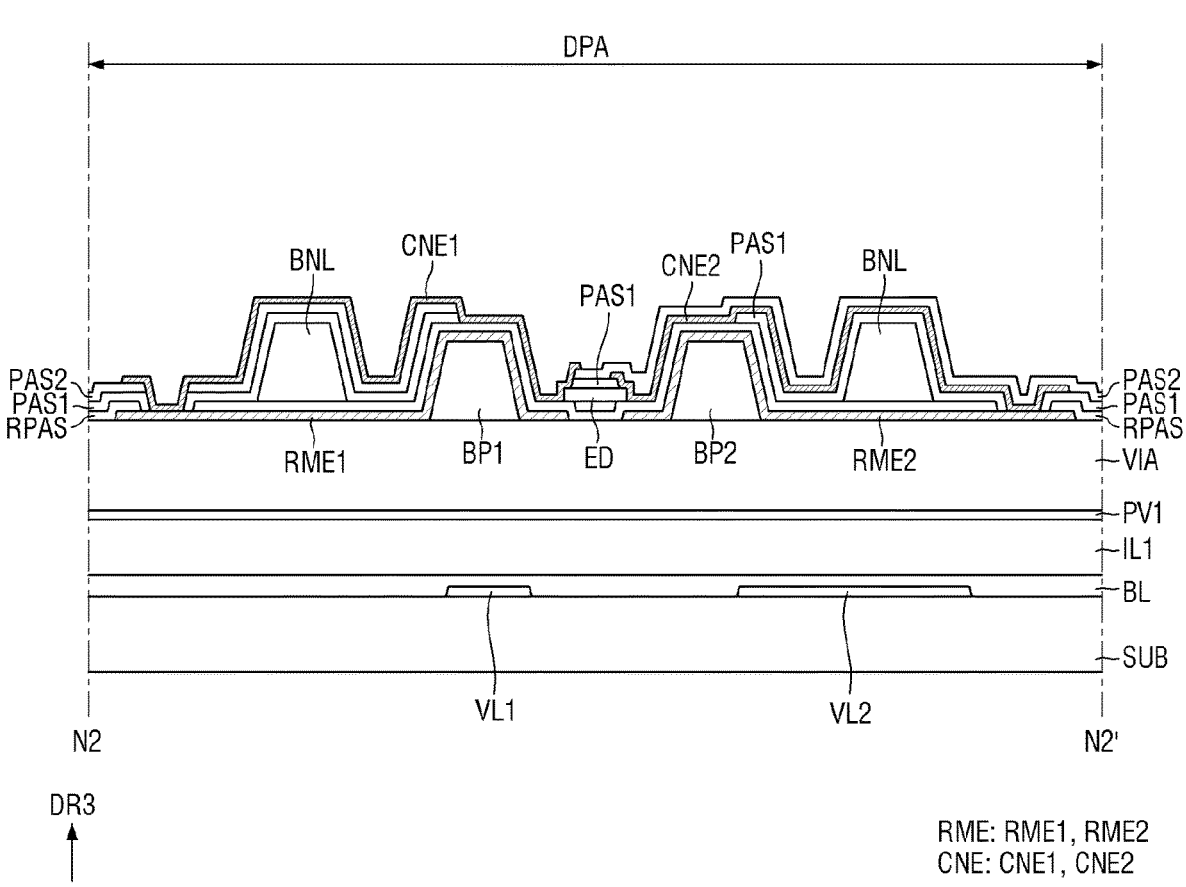
FIG. 11 is a cross-sectional view taken along the line N2-N2' of FIG. 9.

FIG. 10 is a cross-sectional view taken along the line N1-N1' of FIG. 9, and FIG. 11 is a cross-sectional view taken along the line N2-N2' of FIG. 9.

FIG. 10 illustrates a cross section across both ends of the light emitting element ED and electrode contact holes (e.g., electrode contact openings) CTD and CTS disposed in the first sub-pixel SPX1, and FIG. 11 illustrates a cross section across both ends of the light emitting element ED and contact portions CT1 and CT2 disposed in the first sub-pixel SPXn.

The cross-sectional structure of the display device 10 will be described with reference to FIGS. 10 and 11 in addition to FIG. 9. The display device 10 may include a first substrate SUB and a semiconductor layer, a plurality of conductive layers, and a plurality of insulating layers disposed thereon. In addition, the display device 10 may include the plurality of electrodes RME (e.g., RME1 and RME2), the light emitting element ED, and the connection electrodes CNE (e.g., CNE1 and CNE2). The semiconductor layer, the conductive layers, and the insulating layers may each constitute a circuit layer of the display device 10.

The first substrate SUB may be an insulating substrate. The first substrate SUB may be made of an insulating material, such as glass, quartz, or polymer resin. The first substrate SUB may be a rigid substrate or may be a flexible substrate that can be bent, folded, or rolled. The first substrate SUB may have the display area DPA and the non-display area NDA surrounding, in a plan view, the display area DPA, and the display area DPA may include the emission area EMA and the sub-region SA, which is part of the non-emission area.

A first conductive layer may be disposed on the first substrate SUB. The first conductive layer may include a lower metal layer BML, a first voltage line VL1, and a second voltage line VL2. The lower metal layer BML may be arranged to overlap an active layer ACT1 of a first transistor T1. The lower metal layer BML may prevent light from entering (or being incident on) the first active layer ACT1 of the first transistor T1 or may be electrically connected to the first active layer ACT1 to stabilize electrical characteristics of the first transistor T1. However, in some embodiments, the lower metal layer BML may be omitted.

The first voltage line VL1 may be applied with a high potential voltage (or a first power voltage) transmitted to a first electrode RME1, and the second voltage line VL2 may be applied with a low potential voltage (or a second power voltage) transmitted to a second electrode RME2. The first voltage line VL1 may be electrically connected to the first the first transistor T1 through a conductive pattern (e.g., a third conductive pattern CDP3) of a third conductive layer. The second voltage line VL2 may be electrically connected to the second electrode RME2 through a conductive pattern (e.g., a second conductive pattern CDP2) of a third conductive layer.

Although it is illustrated in the drawing that the first voltage line VL1 and the second voltage line VL2 are disposed on (or in) the first conductive layer, the disclosure is not limited thereto. In some embodiments, the first voltage line VL1 and the second voltage line VL2 may be disposed on (or in) the third conductive layer and directly electrically connected to the first transistor T1 and the second electrode RME2, respectively.

A buffer layer BL may be disposed on the first conductive layer and the first substrate SUB. The buffer layer BL may be formed on the first substrate SUB to protect the transistors of the pixel PX from moisture permeating through the first substrate SUB, which may be susceptible to moisture permeation, and may provide a planar surface.

The semiconductor layer is disposed on the buffer layer BL. The semiconductor layer may include the first active layer ACT1 of the first transistor T1 and a second active layer ACT2 of the second transistor T2. The first active layer ACT1 and the second active layer ACT2 may be disposed to partially overlap a first gate electrode G1 and a second gate electrode G2 of a second conductive layer, to be described later, respectively.

The semiconductor layer may include polycrystalline silicon, monocrystalline silicon, oxide semiconductor, and the like. In another embodiment, the semiconductor layer may include polycrystalline silicon. The oxide semiconductor may be an oxide semiconductor including indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), or indium gallium zinc tin oxide (IGZTO).

Although it is illustrated in the drawing that one first transistor T1 is disposed in the sub-pixel SPXn of the display device 10, but the disclosure is not limited thereto and the sub-pixel SPXn may include a greater number of transistors.

A first gate insulating layer GI is disposed on the semiconductor layer in the display area DPA. The first gate insulating layer GI may act as a gate insulating layer of each of the transistors T1 and T2. Although it is illustrated in the drawing that the first gate insulating layer GI is patterned together with the gate electrodes G1 and G2 of the second conductive layer and partially disposed between the second conductive layer and the active layers ACT1 and ACT2 of the semiconductor layer, the disclosure is not limited thereto. In some embodiments, the first gate insulating layer GI may be entirely disposed on the buffer layer BL.

The second conductive layer is disposed on the first gate insulating layer GI. The second conductive layer may include a first gate electrode G1 of the first transistor T1 and a second gate electrode G2 of the second transistor T2. The first gate electrode G1 may be disposed to overlap the channel region of the first active layer ACT1 in a third direction DR3, that is, a thickness direction, and the second gate electrode G2 may be disposed to overlap the channel region of the second active layer ACT2 in the third direction DR3. The second conductive layer may further include one electrode of the storage capacitor.

A first interlayer insulating layer IL1 is disposed on the second conductive layer. The first interlayer insulating layer IL1 may act as an insulating film between the second conductive layer and other layers disposed thereon and may protect the second conductive layer.

A third conductive layer is disposed on the first interlayer insulating layer IL1. The third conductive layer may include a plurality of conductive patterns CDP1, CDP2 and CDP3 and source electrodes S1 and S2 and drain electrodes D1 and D2 of the respective transistors T1 and T2. Some of the conductive patterns CDP1, CDP2 and CDP3 may electrically connect the conductive layers or the semiconductor layers of different layers to each other and act as source/drain electrodes of the transistors T1 and T2.

The first conductive pattern CDP1 may be in contact with the first active layer ACT1 of the first transistor T1 through a contact hole (e.g., a contact opening) penetrating the first interlayer insulating layer IL1. The first conductive pattern CDP1 may be in contact with the lower metal layer BML through a contact hole (e.g., a contact opening) penetrating the first interlayer insulating layer IL1 and the buffer layer BL. The first conductive pattern CDP1 may act as a first source electrode S1 of the first transistor T1. The first conductive pattern CDP1 may be electrically connected to the first electrode RME1 or the first connection electrode CNE1. The first transistor T1 may transmit the first power voltage applied from the first voltage line VL1 to the first electrode RME1 or to the first connection electrode CNE1.

The second conductive pattern CDP2 may be in contact with the second voltage line VL2 through a contact hole (e.g., a contact opening) penetrating the first interlayer insulating layer IL1 and the buffer layer BL. The second conductive pattern CDP2 may be electrically connected to the first electrode RME1 or the first connection electrode CNE1. The second voltage line VL2 may transmit a second power voltage to the second electrode RME2 or to the second connection electrode CNE2.

The third conductive pattern CDP3 may be in contact with the first power voltage line VL1 through a contact hole (e.g., a contact opening) penetrating the first interlayer insulating layer IL1 and the buffer layer BL. Further, the third conductive pattern CDP3 may be in contact with the first active layer ACT1 of the first transistor T1 through a contact hole (e.g., a contact opening) penetrating the first interlayer insulating layer IL1. The third conductive pattern CDP3 may electrically connect the first voltage line VL1 to the first transistor T1 and act as a first drain electrode D1 of the first transistor T1.

The second source electrode S2 and the second drain electrode D2 may be in contact with the second active layer ACT2 of the second transistor T2 through contact holes (e.g., contact openings) penetrating the first interlayer insulating layer IL1. The second transistor T2 may transmit a data signal to the first transistor T1 or may transmit an initialization signal.

A first passivation layer PV1 is disposed on the third conductive layer. The first passivation layer PV1 may act as an insulating layer between the third conductive layer and other layers and may protect the third conductive layer.

The buffer layer BL, the first gate insulating layer GI, the first interlayer insulating layer IL1, and the first passivation layer PV1 described above may be formed of a plurality of inorganic layers stacked in an alternating manner. For example, the buffer layer BL, the first gate insulating layer GI, the first interlayer insulating layer IL1, and the first passivation layer PV1 may be formed as a double layer formed by stacking, or a multilayer formed by alternately stacking, inorganic layers including at least one of silicon oxide ($SiO_x$), silicon nitride ($SiN_x$), or silicon oxynitride ($SiO_xN_y$). However, the disclosure is not limited thereto, and the buffer layer BL, the first gate insulating layer GI, the first interlayer insulating layer IL1, and the first passivation layer PV1 may be formed as a single inorganic layer containing an above-described insulating material. Further, in some embodiments, the first interlayer insulating layer IL1 may be made of an organic insulating material, such as polyimide (PI) or the like.

A via layer VIA is disposed on the third conductive layer in the display area DPA. The via layer VIA may contain an organic insulating material, such as polyimide (PI), and may compensate for a stepped portion formed by the conductive layers disposed thereunder to provide a planar top surface. However, in some embodiments, the via layer VIA may be omitted.

The display device 10 may include, as a display element layer disposed on the via layer VIA, the barrier walls BP1 and BP2, the plurality of electrodes RME (e.g., RME1 and RME2), the bank layer BNL, the plurality of light emitting elements ED, and the plurality of connection electrodes CNE (e.g., CNE1 and CNE2). In addition, the display device 10 may include the insulating layers PAS1, PAS2, and PAS3 disposed on the via layer VIA.

The plurality of barrier walls BP1 and BP2 may be disposed on the via layer VIA. For example, the barrier walls BP1 and BP2 may be directly disposed on the via layer VIA and may have a structure (or shape) in which at least a part thereof protrudes from the top surface of the via layer VIA. The protruding portions of the barrier walls BP1 and BP2 may have an inclined surface or a curved surface with a curvature, and the light emitted from the light emitting element ED may be reflected by the electrode RME disposed on the barrier walls BP1 and BP2 and emitted in the upward direction of (e.g., away from) the via layer VIA. Different from the example illustrated in the drawing, the barrier walls BP1 and BP2 may have a shape, such as a semicircular or semi-elliptical shape, in which the outer surface is curved with a curvature in a cross-sectional view. The barrier walls BP1 and BP2 may include an organic insulating material, such as polyimide (PI), but is not limited thereto.

The plurality of electrodes RME (e.g., RME1 and RME2) may be disposed on the barrier walls BP1 and BP2 and the via layer VIA. For example, the first electrode RME1 and the second electrode RME2 may be arranged at least on the inclined surfaces of the barrier walls BP1 and BP2. The widths of the plurality of electrodes RME measured in the second direction DR2 may be smaller than the widths of the barrier walls BP1 and BP2 measured in the second direction DR2, and the gap between the first electrode RME1 and the second electrode RME2 in the second direction DR2 may be smaller than the gap between the barrier walls BP1 and BP2. At least a part of the first electrode RME1 and the second electrode RME2 may be directly arranged on the via layer VIA so that the first electrode RME1 and the second electrode RME2 may be arranged on the same plane.

The light emitting element ED disposed between the barrier walls BP1 and BP2 may emit light toward both ends (e.g., opposite ends) thereof, and the emitted light may be directed toward the electrodes RME disposed on the barrier walls BP1 and BP2. The electrodes RME may have a structure in which portions thereof disposed on the barrier walls BP1 and BP2 may reflect the light emitted from the light emitting element ED. The first electrode RME1 and the second electrode RME2 may be arranged to cover at least one side surfaces of the barrier walls BP1 and BP2 and may reflect the light emitted from the light emitting element ED.

The electrodes RME may be in direct contact with the third conductive layer through the electrode contact holes CTD and CTS at the portions overlapping the bank layer BNL between the emission area EMA and the sub-region SA. The first electrode contact hole CTD may be formed in an area in which the bank layer BNL and the first electrode RME1 overlap, and the second electrode contact hole CTS may be formed in an area in which the bank layer BNL and the second electrode RME2 overlap. The first electrode RME1 may be in contact with the first conductive pattern CDP1 through the first electrode contact hole CTD penetrating the via layer VIA and the first passivation layer PV1. The second electrode RME2 may be in contact with the second voltage line VL2 through the second electrode contact hole CTS penetrating the via layer VIA and the first passivation layer PV1. The first electrode RME1 may be electrically connected to the first transistor T1 through the first conductive pattern CDP1 so that the first power voltage may be applied to the first electrode RME1, and the second electrode RME2 may be electrically connected to the second voltage line VL2 so that the second power voltage may be applied to the second electrode RME2. However, the disclosure is not limited thereto. In another embodiment, the electrodes RME1 and RME2 may not be electrically connected to the voltage lines VL1 and VL2 of the third conductive layer, respectively, and the connection electrode CNE, to be described later, may be directly connected to the third conductive layer.

The plurality of electrodes RME may include a conductive material having high reflectivity. For example, the electrodes RME may include a metal, such as silver (Ag), copper (Cu), or aluminum (Al), or may include an alloy including aluminum (Al), nickel (Ni), lanthanum (La), or the like. In some embodiments, the electrodes RME may have a structure in which a metal layer, such as titanium (Ti), molybdenum (Mo), and niobium (Nb), and the alloy are stacked. In some embodiments, the electrodes RME may be formed as a double layer or a multilayer structure formed by stacking at least one metal layer made of an alloy including aluminum (Al) and titanium (Ti), molybdenum (Mo), and niobium (Nb).

The disclosure is not limited thereto, and each electrode RME may further include a transparent conductive material. For example, each electrode RME may include a material such as ITO, IZO, and ITZO. In some embodiments, each of the electrodes RME may have a structure in which at least one transparent conductive material and at least one metal layer having high reflectivity are stacked or may be formed as one layer including them. For example, each electrode RME may have a stacked structure of ITO/Ag/ITO, ITO/Ag/IZO, ITO/Ag/ITZO/IZO, or the like. The electrodes RME may be electrically connected to the light emitting element ED and may reflect some of the light emitted from the light emitting element ED in an upward direction of (e.g., away from) the first substrate SUB.

The first insulating layer PAS1 may be disposed in the entire display area DPA and may be disposed on the via layer VIA and the plurality of electrodes RME. The first insulating layer PAS1 may include an insulating material to protect the plurality of electrodes RME and insulate the different electrodes RME from each other. The first insulating layer PAS1 is disposed to cover the electrodes RME before the bank layer BNL is formed so that the electrodes RME are not damaged in a process of forming the bank layer BNL. In addition, the first insulating layer PAS1 may prevent the light emitting element ED disposed thereon from being damaged by direct contact with other members.

In an embodiment, the first insulating layer PAS1 may have stepped portions such that the top surface thereof is partially depressed (or recessed) between the electrodes RME that are spaced apart in the second direction DR2. The light emitting element ED may be disposed on the top surface of the first insulating layer PAS1 at where the stepped portions are formed, and thus, a space may remain between the light emitting element ED and the first insulating layer PAS1.

The first insulating layer PAS1 may include the contact portions CT1 and CT2 disposed in the sub-region SA. The contact portions CT1 and CT2 may be disposed to overlap different electrodes RME, respectively. For example, the contact portions CT1 and CT2 may include first contact portions CT1 disposed to overlap the first electrode RME1 and second contact portions CT2 disposed to overlap the second electrode RME2. The first contact portions CT1 and the second contact portions CT2 may penetrate the first insulating layer PAS1 to partially expose the top surface of the first electrode RME1 or the second electrode RME2 thereunder. Each of the first contact portion CT1 and the second contact portion CT2 may further penetrate some of the other insulating layers disposed on the first insulating layer PAS1. The electrode RME exposed by each of the contact portions CT1 and CT2 may be in contact with the connection electrode CNE.

The bank layer BNL may be disposed on the first insulating layer PAS1. The bank layer BNL may include portions extending in the first direction DR1 and the second direction DR2 and may surround, in a plan view, the sub-pixels SPXn. The bank layer BNL may surround, in a plan view, and distinguish (e.g., define) the emission area EMA and the sub-region SA of each sub-pixel SPXn and may surround, in a plan view, the outermost part of the display area DPA and distinguish (e.g., define) the display area DPA and the non-display area NDA.

Similar to the barrier walls BP1 and BP2, the bank layer BNL may have a height. In some embodiments, a top surface of the bank layer BNL may be higher than that of the barrier walls BP1 and BP2, and the thickness of the bank layer BNL may be equal to or greater than that of the barrier walls BP1 and BP2. The bank layer BNL may prevent ink from overflowing to adjacent sub-pixels SPXn during an inkjet printing process during the manufacturing process of the display device 10. Similar to the barrier walls BP1 and BP2, the bank layer BNL may include an organic insulating material, such as polyimide.

The light emitting elements ED may be arranged in the emission area EMA. The light emitting elements ED may be disposed on the first insulating layer PAS1 between the barrier walls BP1 and BP2. The light emitting element ED may be disposed such that one direction in which the light emitting element ED extends is parallel to the top surface of the first substrate SUB. As will be described later, the light emitting element ED may include a plurality of semiconductor layers arranged along one direction in which the light emitting element ED extends, and the plurality of semiconductor layers may be sequentially arranged along the direction parallel to the top surface of the first substrate SUB. However, the disclosure is not limited thereto, and the plurality of semiconductor layers of the light emitting element ED may be arranged in a direction perpendicular to the first substrate SUB when the light emitting element ED has another structure.

The light emitting elements ED disposed in each sub-pixel SPXn may emit light of different wavelength bands depending on a material constituting the semiconductor layer. However, the disclosure is not limited thereto, and the light emitting elements ED arranged in each sub-pixel SPXn may include the semiconductor layer of the same material and emit light of the same color.

In one embodiment, in the display device 10, the sub-pixels SPXn emitting different color light may include the light emitting elements ED emitting light of the same color. The first sub-pixel SPX1, the second sub-pixel SPX2, the third sub-pixel SPX3, and the fourth sub-pixel SPX4 may include the same type of light emitting elements ED. The light emitted from the emission areas EMA of the sub-pixels SPXn may be the same color light (e.g., blue light of the third color). As will be described later, the blue light of the third color emitted from the light emitting element ED may be converted to light of another color by the color control structures disposed thereon. A detailed description thereof will be given later with reference to other drawings.

However, the sub-pixels SPXn of the display device 10 may not necessarily include the same type of light emitting elements ED. For example, the light emitting elements ED emitting lights of different colors may be disposed in each sub-pixel SPXn. For example, in the second sub-pixel SPX2, the light emitting elements ED emitting different color light may be disposed to correspond to different sub light transmitting areas STA1, STA2, and STA3. A description thereof may refer to other embodiments.

The light emitting elements ED may be electrically connected to the electrode RME and the conductive layers below the via layer VIA while being in contact with the connection electrodes CNE (e.g., CNE1 and CNE2) and may emit light of a specific wavelength band by receiving an (e.g., according to a received) electrical signal.

The second insulating layer PAS2 may be disposed on the plurality of light emitting elements ED, the first insulating layer PAS1, and the bank layer BNL. The second insulating layer PAS2 may include a pattern portion disposed on the plurality of light emitting elements ED while extending in the first direction DR1 between the barrier walls BP1 and BP2. The pattern portion is disposed to partially surround the outer surface of the light emitting element ED and may not cover (e.g., may expose) both sides or both ends (e.g., opposite end) of the light emitting element ED. The pattern portion may form a linear or island-like pattern in each sub-pixel SPXn in a plan view. The pattern portion of the second insulating layer PAS2 may protect the light emitting element ED and may fix the light emitting elements ED during a manufacturing process of the display device 10. Further, the second insulating layer PAS2 may be disposed to fill the space between the light emitting element ED and the first insulating layer PAS1 thereunder. A part of the second insulating layer PAS2 may be disposed on the bank layer BNL and in the sub-regions SA.

The second insulating layer PAS2 may include the contact portions CT1 and CT2 disposed in the sub-region SA. The second insulating layer PAS2 may include the first contact portion CT1 disposed to overlap the first electrode RME1 and the second contact portion CT2 disposed to overlap the second electrode RME2. The contact portions CT1 and CT2 may penetrate the second insulating layer PAS2 in addition to the first insulating layer PAS1. The plurality of first contact portions CT1 and the plurality of second contact portions CT2 may partially expose the top surface of the first electrode RME1 or the second electrode RME2 disposed thereunder.

The plurality of connection electrodes CNE (e.g., CNE1 and CNE2) may be disposed on the plurality of electrodes RME and the barrier walls BP1 and BP2. The first connection electrode CNE1 may be disposed on the first electrode RME1 and the first barrier wall BP1. The first connection electrode CNE1 may partially overlap the first electrode RME1 and may be disposed across the emission area EMA and the sub-region SA over the bank layer BNL. The second connection electrode CNE2 may be disposed on the second electrode RME2 and the second barrier wall BP2. The second connection electrode CNE2 may partially overlap the second electrode RME2 and may be disposed across the emission area EMA and the sub-region SA over the bank layer BNL.

Each of the first connection electrode CNE1 and the second connection electrode CNE2 may be disposed on the second insulating layer PAS2 and may be in contact with the light emitting elements ED. The first connection electrode CNE1 may partially overlap the first electrode RME1 and may be in contact with one end of the light emitting elements ED. The second connection electrode CNE2 may partially overlap the second electrode RME2 and may be in contact with the other end of the light emitting elements ED. The plurality of connection electrodes CNE are disposed across the emission area EMA and the sub-region SA. The connection electrodes CNE may be in contact with the light emitting elements ED at portions disposed in the emission area EMA and may be electrically connected to the third conductive layer at portions disposed in the sub-region SA. The first connection electrode CNE1 may be in contact with a first end of the light emitting element ED, and the second connection electrode CNE2 may be in contact with a second end of the light emitting element ED.

In accordance with one embodiment, in the display device 10, the connection electrodes CNE may be in contact with the electrode RME through the contact portions CT1 and CT2 disposed in the sub-region SA. The first connection electrode CNE1 may be in contract with the first electrode RME1 through the first contact portion CT1 penetrating the first insulating layer PAS1, the second insulating layer PAS2, and the third insulating layer PAS3 in the sub-region SA. The second connection electrode CNE2 may be in contact with the second electrode RME2 through the second contact portion CT2 penetrating the first insulating layer PAS1 and the second insulating layer PAS2 in the sub-region SA. Each of the connection electrodes CNE may be electrically connected to the third conductive layer through each of electrodes RME. The first connection electrode CNE1 may be electrically connected to the first transistor T1 so that the first power voltage may be applied to the first connection electrode CNE1, and the second connection electrode CNE2 may be electrically connected to the second voltage line VL2 so that the second power voltage may be applied to the second connection electrode CNE2. Each connection electrode CNE may be in contact the light emitting element ED in the emission area EMA to transmit the power voltage to the light emitting element ED.

However, the disclosure is not limited thereto. In some embodiments, the plurality of connection electrodes CNE may be in direct contact with the third conductive layer and may be electrically connected to the third conductive layer through patterns other than the electrodes RME.

The connection electrodes CNE may include a conductive material. For example, the connection electrodes CNE may include ITO, IZO, ITZO, aluminum (AI), or the like. As an example, the connection electrodes CNE may include a transparent conductive material, and light emitted from the light emitting element ED may pass through the connection electrodes CNE to be emitted.

The third insulating layer PAS3 is disposed on the second connection electrode CNE2 and the second insulating layer PAS2 of the first connection electrode layer. The third insulating layer PAS3 may be disposed on the entire second insulating layer PAS2 to cover the second connection electrode CNE2, and the first connection electrode CNE1 of the second connection electrode layer may be disposed on the third insulating layer PAS3. The third insulating layer PAS3 may insulate the first connection electrode CNE1 and the second connection electrode CNE2 to prevent direct contact therebetween.

The third insulating layer PAS3 may include the first contact portions CT1 disposed in the sub-region SA. The first contact portion CT1 may penetrate the third insulating layer PAS3 in addition to the first insulating layer PAS1 and the second insulating layer PAS2. The plurality of first contact portions CT1 may partially expose the top surface of the first electrode RME1 disposed thereunder.

In some embodiments, another insulating layer may be further disposed on the third insulating layer PAS3 and the first connection electrode CNE1. The insulating layer may protect the members disposed on the first substrate SUB against the external environment.

Each of the first insulating layer PAS1, the second insulating layer PAS2, and the third insulating layer PAS3 described above may include an inorganic insulating material or an organic insulating material. For example, each of the first insulating layer PAS1, the second insulating layer PAS2, and the third insulating layer PAS3 may include an inorganic insulating material. In other embodiments, the first insulating layer PAS1 and the third insulating layer PAS3 may include an inorganic insulating material, and the second insulating layer PAS2 may include an organic insulating material. Each or at least one of the first insulating layer PAS1, the second insulating layer PAS2, and the third insulating layer PAS3 may have a structure in which a plurality of insulating layers are stacked alternately or repeatedly. In an embodiment, each of the first insulating layer PAS1, the second insulating layer PAS2, and the third insulating layer PAS3 may be any one of silicon oxide (SiO$_x$), silicon nitride (SiN$_x$), and silicon oxynitride (Si-O$_x$N$_y$). The first insulating layer PAS1, the second insulating layer PAS2, and the third insulating layer PAS3 may be made of the same material or different materials. In some embodiments, some of them may be made of the same material and some of them may be made of different materials.

In accordance with one embodiment, the display device 10 may further include color control structures TPL and WCL (see, e.g., FIG. 12) and a color filter layer CFL (see, e.g., FIGS. 13 and 14) disposed on the light emitting elements ED. The light emitted from the light emitting element ED may be emitted through (e.g., may transmit through) the color control structures TPL and WCL and the color filter layer CFL, and different color light may be emitted in each sub-pixel SPXn even if the same type of light emitting elements ED are disposed in each sub-pixel SPXn.

Figure 12:
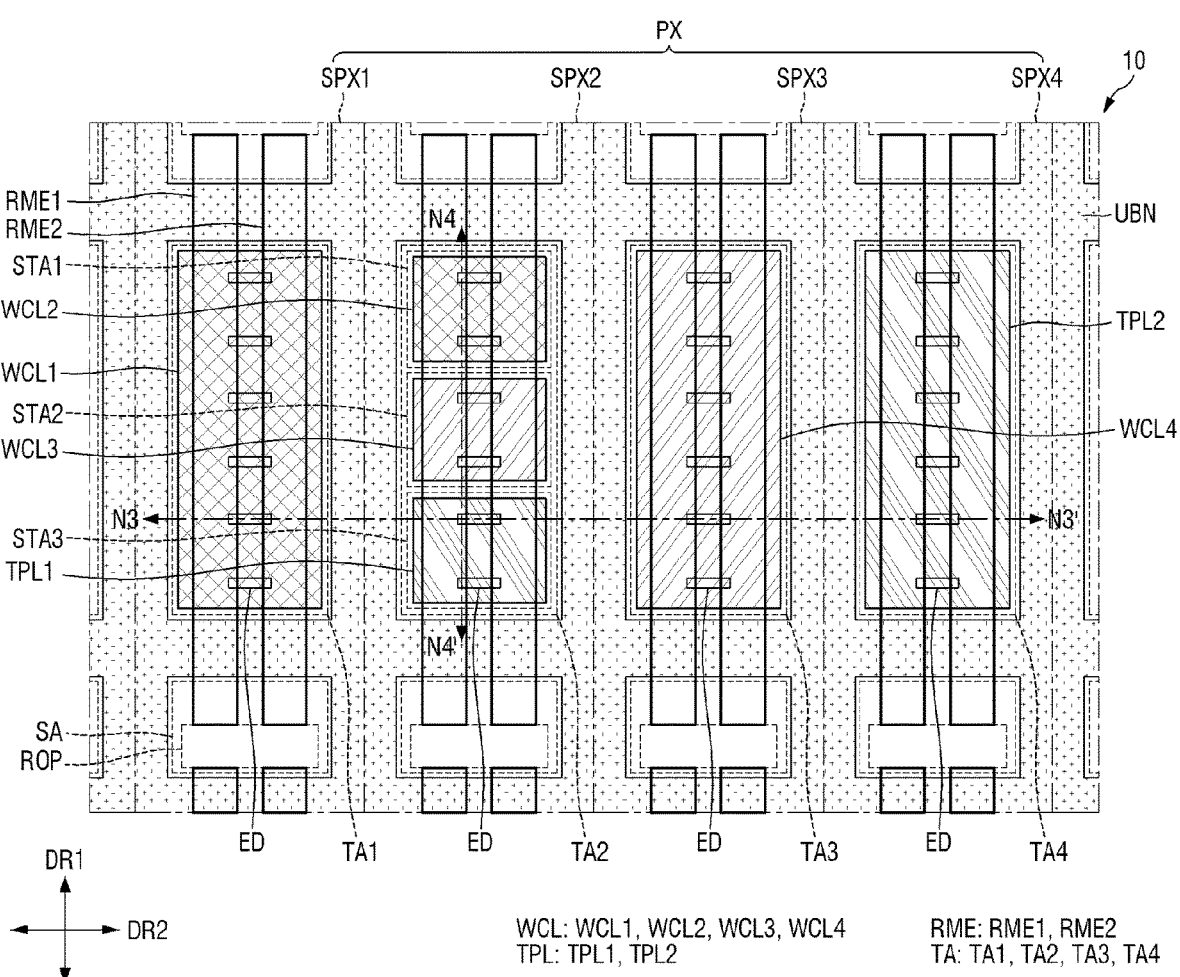
FIG. 12 is a plan view illustrating wavelength conversion layers and light transmitting layers disposed in one pixel of a display device according to one embodiment.
Figure 13:
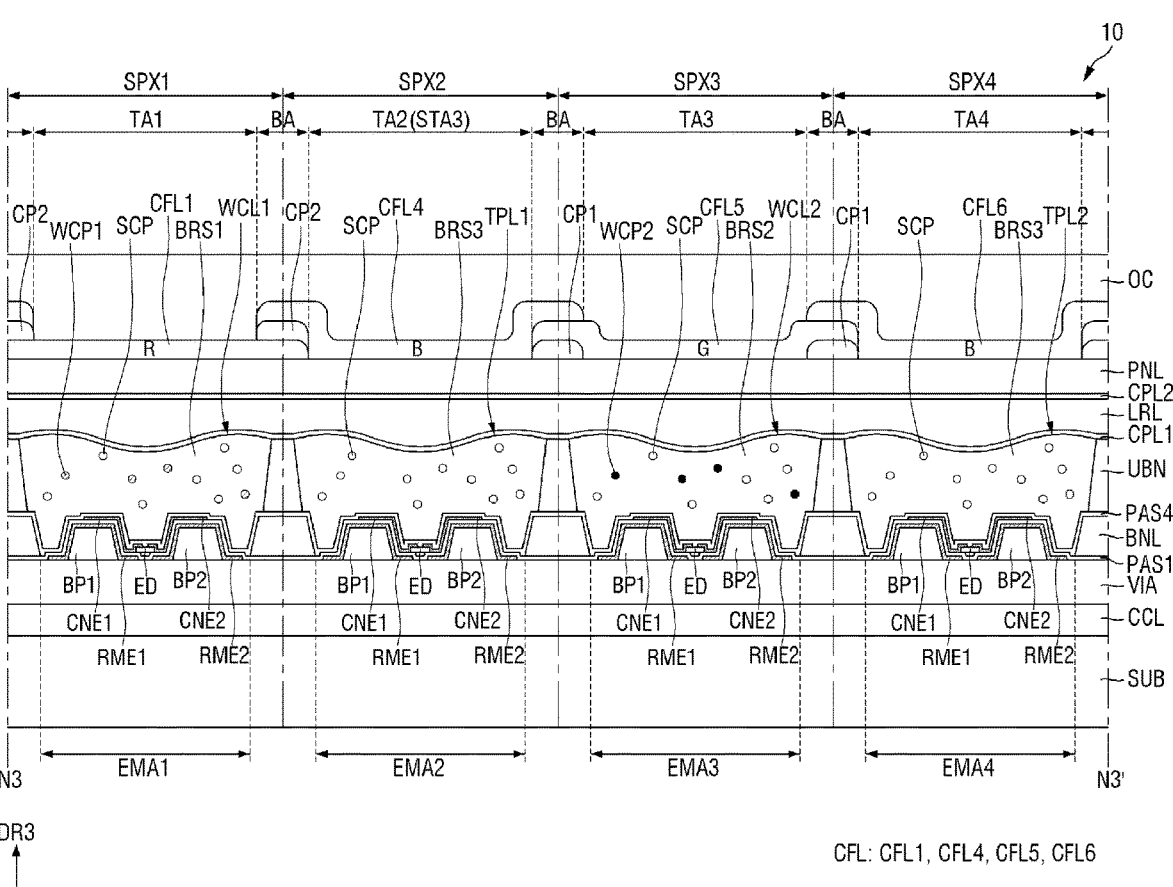
FIG. 13 is a cross-sectional view taken along the line N3-N3' in FIG. 12.
Figure 14:
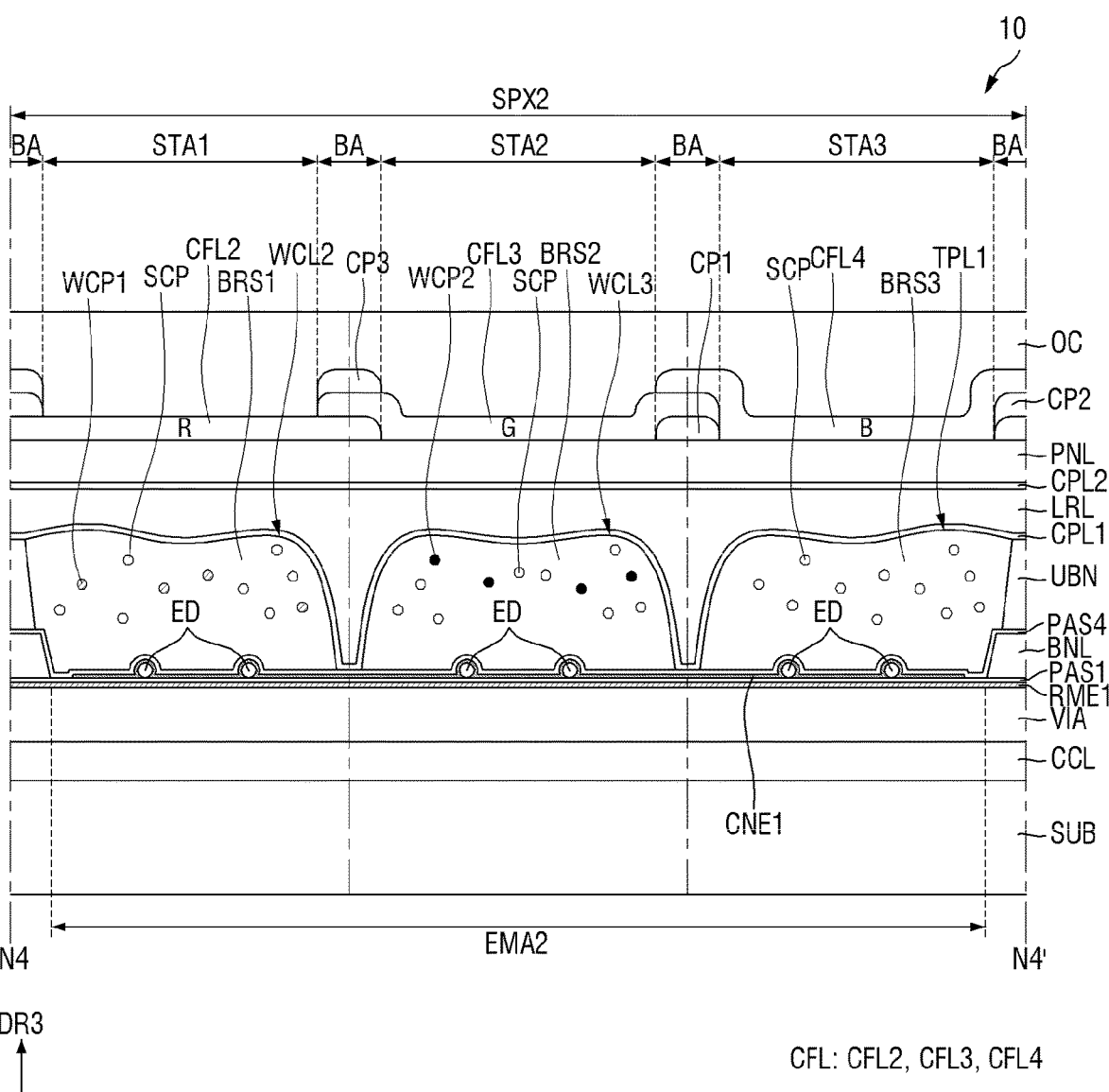
FIG. 14 is a cross-sectional view taken along the line N4-N4' of FIG. 12.

FIG. 12 is a plan view illustrating wavelength conversion layers and light transmitting layers disposed in one pixel of a display device according to one embodiment, FIG. 13 is a cross-sectional view taken along the line N3-N3' in FIG. 12, and FIG. 14 is a cross-sectional view taken along the line N4-N4' of FIG. 12.

FIG. 12 illustrates a relative planar arrangement of the color control structures WCL and TPL with respect to the bank layer BNL, the electrodes RME1 and RME2, and the light emitting elements ED disposed in the sub-pixels SPXn of one pixel PX. FIG. 13 illustrates a cross section across the color control structures disposed in the first to fourth sub-pixels SPX1, SPX2, SPX3, and SPX4 in the second direction DR2, and FIG. 14 illustrates a cross section across the color control structures disposed in the second sub-pixel SPX2 in the first direction DR1. In FIGS. 13 and 14, the shapes of the barrier walls BP1 and BP2, the electrodes RME1 and RME2, the bank layer BNL, the light emitting elements ED, and the connection electrodes CNE1 and CNE2 disposed in each sub-pixel SPXn are illustrated in a simplified manner, and only the first insulating layer PAS1 from among the insulating layers PAS1, PAS2 and PAS3 is illustrated. A detailed arrangement structure thereof will be understood with reference to FIGS. 10 and 11.

Referring to FIGS. 12 to 14, the display device 10 may include the light emitting elements ED disposed on the first substrate SUB with the color control structures TPL and WCL and the color filter layers CFL disposed thereon. The display device 10 may further include a plurality of layers disposed between the color control structures TPL and WCL and the color filter layer CFL and a plurality of layers disposed thereon.

The fourth insulating layer PAS4 may be disposed on the third insulating layer PAS3, the connection electrodes CNE1 and CNE2, and the bank layer BNL. The fourth insulating layer PAS4 may protect the light emitting elements ED disposed on the first substrate SUB. However, in some embodiments, the fourth insulating layer PAS4 may be omitted.

An upper bank layer UBN, the color control structures TPL and WCL, color patterns CP1, CP2, and CP3, and the color filter layer CFL may be disposed on the fourth insulating layer PAS4. Capping layers CPL1 and CPL2, a low refractive layer LRL, and a planarization layer PNL may be disposed between the color control structures TPL and WCL and the color filter layer CFL, and an overcoat layer OC may be disposed on the color filter layer CFL.

The sub-pixels SPXn of the display device 10 may include the plurality of light transmitting areas TA (e.g., TA1, TA2, TA3, and TA4) in which the color filter layer CFL is disposed to emit light, and the light blocking area BA disposed between the light transmitting areas TA and at where light is not emitted. The light transmitting area TA may be disposed to correspond to a part of the emission region EMA of each sub-pixel SPXn, and the light blocking area BA may be an area other than the light transmitting area TA. For example, the light blocking area BA may surround, in a plan view, each of the light transmitting areas TA.

The upper bank layer UBN may be disposed on the fourth insulating layer PAS4 to overlap the bank layer BNL. The upper bank layer UBN may include portions extending in the first and second directions DR1 and DR2 to be arranged in (or to form) a grid pattern. The upper bank layer UBN may surround, in a plan view, the emission area EMA or a portion where the light emitting elements ED are disposed. The upper bank layer UBN may form an area in which color control structures TPL and WCL are disposed.

The color control structures TPL and WCL may be disposed in an area surrounded, in a plan view, by the upper bank layer UBN on the fourth insulating layer PAS4. Although FIG. 12 illustrates an embodiment in which the color control structures TPL and WCL are spaced apart from the bank layer BNL by a gap (e.g., a predetermined gap), in some sub-pixels SPXn, the color control structures TPL and WCL may be disposed to fill the area surrounded, in a plan view, by the bank layer BNL and the upper bank layer UBN. The color control structures TPL and WCL may be disposed to be in direct contact with the inner sides of the upper bank layer UBN. The color control structures TPL and WCL may be disposed in the light transmitting area TA surrounded, in a plan view, by the upper bank layer UBN to form an island-like pattern in the display area DPA. However, the disclosure is not limited thereto, and the color control structures TPL and WCL may be arranged over the plurality of sub-pixels SPXn while extending in one direction to form a linear pattern.

In an embodiment in which the light emitting element ED of each sub-pixel SPXn emits blue light of the third color, the color control structures TPL and WCL may include a plurality of wavelength conversion layers WCL (e.g., WCL1, WCL2, WCL3, and WCL4) and a plurality of light transmitting layers TPL (e.g., TPL1 and TPL2). The wavelength conversion layer WCL may include a first wavelength conversion layer WCL1 disposed in the first sub-pixel SPX1, a second wavelength conversion layer WCL2 and a third wavelength conversion layer WCL3 disposed in the second sub-pixel SPX2, and a fourth wavelength conversion layer WCL4 disposed in the third sub-pixel SPX3. The light transmitting layer TPL may include a first light transmitting layer TPL1 disposed in the second sub-pixel SPX2 and a second light transmitting layer TPL2 disposed in the fourth sub-pixel SPX4. The first wavelength conversion layer WCL1 may be disposed in the first light transmitting area TA1, and the second wavelength conversion layer WCL2 may be disposed in the first sub light transmitting area STA1 of the second light transmitting area TA2. The third wavelength conversion layer WCL3 may be disposed in the second sub light transmitting area STA2 of the second light transmitting area TA2, and the fourth wavelength conversion layer WCL4 may be disposed in the third light transmitting area TA3 of the third sub-pixel SPX3. The first light transmitting layer TPL1 may be disposed in the third sub light transmitting area STA3 of the second sub-pixel SPX2, and the second light transmitting layer TPL2 may be disposed in the fourth light transmitting area TA4 of the fourth sub-pixel SPX4.

The first wavelength conversion layer WCL1 and the second wavelength conversion layer WCL2 may include a first base resin BRS1 and a first wavelength conversion material WCP1 disposed in the first base resin BRS1. The third wavelength conversion layer WCL3 and the fourth wavelength conversion layer WCL4 may include a second base resin BRS2 and a second wavelength conversion material WCP2 disposed in the second base resin BRS2. The wavelength conversion layer WCL may transmit the blue light of the third color incident from the light emitting element ED while converting (e.g., configured to convert) the wavelength thereof. The wavelength conversion layer WCL may further include a scatterer SCP in (e.g., suspended in) each base resin, and the scatterer SCP may increase wavelength conversion efficiency.

The first light transmitting layer TPL1 and the second light transmitting layer TPL2 may include a third base resin BRS3 and a scatterer SCP disposed in the third base resin BSR3. The light transmitting layer TPL may transmit the blue light of the third color incident from the light emitting element ED while maintaining the wavelength thereof. The scatterer SCP of the light transmitting layer TPL may control an emission path of the light emitted through the light transmitting layer TPL. The light transmitting layer TPL may not include a wavelength conversion material.

The scatterer SCP may be a metal oxide particle or an organic particle. Examples of the metal oxide may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), and the like. Examples of a material of the organic particles may include acrylic resin, urethane resin, and the like.

The first to third base resins BRS1, BRS2, and BRS3 may include a light transmitting organic material. For example, the first to third base resins BRS1, BRS2, and BRS3 may include an epoxy resin, an acrylic resin, a cardo resin, an imide resin, or the like. The first to third base resins BRS1, BRS2, and BRS3 may be formed of the same material, but the disclosure is not limited thereto.

The first wavelength conversion material WCP1 may convert the blue light of the third color into the red light of the first color, and the second wavelength conversion material WCP2 may convert the blue light of the third color into the green light of the second color. The first wavelength conversion material WCP1 and the second wavelength conversion material WCP2 may be quantum dots, quantum bars, phosphors or the like. Examples of the quantum dot may include group IV nanocrystal, group II-VI compound nanocrystal, group III-V compound nanocrystal, group IV-VI nanocrystal, and a combination thereof.

In some embodiments, the color control structures TPL and WCL may be formed by an inkjet printing process or a photoresist process. The color control structures TPL and WCL may be formed by a process of spraying or coating materials thereof into the area surrounded by the upper bank layer UBN and performing drying or exposure and development. For example, in an embodiment in which the color control structures TPL and WCL are formed by an inkjet printing process is illustrated, and the top surfaces of the layers of the color control structures TPL and WCL are not flat and the edges adjacent to the upper bank layer UBN may be higher than the central portions is shown. However, the disclosure is not limited thereto. In an embodiment in which the color control structures TPL and WCL are formed by a photoresist process, the top surfaces of the layers of the color control structures TPL and WCL may be flat and the edges adjacent to the upper bank layer UBN may be parallel to the top surface of the upper bank layer UBN or the central portions of the color control structures TPL and WCL may be higher different from the illustrated embodiment.

The first wavelength conversion layer WCL1 and the fourth wavelength conversion layer WCL4 may be disposed in the first sub-pixel SPX1 and the third sub-pixel SPX3, respectively. The first wavelength conversion layer WCL1 may be disposed on the first emission area EMA1 of the first sub-pixel SPX1 and may be disposed in the area in which the bank layer BNL and the upper bank layer UBN surround, in a plan view, the first sub-pixel SPX1. The fourth wavelength conversion layer WCL4 may be disposed on the third emission area EMA3 of the third sub-pixel SPX3 and may be disposed in the area in which the bank layer BNL and the upper bank layer UBN surround, in a plan view, the third sub-pixel SPX3. Similarly, the second light transmitting layer TPL2 may be disposed in the fourth sub-pixel SPX4, and may be disposed in the area in which the bank layer BNL and the upper bank layer UBN surround, in a plan view, the fourth sub-pixel SPX4 on the fourth emission area EMA4. The first transmitting area TA1 of the first sub-pixel SPX1, the third transmitting area TA3 of the third sub-pixel SPX3, and the fourth transmitting area TA4 of the fourth sub-pixel SPX4 may be defined by the arrangement of the color control structures TPL and WCL disposed in each sub-pixel SPXn and the color filter layer CFL, to be described later.

Each of the second wavelength conversion layer WCL2, the third wavelength conversion layer WCL3, and the first light transmitting layer TPL1 may be disposed in the second sub-pixel SPX2. The second wavelength conversion layer WCL2, the third wavelength conversion layer WCL3, and the first light transmitting layer TPL1 may be disposed in the second emission area EMA2 and may be disposed in the area in which the bank layer BNL and the upper bank layer UBN surround, in a plan view, the second sub-pixel SPX2. In one embodiment, the second wavelength conversion layer WCL2, the third wavelength conversion layer WCL3, and the first light transmitting layer TPL1 may be disposed to be spaced apart from each other in the first direction DR1 in the second sub-pixel SPX2. The second wavelength conversion layer WCL2 may be disposed on the upper side in the drawings, that is, one side in the first direction DR1 in the second emission area EMA2 of the second sub-pixel SPX2, the third wavelength conversion layer WCL3 may be disposed at the central portion in the drawings or the central area of the second emission area EMA2, and the first light transmitting layer TPL1 may be disposed on the lower side in the drawings, that is, the other side in the first direction DR1 in the second emission area EMA2. The second light transmitting area TA2 of the second sub-pixel SPX2 may include the plurality of sub light transmitting areas STA1, STA2, and STA3, and they may be defined by the arrangement of different color control structures TPL and WCL disposed in the second sub-pixel SPXn and the color filter layer CFL, to be described later. For example, a portion of the second transmitting area TA2 overlapping the second wavelength conversion layer WCL2 may be the first sub light transmitting area STA1, a portion thereof overlapping the third wavelength conversion layer WCL3 may be the second sub light transmitting area STA2, and a portion thereof overlapping the first light transmitting layer TPL1 may be the third sub light transmitting area STA3.

The display device 10 may include a first type sub-pixel, such as the first sub-pixel SPX1, the third sub-pixel SPX3, and the fourth sub-pixel SPX4, in which one type of color control structures TPL and WCL are disposed in the area surrounded, in a plan view, by the bank layer BNL and the upper bank layer UBN, and a second type sub-pixel, such as the second sub-pixel SPX2, in which two or more different types of color control structures TPL and WCL are disposed in the area surrounded, in a plan view, by the bank layer BNL and the upper bank layer UBN.

The light emitting elements ED disposed in each sub-pixel SPXn may be disposed to overlap the color control structures TPL and WCL thereon, and the lights emitted from the light emitting elements ED may be incident on the color control structures TPL and WCL. In the first type sub-pixels, light of a specific color or light of a specific wavelength band may be emitted from the light transmitting area TA depending on types of the color control structures TPL and WCL disposed therein. On the other hand, in the second type sub-pixel, different color or light of different wavelength bands may be simultaneously emitted, or mixed light thereof, may be emitted from the transmitting area TA depending on the two or more different types of color control structures TPL and WCL.

For example, the light emitting element ED of each sub-pixel SPXn may emit the blue light of the same third color, and the sub-pixels SPXn may emit lights of different colors. The light emitted from the light emitting element ED disposed in the first sub-pixel SPX1 may be incident on the first wavelength conversion layer WCL1, the light emitted from the light emitting element ED disposed in the third sub-pixel SPX3 may be incident on the fourth wavelength conversion layer WCL4, and the light emitted from the light emitting element ED disposed in the fourth sub-pixel SPX4 may be incident on the second light transmitting layer TPL2. The light incident on the first wavelength conversion layer WCL1 may be converted to red light, the light incident on the fourth wavelength conversion layer WCL4 may be converted to green light, and the light incident on the second light transmitting layer TPL2 may be transmitted as the same blue light without wavelength conversion. Even if the first sub-pixel SPX1, the third sub-pixel SPX3, and the fourth sub-pixel SPX4 include the light emitting elements ED emitting light of the same color, they may emit lights of different colors depending on the arrangement of the color control structures TPL and WCL disposed thereon.

Some of the light emitting elements ED disposed in the second sub-pixel SPX2 may be disposed to overlap the second wavelength conversion layer WCL2, some others thereof may be disposed to overlap the third wavelength conversion layer WCL3, yet some others thereof may be disposed to overlap the first light transmitting layer TPL1. The light emitted from some of the light emitting elements ED of the second sub-pixel SPX2 may be incident on the second wavelength conversion layer WCL2, the light emitted from some other light emitting elements ED may be incident on the third wavelength conversion layer WCL3, and the light emitted from yet some other light emitting elements ED may be incident on the first light transmitting layer TPL1. The second wavelength conversion layer WCL2 may convert the blue light of the third color emitted from the light emitting element ED to the red light of the first color, and the red light of the first color may be emitted from the first sub light transmitting area STA1. The third wavelength conversion layer WCL3 may convert the blue light of the third color emitted from the light emitting element ED to the green light of the second color, and the green light of the second color may be emitted from the second sub light transmitting area STA2. The first light transmitting layer TPL1 may not convert the blue light of the third color emitted from the light emitting element ED, and the blue light of the third color may be emitted from the third sub light transmitting area STA3. In the second sub-pixel SPX2, the sub light transmitting area STA1, STA2, and STA3 may emit different color light, and the second light transmitting area TA2 may emit different color light simultaneously or may emit mixed light thereof (e.g., white light).

The first capping layer CPL1 may be disposed on the plurality of color control structures TPL and WCL and the upper bank layer UBN. The first capping layer CPL1 may prevent impurities, such as moisture or air, from permeating from the outside and damaging or contaminating the color control structures TPL and WCL. The first capping layer CPL1 may contain an inorganic insulating material.

The first capping layer CPL1 may be disposed to cover the color control structures TPL and WCL and may be disposed along the stepped portion formed by them. In the first sub-pixel SPX1, the third sub-pixel SPX3, and the fourth sub-pixel SPX4, the color control structures TPL and WCL may be disposed to fill the area surrounded, in a plan view, by the upper bank layer UBN, and the first capping layer CPL1 may be disposed to extend from top surfaces of the color control structures TPL and WCL to a top surface of the upper bank layer UBN. On the other hand, in the second sub-pixel SPX2, the color control structures TPL and WCL (e.g., the second wavelength conversion layer WCL2, the third wavelength conversion layer WCL3, and the first light transmitting layer TPL1) may be disposed in the area surrounded, in a plan view, by the upper bank layer UBN while being spaced apart from each other. The color control structures TPL and WCL of the second sub-pixel SPX2 may not be disposed to completely fill the area surrounded, in a plan view, by the upper bank layer UBN, and the first capping layer CPL1 may be directly disposed on the fourth insulating layer PAS4 between the color control structures TPL and WCL spaced apart from each other. In an embodiment in which the fourth insulating layer PAS4 is omitted, the first capping layer CPL1 may be directly disposed on any one of the third insulating layer PAS3 and the connection electrode CNE. The first capping layer CPL1 may completely cover the color control structures TPL and WCL while being disposed between the color control structures TPL and WCL that are spaced apart from each other in the second sub-pixel SPX2.

The low refractive layer LRL may be disposed on the first capping layer CPL1. The low refractive layer LRL is an optical layer for recycling the light having transmitted the color control structures TPL and WCL and may improve the light emission efficiency and the color purity of the display device 10. The low refractive layer LRL may be made of an organic material having a low refractive index and may compensate the stepped portion formed by the color control structures TPL and WCL and the upper bank layer UBN.

The second capping layer CPL2 may be disposed on the low refractive layer LRL and may prevent impurities, such as moisture, air or the like, from permeating from the outside and damaging or contaminating the low refractive layer LRL. The second capping layer CPL2 may include an inorganic insulating material similar to the first capping layer CPL1.

The planarization layer PNL may be disposed across the entire display area DPA and the entire non-display area NDA on the second capping layer CPL2. The planarization layer PNL may overlap the color control structures TPL and WCL in the display area DPA. The planarization layer PNL may protect the members disposed on the first substrate SUB in addition to the plurality of capping layers CPL1 and CPL2 and the low refractive layer LRL and may partially compensate for the stepped portion formed by them. For example, the planarization layer PNL may compensate for the stepped portion formed by the color control structures TPL and WCL, the upper bank layer UBN, and the bank layer BNL that are disposed thereunder in the display area DPA so that the color filter layers CFL disposed thereon may be formed on a flat surface.

A plurality of color filter layers CFL (e.g., CLF1, CLF2, CFL3, CFL4, CFL5, and CFL6) may be disposed on the planarization layer PNL. The color filter layers CFL may be disposed in the light transmitting area TA or the sub light transmitting areas STA1, STA2, and STA3 in the sub-pixel SPXn and may be disposed to partially extend to the light blocking area BA. The color filter layer CFL may overlap another color filter layers CFL or the color patterns CP1, CP2, and CP3 in the light blocking area BA. A portion in which the color filter layer CFL does not overlap another color filter layer CFL may be the light transmitting area TA in which light is emitted, and the area in which different color filter layers CFL overlap or the color patterns CP1, CP2, and CP3 are disposed may be the light blocking area BA in which the emission of the light is blocked.

The color filter layer CFL may include a first color filter layer CFL1 disposed in the first sub-pixel SPX1, second to fourth color filter layers CFL2, CFL3, and CFL4 disposed in the second sub-pixel SPX2, a fifth color filter layer CFL5 disposed in the third sub-pixel SPX3, and a sixth color filter layer CFL6 disposed in the fourth sub-pixel SPX4. The color filter layer CFL may be disposed in an island-like pattern to correspond to the light transmitting area TA or the emission area EMA. However, the disclosure is not limited thereto. The color filter layer CFL may be disposed across the plurality of light transmitting areas TA or emission areas EMA to form a linear pattern.

The color filter layer CFL may contain a colorant, such as a dye or a pigment, that absorbs light of a wavelength other than a specific wavelength. The color filter layer CFL may transmit only some of the light incident on the color filter layer CFL in the sub-pixel SPXn. Each sub-pixel SPXn of the display device 10 may selectively display only the light that has transmitted the color filter layer CFL. In an embodiment, the first color filter layer CFL1 and the second color filter layer CFL2 may be red color filter layers, the third color filter layer CFL3 and the fifth color filter layer CFL5 may be green color filter layers, and the fourth color filter layer CFL4 and the sixth color filter layer CFL6 may be blue color filter layers. The light emitted from the light emitting element ED may be emitted through the color filter layer CFL while transmitting the color control structures TPL and WCL.

The color patterns CP1, CP2, and CP3 may be disposed on the planarization layer PNL or the color filter layer CFL. The color patterns CP1, CP2, and CP3 may be made of the same material as that of the color filter layer CFL and disposed in the light blocking area BA. In the light blocking area BA, the color patterns CP1, CP2, and CP3 and different color filter layers CFL may be stacked, and light transmission may be blocked in the area at where they are stacked.

The first color pattern CP1 may be made of the same material as those of the first color filter layer CFL1 and the second color filter layer CFL2 and disposed in the light blocking area BA. The first color pattern CP1 may be directly disposed on the planarization layer PNL in the light blocking area BA and may not be disposed in the first light transmitting area TA1 of the first sub-pixel SPX1 and the light blocking area BA adjacent to the first sub light transmitting area STA1 of the second sub-pixel SPX2. The first color pattern CP1 may be disposed in the light blocking area BA between the second sub-pixel SPX2 and the third sub-pixel SPX3 or between the second sub light transmitting area STA2 and the third sub light transmitting areas STA3 of the second light transmitting area TA2. The first color filter layer CFL1 may extend to be disposed in the light blocking area BA around the first sub-pixel SPX1, and the second color filter layer CFL2 may extend to be disposed in an area around the first sub light transmitting area STA1.

The second color pattern CP2 may be made of the same material as those of the third color filter layer CFL3 and the fifth color filter layer CFL5 and disposed in the light blocking area BA. The second color pattern CP2 may be directly disposed on the first color pattern CP1, or on the first color filter layer CFL1 or the second color filter layer CFL2 on the planarization layer PNL of the light blocking area BA, and may not be disposed in the light blocking area BA adjacent to the third light transmitting area TA3 of the third sub-pixel SPX3. The second color pattern CP2 may be disposed in the light blocking area BA between the first sub-pixel SPX1 and the second sub-pixel SPX2 or between the first sub-pixel SPX1 and the fourth sub-pixel SPX4, or in the areas around the first sub light transmitting area STA1 and the third sub light transmitting area STA3 that are not in contact with the second sub light transmitting area STA2 of the second light transmitting area TA2. The fifth color filter layer CFL5 may extend to be disposed in the light blocking area BA around the third sub-pixel SPX3.

Similarly, the third color pattern CP3 may be made of the same material as those of the third color filter layer CFL3 and the sixth color filter layer CFL6 and disposed in the light blocking area BA. The third color pattern CP3 may be directly disposed on the second color pattern CP2, or on the second color filter layer CFL2 or the fifth color filter layer CFL5 on the planarization layer PNL of the light blocking area BA, and may not be disposed in the light blocking area BA adjacent to the fourth light transmitting area TA4 of the fourth sub-pixel SPX4. The third color pattern CP3 may be disposed in the light blocking area BA between the first sub-pixel SPX1 and the second sub-pixel SPX2, or between the second sub-pixel SPX2 and the third sub-pixel SPX3, or between the first sub light transmitting area STA1 and the second sub light transmitting area STA2 of the second light transmitting area TA2. The sixth color filter layer CFL6 may extend to be disposed in the light blocking area BA around the fourth sub-pixel SPX4.

In the display device 10, the area overlapping the bank layer BNL and the upper bank layer UBN may be the light blocking area BA, and each of the first color pattern CP1, the second color pattern CP1, and the third color pattern CP3 may be disposed to overlap at least one of the color filter layers CFL containing different colorants in the light blocking area BA. For example, in the areas between different sub-pixels SPXn, the first color pattern CP1 may be disposed to overlap the fifth color filter layer CFL5 and the sixth color filter layer CFL6, the second color pattern CP2 may be disposed to overlap the first color filter layer CFL1 and the sixth color filter layer CFL6, and the third color pattern CP3 may be disposed to overlap the first color filter layer CFL1 and the fifth color filter layer CFL5. Because the color patterns CP1, CP2, and CP3 and the color filter layers CFL containing different colorants overlap each other, light may be blocked at the light blocking area BA.

In accordance with one embodiment, between different sub light transmitting areas STA1, STA2, and STA3 in the second light transmitting area TA2, the first color pattern CP1 may be disposed to overlap the second color filter layer CFL2 and the third color filter layer CFL3, the second color pattern CP2 may be disposed to overlap the second color filter layer CFL2 and the fourth color filter layer CFL4, and the third color pattern CP3 may be disposed to overlap the second color filter layer the CFL2 and the third color filter layer CFL3. The color filter layer CFL and the color patterns CP1, CP2, and CP3 containing different colorants may be disposed to overlap each other in a part of the second light transmitting area TA2. However, the disclosure is not limited thereto.

Although it is illustrated in the drawing that the color patterns CP1, CP2, and CP3 disposed in the second sub-pixel SPX2 overlap different color filter layers CFL, the disclosure is not limited thereto. If red light of the first color, green light of the second color, and blue light of the third color are emitted simultaneously or mixed light thereof are emitted from the entire second light transmitting area TA2 of the second sub-pixel SPX, the transmission of light of a specific wavelength band may not be blocked in the areas between different sub light transmitting areas STA1, STA2, and STA3. In such an embodiment, the color patterns CP1, CP2, and CP3 may not be disposed between the sub light transmitting areas STA1, STA2, and STA3 of the second sub-pixel SPX2, or at the portions where different color filter layers CFL are in contact with each other or overlap.

The plurality of color patterns CP1, CP2, and CP3 and the color filter layer CFL may have a stacked structure to prevent colors from mixing between adjacent areas due to materials containing different colorants. Because the color patterns CP1, CP2, and CP3 contain the same material as that of the color filter layer CFL, external light or reflected light transmitting the light blocking area BA may have a wavelength band of a specific color. The eye color sensibility perceived by user's eyes varies depending on the color of the light. For example, light in the blue wavelength band may be perceived less sensitively to a user than light in the green wavelength band and light in the red wavelength band. In the display device 10, the color patterns CP1, CP2, and CP3 are disposed in the light blocking area BA so that the transmission of light may be blocked and the user may perceive the reflected light relatively less sensitively. Also, some of the light from the outside of the display device 10 may be absorbed to reduce the reflected light due to the external light.

The overcoat layer OC may be disposed on the color filter layer CFL and the color patterns CP1, CP2, and CP3. The overcoat layer OC may be disposed in the entire display area DPA and may be partially disposed in the non-display area NDA. The overcoat layer OC may protect the members containing an organic insulating material and arranged in the display area DPA from the outside.

The display device 10 according to one embodiment includes the color control structures TPL and WCL and the color filter layer CFL disposed on the light emitting elements ED so that different color light may be displayed even when the same type of light emitting elements ED are disposed in each sub-pixel SPXn.

For example, the light emitting element ED disposed in the first sub-pixel SPX1 may emit the blue light of the third color, and the light may be incident on the first wavelength conversion layer WCL1 while transmitting the fourth insulating layer PAS4. The first base resin BRS1 of the first wavelength conversion layer WCL1 may be made of a transparent material, and some of the light may transmit the first base resin BRS1 to be incident on the first capping layer CPL1 disposed thereon. However, at least some of the light may be incident on the scatterer SCP and the first wavelength conversion material WCP1 arranged in the first base resin BRS1. The light may be scattered and wavelength converted, and may then be incident as red light on the first capping layer CPL1. The light incident on the first capping layer CPL1 may be incident on the first color filter layer CFL1 while transmitting the low refractive layer LRL, the second capping layer CPL2, and the planarization layer PNL, and the transmission of other light except the red light may be blocked by the first color filter layer CFL1. Accordingly, the first sub-pixel SPX1 may emit the red light.

Similarly, the light emitted from the light emitting element ED disposed in the third sub-pixel SPX3 may be emitted as the green light while transmitting the fourth insulating layer PAS4, the fourth wavelength conversion layer WCL4, the first capping layer CPL1, the low refractive layer LRL, the second capping layer CPL2, the planarization layer PNL, and the fifth color filter layer CFL5.

The light emitting element ED disposed in the fourth sub-pixel SPX4 may emit blue light of the third color, and the blue light of the third color may be incident on the second light transmitting layer TPL2 while transmitting the fourth insulating layer PAS4. The third base resin BRS3 of the second light transmitting layer TPL2 may be made of a transparent material, and some of the light may transmit the third base resin BRS3 to be incident on the capping layer CPL1 disposed thereon. The light incident on the first capping layer CPL1 may be incident on the sixth color filter layer CFL6 while transmitting the low refractive layer LRL, the second capping layer CPL2, and the planarization layer PNL, and the transmission of other light except the blue light may be blocked by the sixth color filter layer CFL6. Accordingly, the fourth sub-pixel SPX4 may emit the blue light.

The light emitting element ED disposed in the second sub-pixel SPX2 may emit blue light of the third color, and the blue light of the third color may be incident on any one of the second wavelength conversion layer WCL2, the third wavelength conversion layer WCL3, and the first light transmitting layer TPL1 while transmitting the fourth insulating layer PAS4. The lights may be incident on different color filter layers CFL while transmitting the third wavelength conversion layer WCL3, the first light transmitting layer TPL1, the first capping layer CPL1, the low refractive layer LRL, the second capping layer CPL2, and the planarization layer PNL. The light that transmits the second wavelength conversion layer WCL2 may be incident on the second color filter layer CFL2, and the second color filter layer CFL2 may block the transmission of other light except red light. The lights that have transmitted the third wavelength conversion layer WCL3 may be incident on the third color filter layer CFL3, and the third color filter layer CFL3 may block the transmission of other light except green light. The light that transmits the first light transmitting layer TPL1 may be incident on the third color filter layer CFL3, and the third color filter layer CFL3 may block the transmission of other light except blue light. Accordingly, the second sub-pixel SPX2 may emit the red light, the green light, and the blue light simultaneously, or may emit mixed light thereof (e.g., white light).

At least one pair of first and second electrodes RME1 and RME2 may be disposed in each of the sub-pixels SPXn, and the light emitting elements ED disposed in each of the sub-pixels SPXn may be electrically connected to the same first and second electrodes RME1 and RME2 or the same first and second connection electrodes CNE1 and CNE2. Each of the first sub-pixel SPX1, the third sub-pixel SPX3, and the fourth sub-pixel SPX4 emits light of one color, respectively, so that the light emitting elements ED disposed therein may be electrically connected to the same electrode RME and/or the same connection electrode CNE. Even when the second sub-pixel SPX2 emits different color light simultaneously or emits mixed light thereof, the light emitting elements ED disposed in the second sub-pixel SPX2 may be electrically connected to the same electrode RME and/or the same connection electrode CNE. Even when the second sub-pixel SPX2 has a light emission structure different from those of other sub-pixels SPX1, the second sub-pixel SPX2 may have the same pixel circuit structure as those of other sub-pixels SPX1. As illustrated in FIGS. 3 and 4, in an embodiment in which each of the sub-pixels SPXn of the display device 10 has a 3T1C pixel circuit structure, the second sub-pixel SPX2 may have the 3T1C pixel circuit structure so that the light emitting elements ED may emit light in response to the same driving signal, and the second sub-pixel SPX2 may emit different color light simultaneously or may emit mixed light thereof.

Because each of the first sub-pixel SPX1, the third sub-pixel SPX3, and the fourth sub-pixel SPX4 emits light of one specific wavelength band, even when the plurality of light emitting elements ED are simultaneously driven or emit light, the color coordinates of colors displayed in the corresponding sub-pixel SPXn may be adjusted. In the first sub-pixel SPX1, the third sub-pixel SPX3, and the fourth sub-pixel SPX4, desired color coordinates may be obtained by adjusting a driving current for allowing the light emitting element ED to emit light, and the thicknesses of the color control structures TPL and WCL and the color filter layer CFL. On the other hand, in the second sub-pixel SPXn, the light emitting elements ED are simultaneously driven to emit light so that desired color coordinates may be obtained by adjusting the thicknesses of the color control structures TPL and WCL and the color filter layer CFL rather than by controlling the driving current. For example, because the second sub-pixel SPXn emits mixed light of two or more colors, the desired color coordinates of the light of a specific color in the mixed light may be obtained by adjusting the thicknesses of the color control structures TPL and WCL or the color filter layer CFL related to the light of the corresponding color.

In the display device 10 according to one embodiment, the arrangement of the electrodes RME and the connection electrodes CNE disposed in the sub-pixels SPXn may be the same and the same type of light emitting elements ED may be disposed therein, but the pixels PX may emit white light in addition to simultaneously emitting red light, green light, and blue light. In the display device 10, one pixel PX may include four sub-pixels SPXn and may include the first type sub-pixel (e.g., the first sub-pixel, the third sub-pixel, and the fourth sub-pixel) emitting light of one color and the second type sub-pixel emitting lights of two or more colors or mixed light. In the first type sub-pixel and the second type sub-pixel, the structures of the electrode RME and the light emitting elements ED may be the same, but the arrangement of the color control structures TPL and WCL disposed thereon may be different so that different color light may be emitted.

However, the disclosure is not limited thereto. In some embodiments, in the display device 10, different light emitting elements ED may be disposed in the sub-pixels SPXn, and the sub-pixels SPXn may have different electrode structures and emit different color light. In such an embodiment, the color control structures TPL and WCL disposed in the sub-pixels SPXn may be the same. This will be described later with reference to another embodiment.

Figure 15:
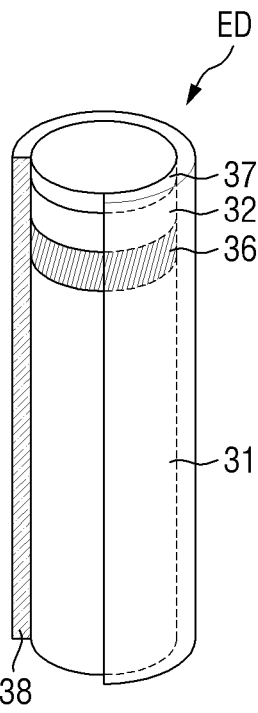
FIG. 15 is a schematic view of a light emitting element according to one embodiment.

FIG. 15 is a schematic view of a light emitting element according to one embodiment.

Referring to FIG. 15, the light emitting element ED may be a light emitting diode. The light emitting element ED may be an inorganic light emitting diode that has a nanometer or micrometer size and is made of an inorganic material. The light emitting element ED may be aligned between two electrodes exhibiting polarity when an electric field is formed in a specific direction between them.

The light emitting element ED according to one embodiment may have a shape elongated in one direction. The light emitting element ED may have a shape of a cylinder, a rod, a wire, a tube, or the like. However, the shape of the light emitting element ED is not limited thereto, and the light emitting element ED may have a polygonal prism shape, such as a regular cube, a rectangular parallelepiped, and a hexagonal prism, or may have various shapes, such as a shape elongated in one direction and having an outer surface partially inclined.

The light emitting element ED may include a semiconductor layer doped with any conductivity type (e.g., p-type or n-type) dopant. The semiconductor layer may emit light of a specific wavelength band by receiving an electrical signal applied from an external power source. The light emitting element ED may include a first semiconductor layer 31, a second semiconductor layer 32, a light emitting layer 36, an electrode layer 37, and an insulating film 38.

The first semiconductor layer 31 may be an n-type semiconductor. The first semiconductor layer 31 may include a semiconductor material having a chemical formula of $Al_xGa_yIn_{1-x-y}N$ ($0 \leq x \leq 1$, $0 \leq y \leq 1$, $0 \leq x+y \leq 1$). For example, the first semiconductor layer 31 may be any one or more of AlGaInN, GaN, AlGaN, InGaN, AlN, and InN doped with an n-type dopant. The n-type dopant doped into the first semiconductor layer 31 may be Si, Ge, Sn, Se, or the like.

The second semiconductor layer 32 is disposed on the first semiconductor layer 31 with the light emitting layer 36 therebetween. The second semiconductor layer 32 may be a p-type semiconductor, and the second semiconductor layer 32 may include a semiconductor material having a chemical formula of $Al_xGa_yIn_{1-x-y}N$ ($0 \leq x \leq 1$, $0 \leq y \leq 1$, $0 \leq x+y \leq 1$). For example, the second semiconductor layer 32 may be any one or more of AlGaInN, GaN, AlGaN, InGaN, AlN, and InN doped with a p-type dopant. The p-type dopant doped into the second semiconductor layer 32 may be Mg, Zn, Ca, Ba, or the like.

Although it is illustrated in the drawing that the first semiconductor layer 31 and the second semiconductor layer 32 are each configured as one layer, the disclosure is not limited thereto. Depending on the material of the light emitting layer 36, the first semiconductor layer 31 and the second semiconductor layer 32 may further include a greater number of layers, such as a cladding layer or a tensile strain barrier reducing (TSBR) layer. For example, the light emitting element ED may further include another semiconductor layer disposed between the first semiconductor layer 31 and the light emitting layer 36 or between the second semiconductor layer 32 and the light emitting layer 36. The semiconductor layer disposed between the first semiconductor layer 31 and the light emitting layer 36 may be one or more of AlGaInN, GaN, AlGaN, InGaN, AlN, InN, and SLS doped with an n-type dopant, and the semiconductor layer disposed between the second semiconductor layer 32 and the light emitting layer 36 may be one or more of AlGaInN, GaN, AlGaN, InGaN, AlN, and InN doped with a p-type dopant.

The light emitting layer 36 is disposed between the first semiconductor layer 31 and the second semiconductor layer 32. The light emitting layer 36 may include a material having a single or multiple quantum well structure. When the light emitting layer 36 includes a material having a multiple quantum well structure, a plurality of quantum layers and well layers may be alternately stacked. The light emitting layer 36 may emit light by the coupling of electron-hole pairs according to an electrical signal applied through the first semiconductor layer 31 and the second semiconductor layer 32. The light emitting layer 36 may include a material such as AlGaN, AlGaInN, or InGaN. For example, when the light emitting layer 36 has a multiple quantum well structure in which quantum layers and well layers are alternately stacked, the quantum layer may include a material such as AlGaN or AlGaInN, and the well layer may include a material such as GaN or AlInN.

The light emitting layer 36 may have a structure in which semiconductor materials having large band gap energy and semiconductor materials having small band gap energy are alternately stacked and may include other group Ill to V semiconductor materials according to the wavelength band of the emitted light. The light emitted by the light emitting layer 36 is not limited to the light of the blue wavelength band, but the light emitting layer 36 may also emit light of a red or green wavelength band in some embodiments.

The electrode layer 37 may be an ohmic connection electrode. However, the disclosure is not limited thereto, and it may be a Schottky connection electrode. The light emitting element ED may include at least one electrode layer 37. The light emitting element ED may include one or more electrode layers 37, but the disclosure is not limited thereto, and the electrode layer 37 may be omitted in some embodiments.

In the display device 10, when the light emitting element ED is electrically connected to an electrode or a connection electrode, the electrode layer 37 may reduce the resistance between the light emitting element ED and the electrode or connection electrode. The electrode layer 37 may include a conductive metal. For example, the electrode layer 37 may include at least one of aluminum (Al), titanium (Ti), indium (In), gold (Au), silver (Ag), ITO, IZO, or ITZO.

The insulating film 38 is arranged to surround outer surfaces of the plurality of semiconductor layers and electrode layers described above. For example, the insulating film 38 may be disposed to surround at least the outer surface of the light emitting layer 36 and may be formed to expose both ends (e.g., opposite ends) of the light emitting element ED in the longitudinal direction. Further, in a cross-sectional view, the insulating film 38 may have a top surface that is rounded in a region adjacent to at least one end of the light emitting element ED.

The insulating film 38 may include at least one of materials having insulating properties, for example, silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$). The insulating film 38 is illustrated as being a single layer, but the disclosure is not limited thereto. In some embodiments, the insulating film 38 may be formed in a multilayer structure including a plurality of stacked layers.

The insulating film 38 may protect the semiconductor layers and the electrode layer of the light emitting element ED. The insulating film 38 may prevent an electrical short circuit that may occur at the light emitting layer 36 when an electrode to which an electrical signal is transmitted is in direct contact with the light emitting element ED. In addition, the insulating film 38 may ensure luminous efficiency of the light emitting element ED.

Further, an outer surface of the insulating film 38 may be surface-treated. The light emitting elements ED may be aligned in such a way of spraying the ink in which the light emitting elements ED are dispersed on the electrodes. The surface of the insulating film 38 may be treated to have a hydrophobic property or hydrophilic property to keep the light emitting elements ED in the dispersed state without being aggregated with other adjacent light emitting elements ED in the ink.

Hereinafter, various embodiments of the display device 10 will be described with reference to other drawings.

Figure 16:
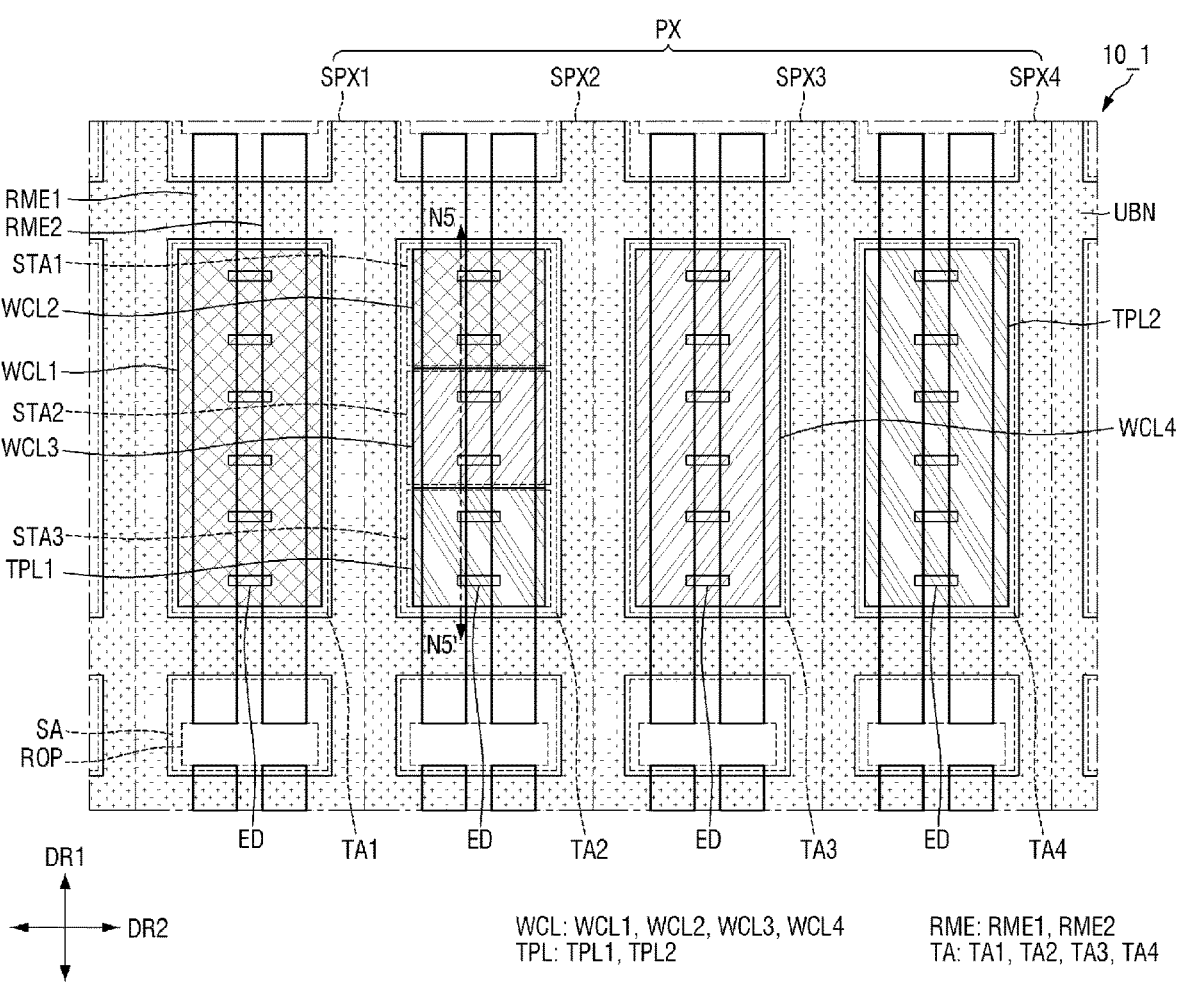
FIG. 16 is a plan view illustrating wavelength conversion layers and light transmitting layers disposed in one pixel of a display device according to another embodiment.
Figure 17:
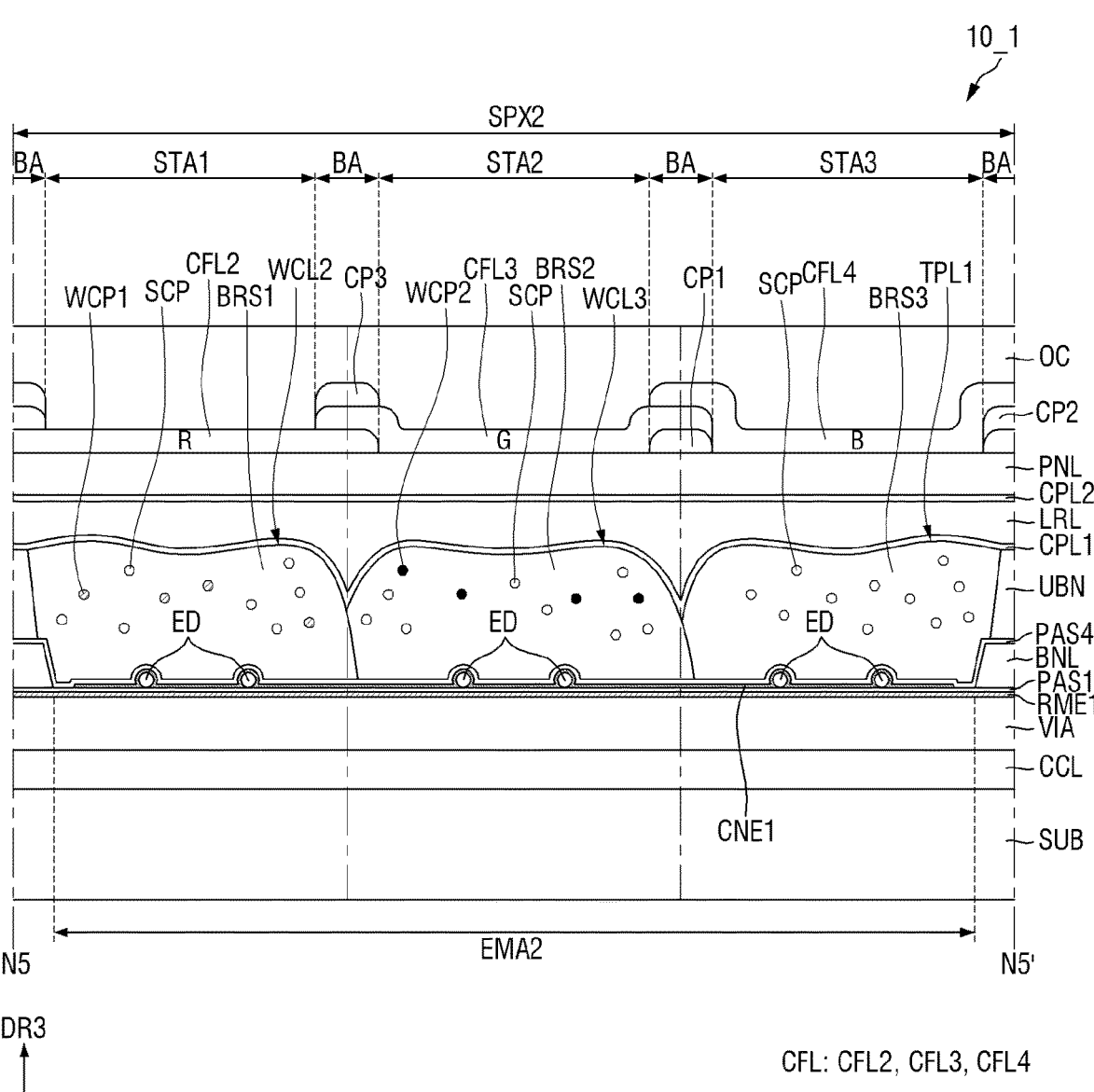
FIG. 17 is a cross-sectional view taken along the line N5-N5' of FIG. 16.

FIG. 16 is a plan view illustrating wavelength conversion layers and light transmitting layers disposed in one pixel of a display device according to another embodiment. FIG. 17 is a cross-sectional view taken along the line N5-N5' of FIG. 16 and is a cross-sectional view of the second sub-pixel SPX2 of FIG. 16 taken along the first direction DR1.

Referring to FIGS. 16 and 17, in a display device 10_1 according to one embodiment, the second wavelength conversion layer WCL2, the third wavelength conversion layer WCL3, and the first light transmitting layer TPL1 of the second sub-pixel SPX2 may be disposed in contact with each other without being spaced apart from each other. The second wavelength conversion layer WCL2, the third wavelength conversion layer WCL3, and the first light transmitting layer TPL1, which are the color control structures disposed in the second sub-pixel SPX2, may be disposed to fill the area surrounded, in a plan view, by the bank layer BNL and the upper bank layer UBN. Because the second wavelength conversion layer WCL2, the third wavelength conversion layer WCL3, and the first light transmitting layer TPL1 are disposed to be in contact with each other, the first capping layer CPL1 disposed to cover them may not be in direct contact with the fourth insulating layer PAS4 disposed under the color control structures.

Because the color control structures of the second sub-pixel SPX2 are disposed to be in contact with each other, some of the light emitted from the light emitting element ED may be incident on other adjacent color control structures. For example, some of the light emitted from the light emitting element ED disposed to overlap the third wavelength conversion layer WCL3 may be incident on the color filter layer CFL through the third wavelength conversion layer WCL3, and some other light thereof may be incident on the color filter layer CFL through the second wavelength conversion layer WCL2 or the first light transmitting layer TPL1. However, even if some of the light emitted from the light emitting element ED is emitted through another color control structure, the amount of light emitted from the second sub-pixel SPX2 is determined by the number of light emitting elements ED disposed in the second sub-pixel SPX2. Therefore, the amount of emitted light may hardly change even when the color control structures are disposed in contact with each other. Further, because the color control structures are disposed to cover the light emitting element ED in the second sub-pixel SPX2, the amount of light incident on the color filter layer CFL through an unintended color control structure from among the lights emitted from the light emitting element ED may be very small.

Figure 18:
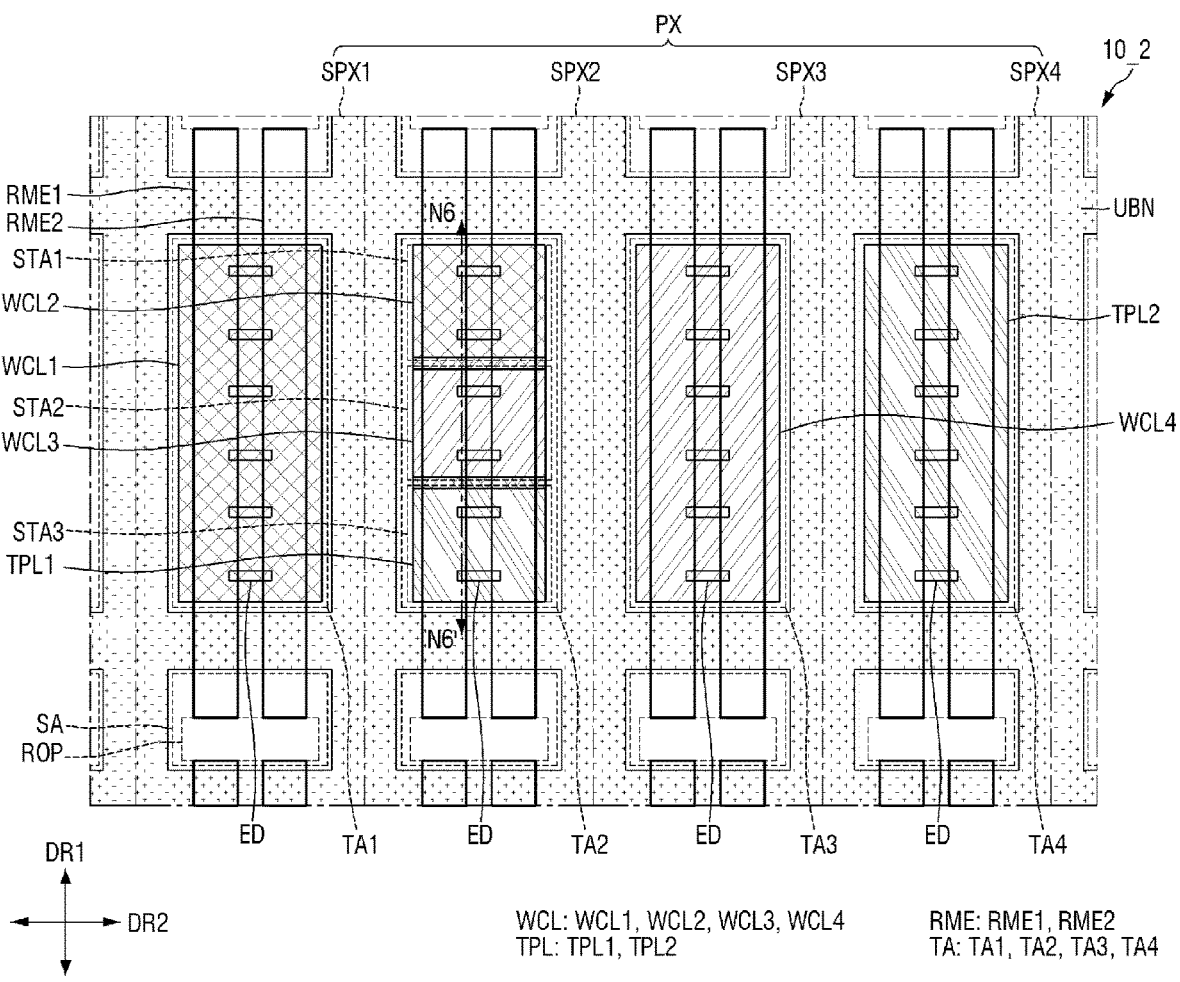
FIG. 18 is a plan view illustrating wavelength conversion layers and light transmitting layers disposed in one pixel of a display device according to another embodiment.
Figure 19:
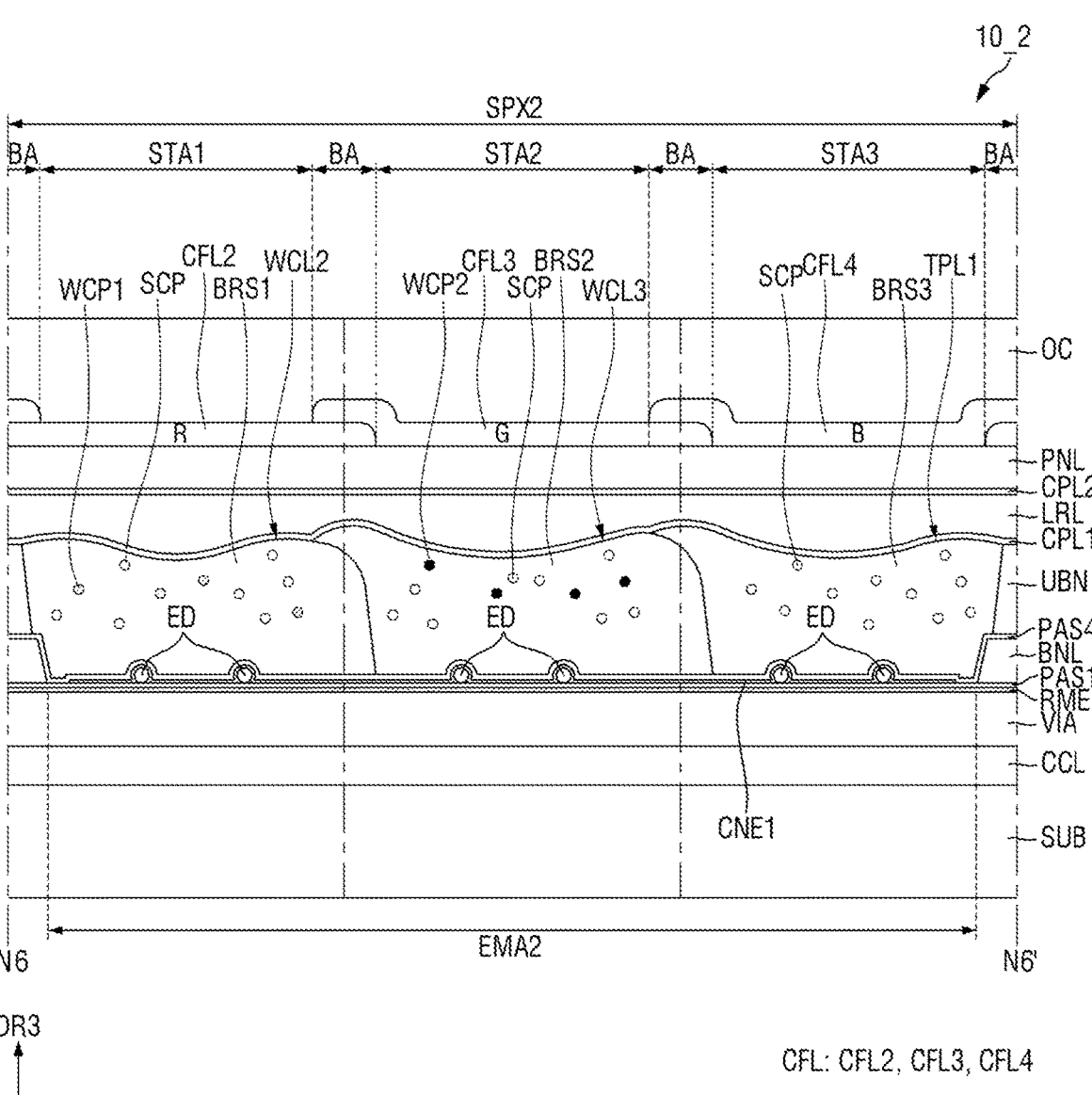
FIG. 19 is a cross-sectional view taken along the line N6-N6' of FIG. 18.

FIG. 18 is a plan view illustrating wavelength conversion layers and light transmitting layers disposed in one pixel of a display device according to another embodiment, and FIG. 19 is a cross-sectional view taken along the line N6-N6' of FIG. 18.

Referring to FIGS. 18 and 19, in a display device 10_2 according to one embodiment, the second wavelength conversion layer WCL2, the third wavelength conversion layer WCL3, and the first light transmitting layer TPL1 of the second sub-pixel SPX2 may be arranged to partially overlap each other. The second wavelength conversion layer WCL2, the third wavelength conversion layer WCL3, and the first light transmitting layer TPL1, which are the color control structures disposed in the second sub-pixel SPX2, may be arranged to fill the area surrounded, in a plan view, by the bank layer BNL and the upper bank layer UBN. The second wavelength conversion layer WCL2, the third wavelength conversion layer WCL3, and the first light transmitting layer TPL1 may be disposed to partially overlap other adjacent color control structures. For example, the second wavelength conversion layer WCL2 may be disposed to overlap the third wavelength conversion layer WCL3, and the third wavelength conversion layer WCL3 may be disposed to overlap the second wavelength conversion layer WCL2 and the first light transmitting layer TPL1. In an embodiment in which the second wavelength conversion layer WCL2, the third wavelength conversion layer WCL3, and the first light transmitting layers TPL1 are sequentially formed, the second wavelength conversion layer WCL2 may be disposed relatively at a lowermost portion, and the first light transmitting layer TPL1 may be disposed relatively at an uppermost portion. Because the second wavelength conversion layer WCL2, the third wavelength conversion layer WCL3, and the first light transmitting layer TPL1 are disposed to partially overlap each other, the first capping layer CPL1 disposed to cover them may not be in direct contact with the fourth insulating layer PAS4 under the color control structures.

The color filter layers CFL disposed in the second sub-pixel SPX2 may be disposed to partially overlap each other similar to the color control structures, and the color patterns CP1, CP2, and CP3 may not be disposed at the portions at where they overlap. For example, the second color filter layer CFL2 disposed on the second wavelength conversion layer WCL2 and the third color filter layer CFL3 disposed on the third wavelength conversion layer WCL3 may be disposed to partially overlap each other. The third color filter layer CFL3 disposed on the third wavelength conversion layer WCL3 and the fourth color filter layer CFL4 disposed on the first light transmitting layer TPL1 may be disposed to partially overlap each other. The color patterns CP1, CP2, and CP3 may not be disposed on the portions at where different color filter layers CFL overlap.

In the second sub-pixel SPX2, different color control structures are disposed so that different color light may be emitted simultaneously or mixed light thereof may be emitted. The second wavelength conversion layer WCL2, the third wavelength conversion layer WCL3, and the first light transmitting layer TPL1, which are the structures that facilitate emission of mixed light of red light, green light, and blue light from the second light transmitting area TA2 of the second sub-pixel SPX2, may be disposed to partially overlap each other.

Figure 20:
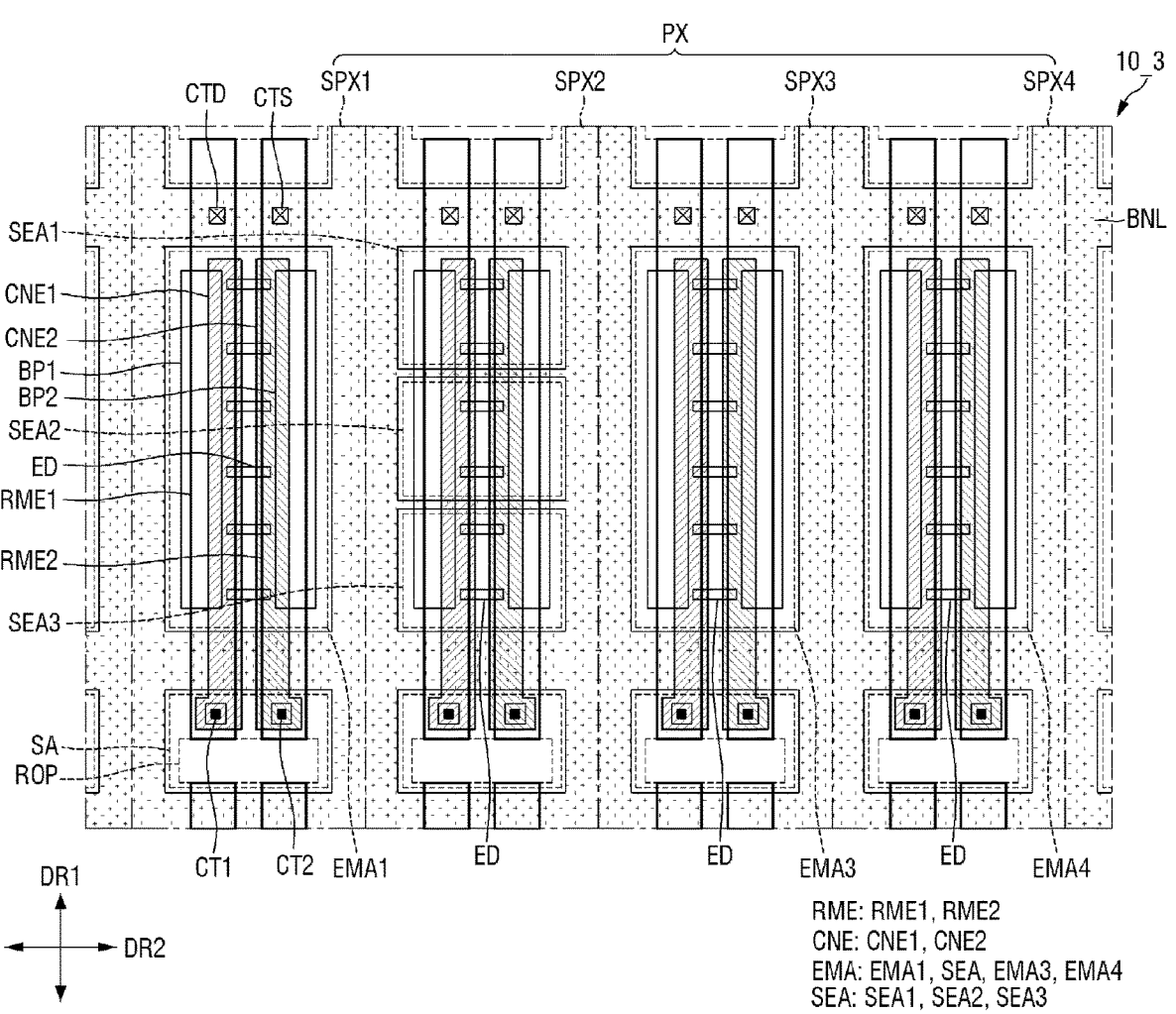
FIG. 20 is a plan view illustrating a pixel of a display device according to another embodiment.
Figure 21:
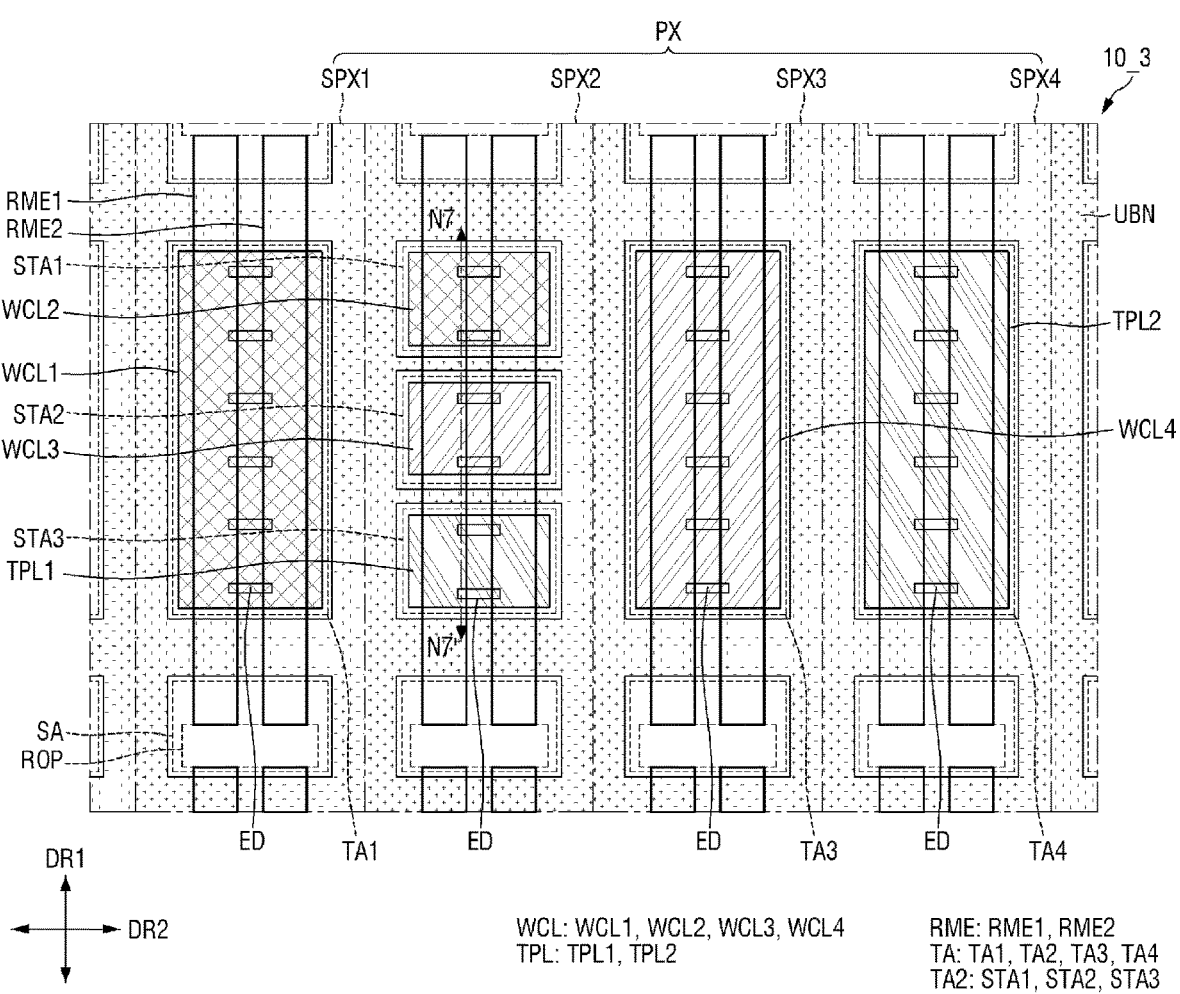
FIG. 21 is a plan view illustrating wavelength conversion layers and light transmitting layers disposed in one pixel shown in FIG. 20.
Figure 22:
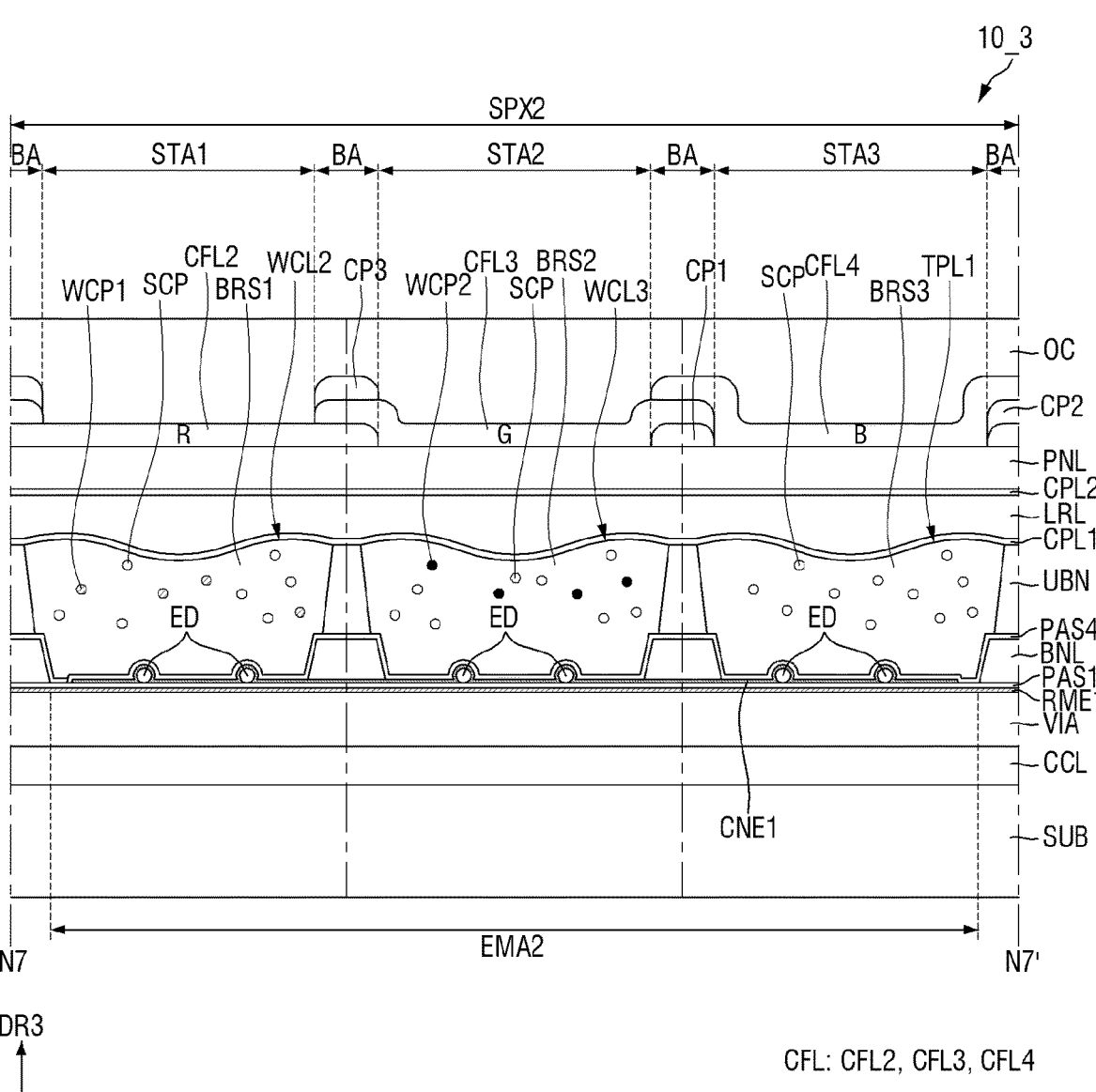
FIG. 22 is a cross-sectional view taken along the line N7-N7' in FIG. 21.

FIG. 20 is a plan view illustrating a pixel of a display device according to another embodiment, FIG. 21 is a plan view illustrating wavelength conversion layers and light transmitting layers disposed in one pixel shown in FIG. 20, and FIG. 22 is a cross-sectional view taken along the line N7-N7' in FIG. 21.

Referring to FIGS. 20 to 22, in a display device 10_3 according to one embodiment, the bank layer BNL may be disposed to divide the second emission area EMA2 of the second sub-pixel SPX2 into a plurality of areas, and the upper bank layer UBN may be disposed to divide the plurality of sub light transmitting areas STA1, STA2, and STA3. In the second sub-pixel SPX2, the first electrode RME1 and the second electrode RME2 may be disposed across the plurality of sub light transmitting areas STA1, STA2, and STA3 in the first direction DR1 regardless of the areas divided by the bank layer BNL, and the light emitting elements ED may be distributed and disposed in the plurality of areas divided by the bank layer BNL. However, the plurality of light emitting elements ED may be electrically connected to the same first and second electrodes RME1 and RME2 or the same first and second connection electrodes CNE1 and CNE2.

The second light transmitting area TA2 of the second sub-pixel SPX2 may include the plurality of sub light transmitting areas STA1, STA2, and STA3 divided by the upper bank layer UBN. The second wavelength conversion layer WCL2, the third wavelength conversion layer WCL3, and the first light transmitting layer TPL1 may be respectively disposed in the areas divided by the upper bank layer UBN. The second color filter layer CFL2, the third color filter layer CFL3, and the fourth color filter layer CFL4 of the second sub-pixel SPX2 may be disposed on the second wavelength conversion layer WCL2, the third wavelength conversion layer WCL3, and the first light transmitting layer TPL1, respectively. The second color filter layer CFL2, the third color filter layer CFL3, and the fourth color filter layer CFL4 may be disposed to extend to an area overlapping the upper bank layer UBN, and different adjacent color filter layers CFL may overlap each other. Further, the color patterns CP1, CP2, and CP3 containing colorants different from those of two different color filter layers CFL may be disposed at the portions where the two different color filter layers CFL overlap.

The second sub-pixel SPX2 of the display device 10_3 may include different color control structures disposed in the areas divided by the upper bank layer UBN, and the light emitted from the light emitting elements ED may be simultaneously emitted from the sub light transmitting areas STA1, STA2, and STA3 of the second sub-pixel SPX2 through the color control structures and the color filter layer CFL. In the second light transmitting area TA2 of the second sub-pixel SPX2, different color light may be simultaneously emitted from different sub light transmitting areas STA1, STA2, and STA3, and the second sub-pixel SPX2 may display a mixed color light.

Figure 23:
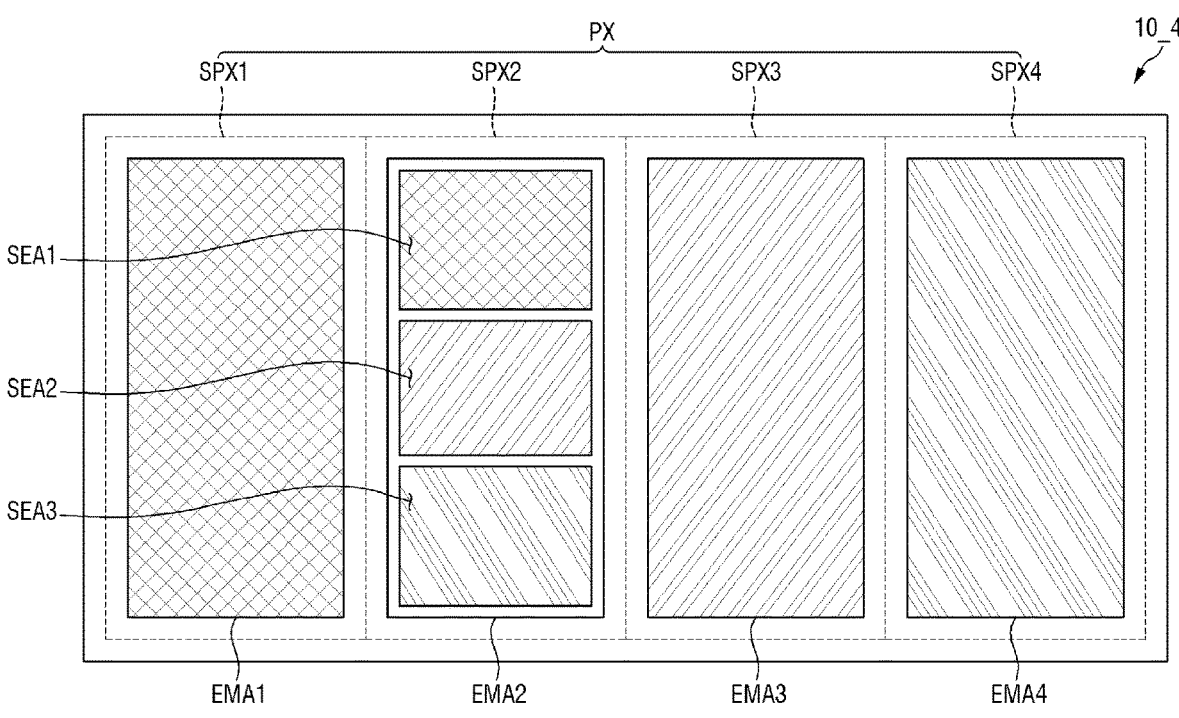
FIG. 23 is a plan view schematically illustrating emission areas of one pixel of a display device according to another embodiment.
Figure 24:
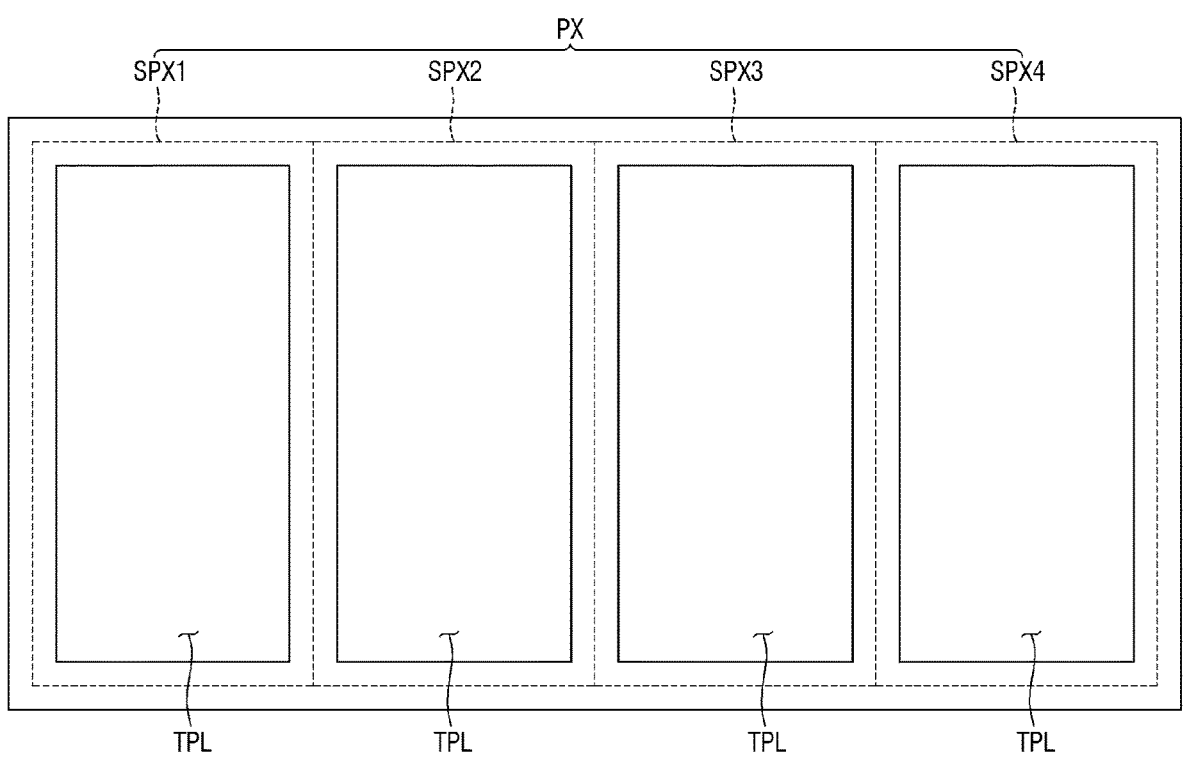
FIG. 24 is a plan view illustrating schematic arrangement of light transmitting layers disposed in one pixel of the display device shown in FIG. 23.

FIG. 23 is a plan view schematically illustrating emission areas disposed in one pixel of a display device according to another embodiment, and FIG. 24 is a plan view illustrating schematic arrangement of light transmitting layers disposed in one pixel of the display device shown in FIG. 23.

Referring to FIGS. 23 and 24, in a display device 10_4 according to one embodiment, light emitted from the emission areas EMA1, EMA2, EMA3, and EMA4 of the sub-pixels SPXn may have different colors or different central wavelength bands. The light emitted from the emission area EMA may be emitted from the light transmitting area TA through the light transmitting layers TPL disposed in the sub-pixel SPXn without color conversion or wavelength conversion. The sub-pixels SPXn of each pixel PX may emit different color light from the light transmitting areas TA.

For example, the first sub-pixel SPX1 may emit light of the first color, the third sub-pixel SPX3 may emit light of the second color, and the fourth sub-pixel SPX4 may emit light of the third color. The second sub-pixel SPX2 may emit each of the light of the first color, the light of the second color, and the light of the third color, or may emit light of the fourth color that is mixed light thereof. For example, the first color may be red, the second color may be green, and the third color may be blue. The sub-pixels SPXn may include the light emitting elements ED emitting different color light, and the emission areas EMA and the light transmitting areas TA may emit different color light.

In accordance with one embodiment, the light emitting element ED disposed in the first sub-pixel SPX1 may emit red light of the first color, and the light may be emitted as the red light from the first light transmitting area TA1 through the light transmitting layer TPL disposed in the first sub-pixel SPX1. The red light of the first color may be emitted from the first emission area EMA1 of the first sub-pixel SPX1, and the red light of the first color may also be emitted from the first light transmitting area TA1.

Similarly, the light emitting element ED disposed in the third sub-pixel SPX3 may emit green light of the second color, and the light may be emitted as the green light from the third light transmitting area TA3 through the light transmitting layer TPL disposed in the third sub-pixel SPX3. The light emitting element ED disposed in the fourth sub-pixel SPX4 may emit blue light of the third color, and the light may be emitted as the blue light from the fourth light transmitting area TA4 through the light transmitting layer TPL disposed in the fourth sub-pixel SPX4. The green light of the second color may be emitted from the third emission area EMA3 of the third sub-pixel SPX3, and the green light of the second color may also be emitted from the third light transmitting area TA3. The blue light of the third color may be emitted from the fourth emission area EMA4 of the fourth sub-pixel SPX4, and the blue light of the third color may also be emitted from the fourth light transmitting area TA4.

The plurality of light emitting elements ED emitting lights of different colors may be disposed in the second sub-pixel SPX2. Some of the light emitting elements ED of the second sub-pixel SPX2 may emit red light of the first color, some others thereof may emit green light of the second color, and yet some others thereof may emit blue light of the third color. The second emission area EMA2 of the second sub-pixel SPX2 may include a plurality of sub-emission areas SEA1, SEA2, and SEA3 in which different color light is emitted. The light emitting elements ED emitting red light of the first color may be disposed in the first sub-emission area SEA1 to emit red light, the light emitting elements ED emitting green light of the second color may be disposed in the second sub-emission area SEA2 to emit green light, and the light emitting elements ED emitting blue light of the third color may be disposed in the third sub-emission area SEA3 to emit blue light.

However, even when the second emission area EMA2 includes the plurality of sub-emission areas SEA1, SEA2, and SEA3, the sub-emission areas SEA1, SEA2, and SEA3 may not be distinguished by physical interfaces. The plurality of sub-emission areas SEA1, SEA2, and SEA3 illustrated in the drawing, which are the areas distinguished to correspond to different electrodes (shown in, e.g., FIGS. 25 and 26) disposed in the second sub-pixel SPX2, to be described later, may form one second emission area EMA2 without being physically distinguished in the second sub-pixel SPX2 of the display device 10_4. However, the disclosure is not limited thereto, and the second emission area EMA2 may include the sub-emission areas SEA1, SEA2, and SEA3 that are physically spaced apart from each other depending on the structure of the bank layer BNL disposed in the second sub-pixel SPX2.

In the display device 10_4, each of the pixels PX may include, in addition to the sub-pixels (e.g., the first sub-pixel SPX1, the third sub-pixel SPX3, and the fourth sub-pixel SPX4) emitting different color light, the sub-pixel (e.g., the second sub-pixel SPX2) emitting different color light simultaneously or emitting mixed light thereof. This may vary depending on the arrangement of the light emitting elements ED of the sub-pixels SPXn of the display device 10_4 and the arrangement of the color control structures.

Figure 25:
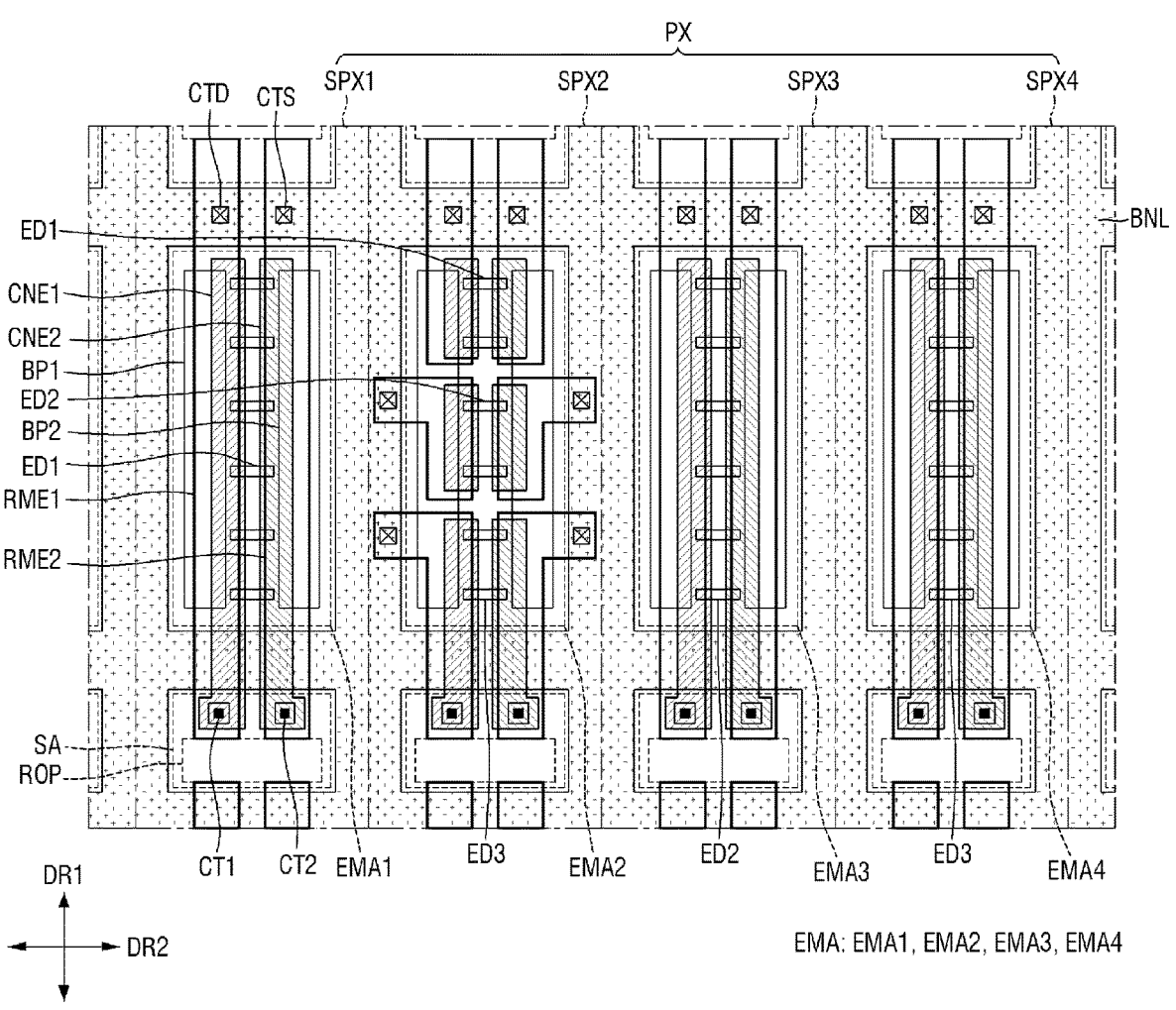
FIG. 25 is a plan view illustrating one pixel of a display device according to one embodiment.
Figure 26:
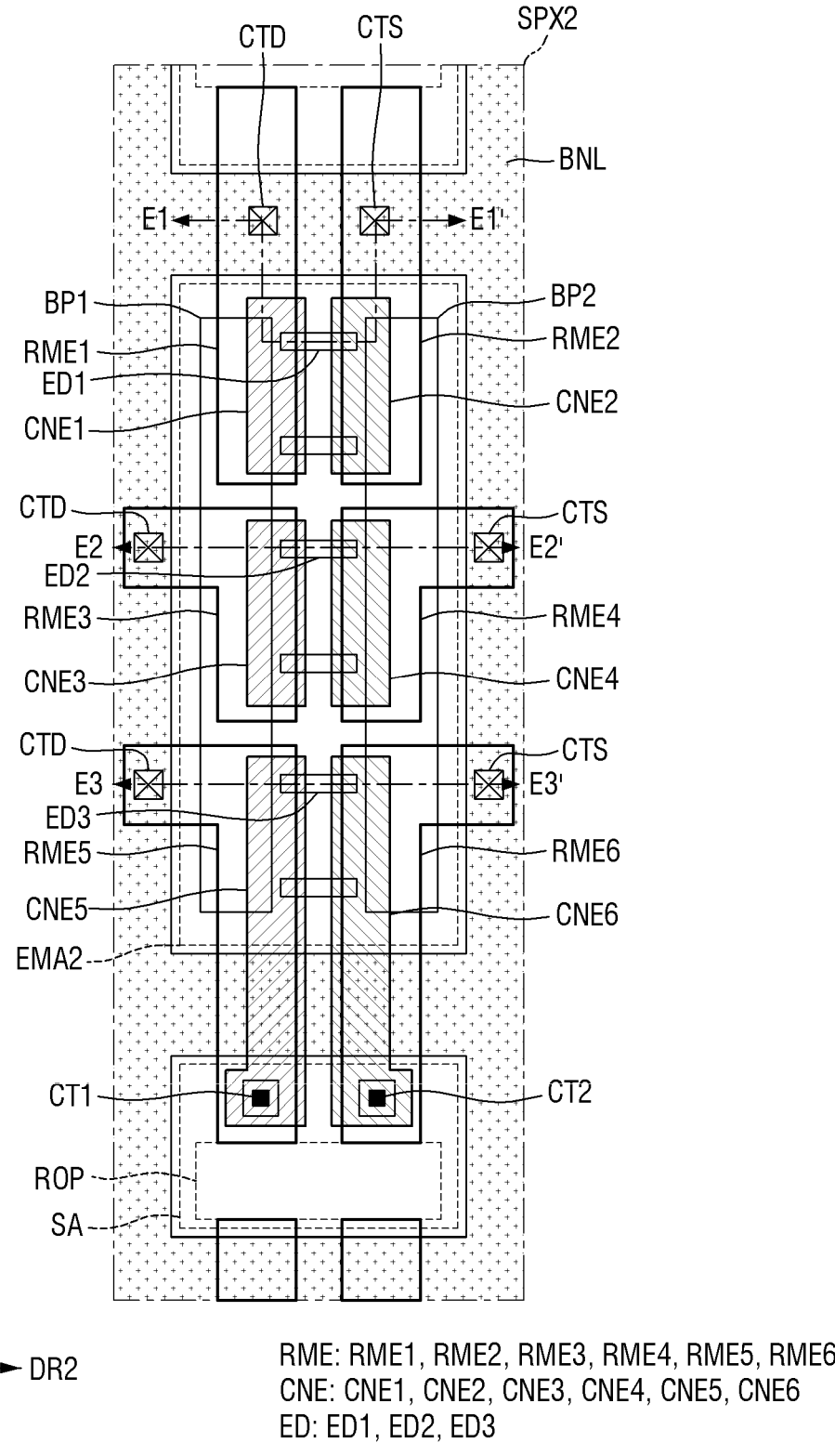
FIG. 26 is a plan view illustrating a second sub-pixel shown in FIG. 25.
Figure 27:
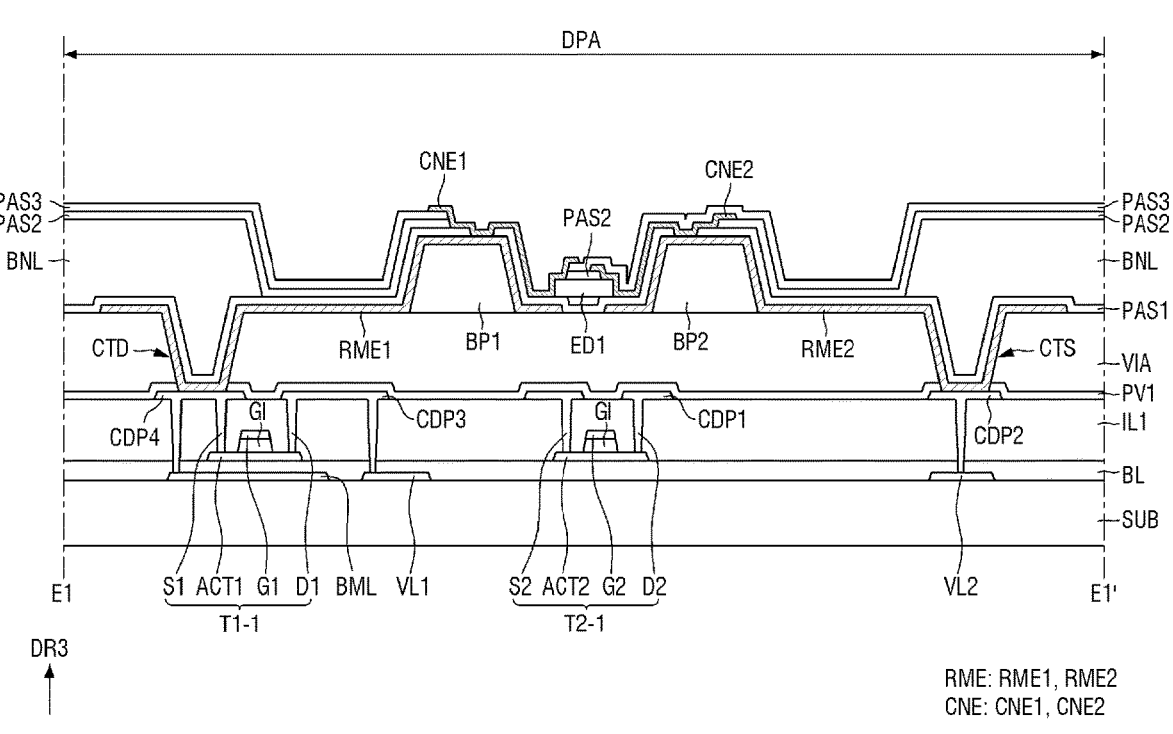
FIG. 27 is a cross-sectional view taken along the line E1-E1' of FIG. 26.
Figure 28:
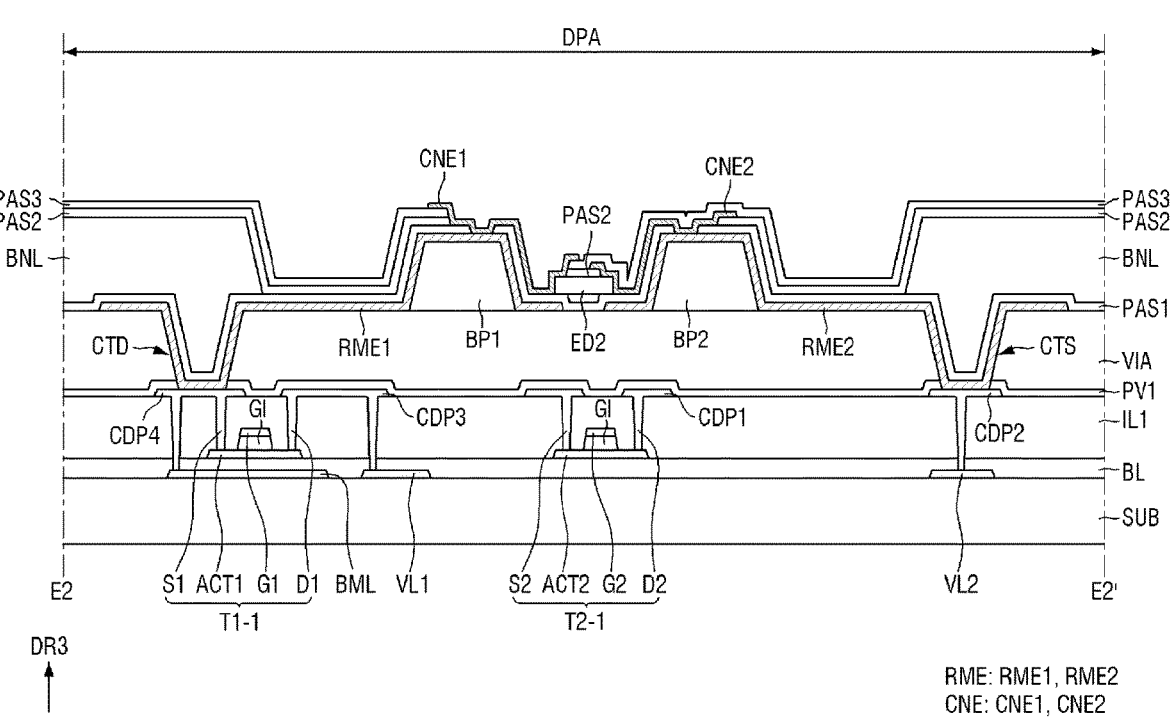
FIG. 28 is a cross-sectional view taken along the line E2-E2' of FIG. 26.
Figure 29:
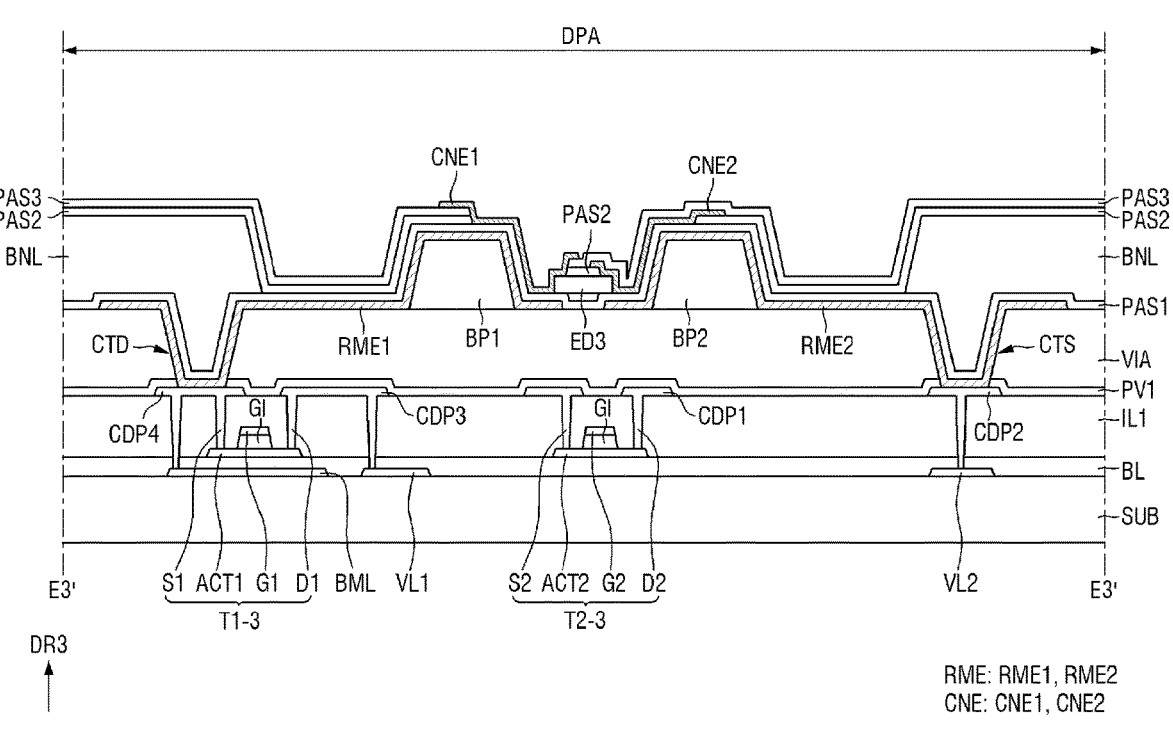
FIG. 29 is a cross-sectional view taken along the line E3-E3' in FIG. 26.

FIG. 25 is a plan view illustrating one pixel of a display device according to one embodiment, FIG. 26 is a plan view illustrating a second sub-pixel shown in FIG. 25, FIG. 27 is a cross-sectional view taken along the line E1-E1' of FIG. 26, FIG. 28 is a cross-sectional view taken along the line E2-E2' of FIG. 26, and FIG. 29 is a cross-sectional view taken along the line E3-E3' in FIG. 26. FIGS. 27 to 29 illustrate cross sections across both ends (e.g., opposite ends) of different light emitting elements ED (e.g., ED1, ED2, and ED3) disposed in the second sub-pixel SPX2.

The structure of electrodes disposed in one pixel of the display device 10_4 will be described with reference to FIGS. 25 to 29 in addition to FIGS. 23 and 24. In the following description, redundant description will be omitted while differences will be primarily described.

Each of the pixels PX of the display device 10_4 may include the plurality of sub-pixels SPXn. For example, one pixel PX may include the first sub-pixel SPX1, the second sub-pixel SPX2, the third sub-pixel SPX3, and the fourth sub-pixel SPX4. A description thereof is the same as described above.

Each sub-pixel SPXn of the display device 10 may include an emission area EMA and a non-emission area. The emission area EMA may be an area in which the light emitting element ED is disposed to emit light of a specific wavelength band. The non-emission area may be a region in which the light emitting element ED is not disposed and a region from which light is not emitted because light emitted from the light emitting element ED does not reach it. Each sub-pixel SPXn may further include a sub-region SA disposed in the non-emission area.

The display device 10_4 may include a plurality of electrodes RME (e.g., RME1, RME2, RME3, RME4, RME5, and RME6), the barrier walls BP1 and BP2, the bank layer BNL, and the light emitting elements ED (e.g., ED1, ED2, and ED3), and connection electrodes CNE (e.g., CNE1, CNE2, CNE3, CNE4, CNE5, and CNE6).

The plurality of barrier walls BP1 and BP2 may be disposed in the emission area EMA of each sub-pixel SPXn. The barrier walls BP1 and BP2 may extend in the first direction DR1 and may be disposed to be spaced apart from each other in the second direction DR2. For example, the barrier walls BP1 and BP2 may include a first barrier wall BP1 and a second barrier wall BP2 spaced apart from each other in the second direction DR2 in the emission area EMA of each sub-pixel SPXn. The plurality of light emitting elements ED may be arranged between the first barrier wall BP1 and the second barrier wall BP2.

The plurality of electrodes RME (e.g., RME1, RME2, RME3, RME4, RME5, and RME6) are disposed in each sub-pixel SPXn in a shape extending in one direction. Some of the plurality of electrodes RME may extend in the first direction DR1 to be disposed in the sub-region SA and the emission area EMA of the sub-pixel SPXn, and they may be disposed to be spaced apart from each other in the second direction DR2. Some other electrodes RME may be disposed to partially overlap the bank layer BNL in the emission area EMA of the sub-pixel SPXn.

In accordance with one embodiment, in the display device 10_4, each pixel PX may include the first electrode RME1 and the second electrode RME2 disposed in each of the first sub-pixel SPX1, the third sub-pixel SPX3, and the fourth sub-pixel SPX4. In the corresponding sub-pixels, the first electrode RME1 is located on the left side in the drawings with respect to the center of the emission area EMA, and the second electrode RME2 is located on the right side in the drawings with respect to the center of the emission area EMA while being spaced apart from the first electrode RME1 in the second direction DR2. A first electrode RME1 may be disposed on the first barrier wall BP1, and a second electrode RME2 may be disposed on the second barrier wall BP2. The first electrode RME1 and the second electrode RME2 may be partially arranged in the corresponding sub-pixel SPXn and the sub-region SA over the bank layer BNL. The first electrode RME1 and the second electrode RME2 of different sub-pixels SPXn may be spaced or separated from each other at the separation portion ROP disposed in the sub-region SA of any one sub-pixel SPXn.

The second sub-pixel SPX2 may include, in addition to the first electrode RME1 and the second electrode RME2, a third electrode RME3, a fourth electrode RME4, a fifth electrode RME5, and a sixth electrode RME6 spaced apart from them in the first direction DR1.

The first to sixth electrodes RME1, RME2, RME3, RME4, RME5, and RME6 disposed in the second sub-pixel SPX2 may have a relatively short length extending in the first direction DR1 compared to the electrodes RME disposed in other sub-pixels SPXn. The electrodes RME1, RME2, RME3, RME4, RME5, and RME6 of the second sub-pixel SPXn may be separated to be spaced apart from each other in the emission area EMA.

The first electrode RME1 and the second electrode RME2 may be disposed on the upper side of the emission area EMA to extend in the first direction DR1 and may be spaced apart from each other in the second direction DR2 to face each other. The first electrode RME1 and the second electrode RME2 may be disposed on the first barrier wall BP1 and the second barrier wall BP2, respectively, and may extend from the emission area EMA to the sub-region SA disposed on the upper side thereof. The first electrode RME1 and the second electrode RME2 may be electrically connected to the third conductive layer through the first electrode contact hole CTD and the second electrode contact hole CTS formed at the portions overlapping the bank layer BNL. The first electrode RME1 may be electrically connected to a first-first transistor T1_1 through the first electrode contact hole CTD, and the second electrode RME2 may be electrically connected to the second voltage line VL2 through the second electrode contact hole CTS.

The third electrode RME3 and the fourth electrode RME4 may be disposed at the central portion or the central area of the emission area EMA to be spaced apart from the first electrode RME1 and the second electrode RME2 in the first direction DR1, respectively. The third electrode RME3 and the fourth electrode RME4 may include portions extending in the first direction DR1 and portions that are bent therefrom in the second direction DR2 to overlap the bank layer BNL. The portions of the third electrode RME3 and the fourth electrode RME4 extending in the first direction DR1 may be disposed on the first barrier wall BP1 and the second barrier wall BP2, respectively, and may be electrically connected to the third conductive layer through the first electrode contact hole CTD and the second electrode contact hole CTS formed at the portions overlapping the bank layer BNL. The third electrode RME3 may be electrically connected to a first-second transistor T1_2 through the first electrode contact hole CTD, and the fourth electrode RME4 may be electrically connected to the second voltage line VL2 through the second electrode contact hole CTS.

The fifth electrode RME5 and the sixth electrode RME6 may be disposed on the lower side of the emission area EMA in the drawing to extend in the first direction DR1 and may be spaced apart from the third electrode RME3 and the fourth electrode RME4 in the first direction DR1, respectively. The fifth electrode RME5 and the sixth electrode RME6 may include portions extending in the first direction DR1 and portions that are bent therefrom in the second direction DR2 to overlap the bank layer BNL. The fifth electrode RME5 and the sixth electrode RME6 may be disposed on the first barrier wall BP1 and the second barrier wall BP2, respectively, and may extend from the emission area EMA to the sub-region SA disposed on the lower side thereof. The fifth electrode RME5 and the sixth electrode RME6 may be electrically connected to the third conductive layer through the first electrode contact hole CTD and the second electrode contact hole CTS formed at the portions overlapping the bank layer BNL. The fifth electrode RME5 may be electrically connected to a first-third transistors T1_3 through the first electrode contact hole CTD, and the sixth electrode RME6 may be electrically connected to the second voltage line VL2 through the second electrode contact hole CTS.

Each of the first sub-pixel SPX1, the third sub-pixel SPX3, and the fourth sub-pixel SPX4 may include a pair of electrodes (e.g., the first electrode RME1 and the second electrode RME2), and the plurality of light emitting elements ED disposed in the corresponding sub-pixel SPXn may be disposed on the same electrodes RME1 and RME2. On the other hand, the second sub-pixel SPX2 may include at least two or more pairs of electrodes (e.g., the first to sixth electrodes RME1, RME2, RME3, RME4, RME5, and RME6 forming three pairs of electrodes), and the plurality of light emitting elements ED disposed in the corresponding sub-pixel SPXn may be classified into the light emitting elements ED disposed on different electrodes RME1, RME2, RME3, RME4, RME5, and RME6. Further, in the second sub-pixel SPX2, different pairs of electrodes RME may be individually driven. In the first sub-pixel SPX1, the third sub-pixel SPX3, and the fourth sub-pixel SPX4, the two electrodes RME1 and RME2 may be electrically connected to the first transistor T1 and the second voltage line VL2, respectively, whereas different pairs of electrodes RME1, RME2, RME3, RME4, RME5, and RME6 of the second sub-pixel SPX2 may be electrically connected to different first transistors (e.g., the first-first to first-third transistors T1_1, T1_2, and T1_3). As will be described later, the light emitting elements ED disposed in the plurality of sub-pixels SPXn may emit different color light, and the light emitting elements ED emitting different color light may be disposed in the second sub-pixel SPX2. In the second sub-pixel SPX2, the light emitting elements ED emitting different color light may be disposed on different pairs of electrodes RME1, RME2, RME3, RME4, RME5, and RME6, and they may be individually driven. For example, the second sub-pixel SPX2 of the display device 10_4 may have a 9T3C pixel circuit structure.

The bank layer BNL may be disposed to surround the plurality of sub-pixels SPXn, the emission area EMA, and the sub-region SA. The bank layer BNL may be disposed at the boundary between the sub-pixels SPXn adjacent in the first direction DR1 and the second direction DR2 and may also be disposed at the boundary between the emission area EMA and the sub-region SA. The bank layer BNL may include portions extending in the first direction DR1 and the second direction DR2 in a plan view to be arranged in a grid pattern over the entire surface of the display area DPA.

The plurality of light emitting elements ED1, ED2, and ED3 may be disposed in the emission area EMA of each sub-pixel SPXn. The light emitting elements ED may be disposed between the barrier walls BP1 and BP2 and may be arranged to be spaced apart from each other in the first direction DR1.

In one embodiment, the light emitting elements ED1, ED2, and ED3 disposed in each sub-pixel SPXn may emit different color light, and the plurality of light emitting elements ED1, ED2, and ED3 emitting different color light may be disposed in the second sub-pixel SPX2.

For example, the first light emitting element ED1 emitting red light of the first color may be disposed in the first sub-pixel SPX1. The second light emitting element ED2 emitting green light of the second color may be disposed in the third sub-pixel SPX3, and the third light emitting element ED3 emitting blue light of the third color may be disposed in the fourth sub-pixel SPX4. The first to third light emitting elements ED1, ED2, and ED3 disposed in each of the first sub-pixel SPX1, the third sub-pixel SPX3, and the fourth sub-pixel SPX4 may be disposed on the first electrode RME1 and the second electrode RME2 spaced apart from each other.

The first light emitting element ED1 emitting red light of the first color, the second light emitting element ED2 emitting green light of the second color, and the third light emitting element ED3 emitting blue light of the third color may be disposed in the second sub-pixel SPX2. The first light emitting element ED1 may be disposed on the first electrode RME1 and the second electrode RME2, the second light emitting element ED2 may be disposed on the third electrode RME3 and the fourth electrode RME4, and the third light emitting element ED3 may be disposed on the fifth electrode RME5 and the sixth electrode RME6. The first light emitting element ED1, the second light emitting element ED2, and the third light emitting element ED3 of the second sub-pixel SPX2 may be disposed on different pairs of electrodes RME1, RME2, RME3, RME4, RME5, and RME6 and may be disposed to be spaced apart from each other in the first direction DR1.

The plurality of first to third light emitting elements ED1, ED2, and ED3 disposed in the first sub-pixel SPX1, the third sub-pixel SPX3, and the fourth sub-pixel SPX4 may be electrically connected to the same electrode RME in the corresponding sub-pixels SPXn and may be driven or emit light together with the same type of light emitting elements ED disposed in the corresponding sub-pixel SPXn. On the other hand, the plurality of first to third light emitting elements ED1, ED2, and ED3 disposed in the second sub-pixel SPX2 may be electrically connected to different electrodes RME in the corresponding sub-pixel SPXn and different light emitting elements ED disposed in the corresponding sub-pixel SPXn may be individually driven or emit light.

The red light of the first color emitted by the first light emitting element ED1 may be emitted from the first emission area EMA1 of the first sub-pixel SPX1, the green light of the second color emitted by the second light emitting element ED2 may be emitted from the third emission area EMA3 of the third sub-pixel SPX3, and the blue light of the third light emitted by the third light emitting element ED3 may be emitted from the fourth emission area EMA4 of the fourth sub-pixel SPX4. In the second emission area EMA2 of the second sub-pixel SPX2, the red light, the green light, and the blue light emitted by the first to third light emitting elements ED1, ED2 and ED3 may be simultaneously emitted, or white light that is mixed light thereof may be emitted. In the display device 10_4, the sub-pixels SPXn may include different light emitting elements ED to emit different color light.

The plurality of connection electrodes CNE (e.g., CNE1, CNE2, CNE3, CNE4, CNE5, and CNE6) may be disposed on the plurality of electrodes RME and the barrier walls BP1 and BP2. The connection electrodes CNE may be in contact with the light emitting element ED and may be electrically connected to the electrode RME or the conductive layer disposed thereunder.

The connection electrode CNE may include the first connection electrode CNE1 and the second connection electrode CNE2 disposed in the first sub-pixel SPX1, the third sub-pixel SPX3, and the fourth sub-pixel SPX4. The first connection electrode CNE1 may have a shape extending in the first direction DR1 and may be disposed on the first electrode RME1 or the first barrier wall BP1. The first connection electrode CNE1 may be disposed from the emission area EMA up to the sub-region SA over the bank layer BNL. The second connection electrode CNE2 may have a shape extending in the first direction DR1 and may be disposed on the second electrode RME2 or the second barrier wall BP2. The second connection electrode CNE2 may be disposed from the emission area EMA up to the sub-region SA over the bank layer BNL.

The connection electrode CNE may include first to sixth connection electrodes CNE1, CNE2, CNE3, CNE4, CNE5, and CNE6 disposed in the second sub-pixel SPX2. The first connection electrode CNE1 of the second sub-pixel SPX2 may be disposed on the first electrode RME1 to be in contact with the first light emitting element ED1 and may be electrically connected to the first electrode RME1. The second connection electrode CNE2 may be disposed on the second electrode RME2 to be in contact with the second light emitting element ED2 and may be electrically connected to the second electrode RME2.

Similarly, the third connection electrode CNE3 and the fourth connection electrode CNE4 disposed in the second sub-pixel SPX2 may be respectively disposed on the third electrode RME3 and the fourth electrode RME4 to be in contact with the second light emitting element ED2 and may be electrically connected to the third electrode RME3 and the fourth electrode RME4. The fifth connection electrode CNE5 and the sixth connection electrode CNE6 disposed in the second sub-pixel SPX2 may be respectively disposed on the fifth electrode RME5 and the sixth electrode RME6 to be in contact with the third light emitting element ED3 and may be electrically connected to the fifth electrode RME5 and the sixth electrode RME6.

In the display device 10_4, the sub-pixels SPXn include different types of light emitting elements ED so that the color control structures disposed on the light emitting element ED may not convert the light emitted from the light emitting element ED into light of another color. The display device 10_4 according to one embodiment may include the plurality of light transmitting layers TPL disposed on different light emitting elements ED so that the sub-pixels SPXn may display different color light.

Figure 30:
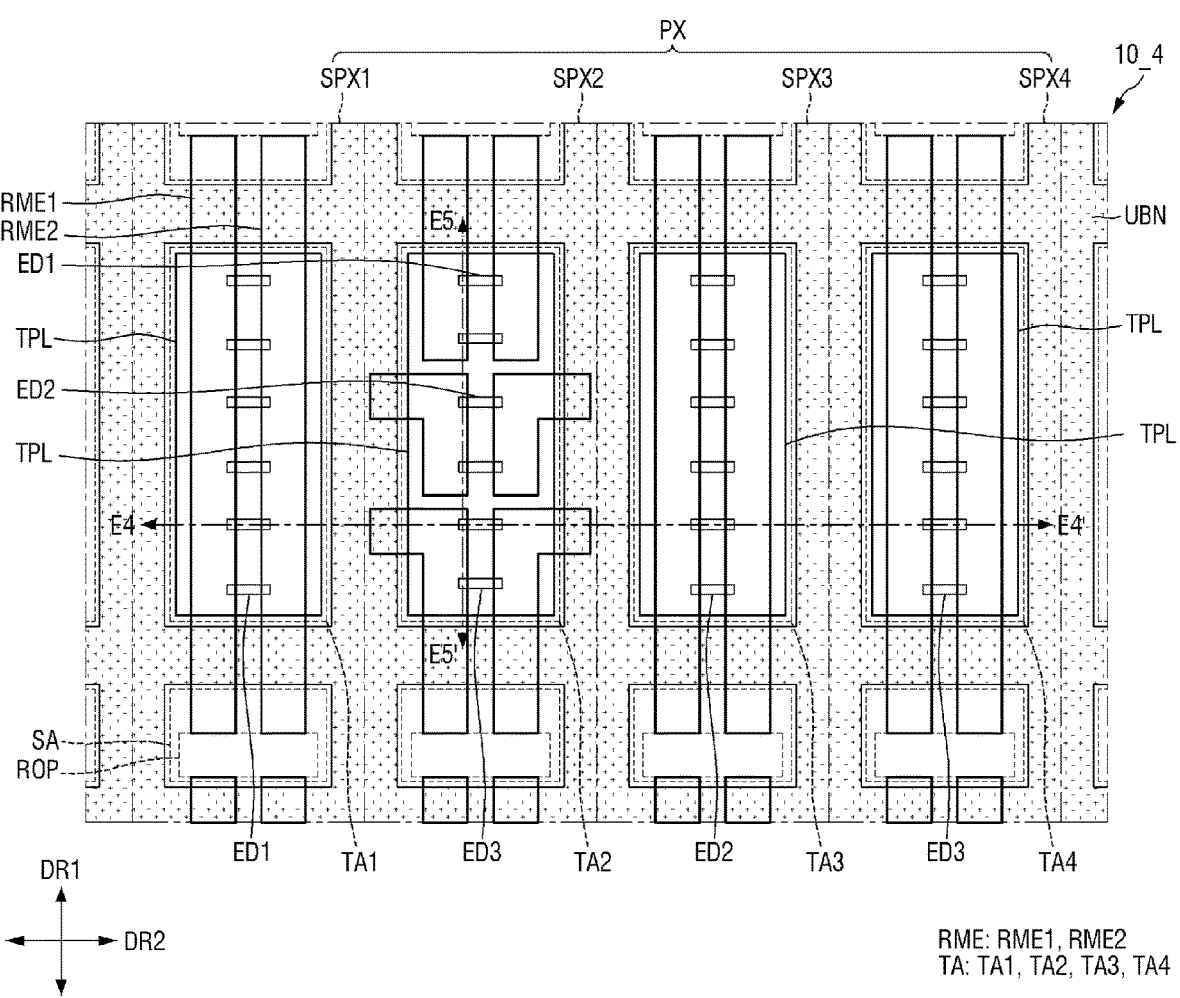
FIG. 30 is a plan view illustrating light transmitting layers disposed in one pixel shown in FIG. 25.
Figure 31:
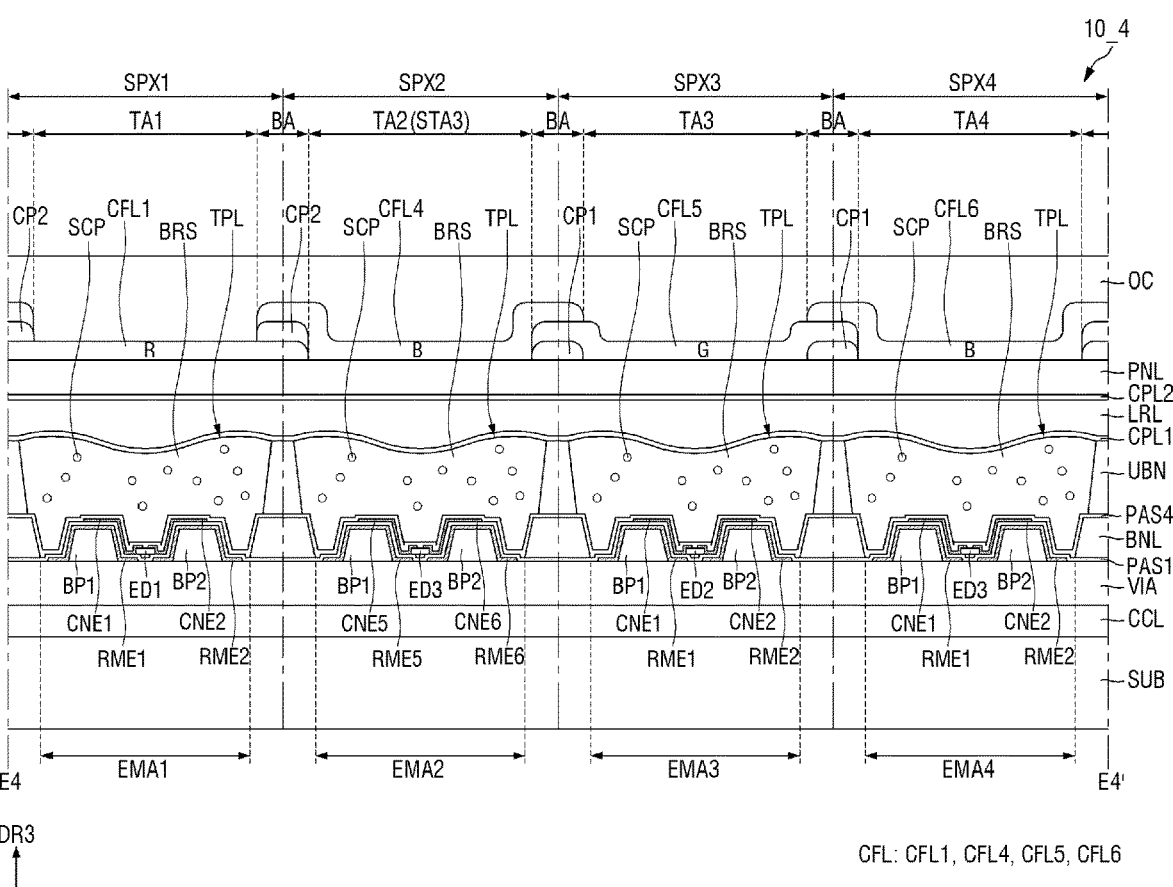
FIG. 31 is a cross-sectional view taken along the line E4-E4' in FIG. 30.
Figure 32:
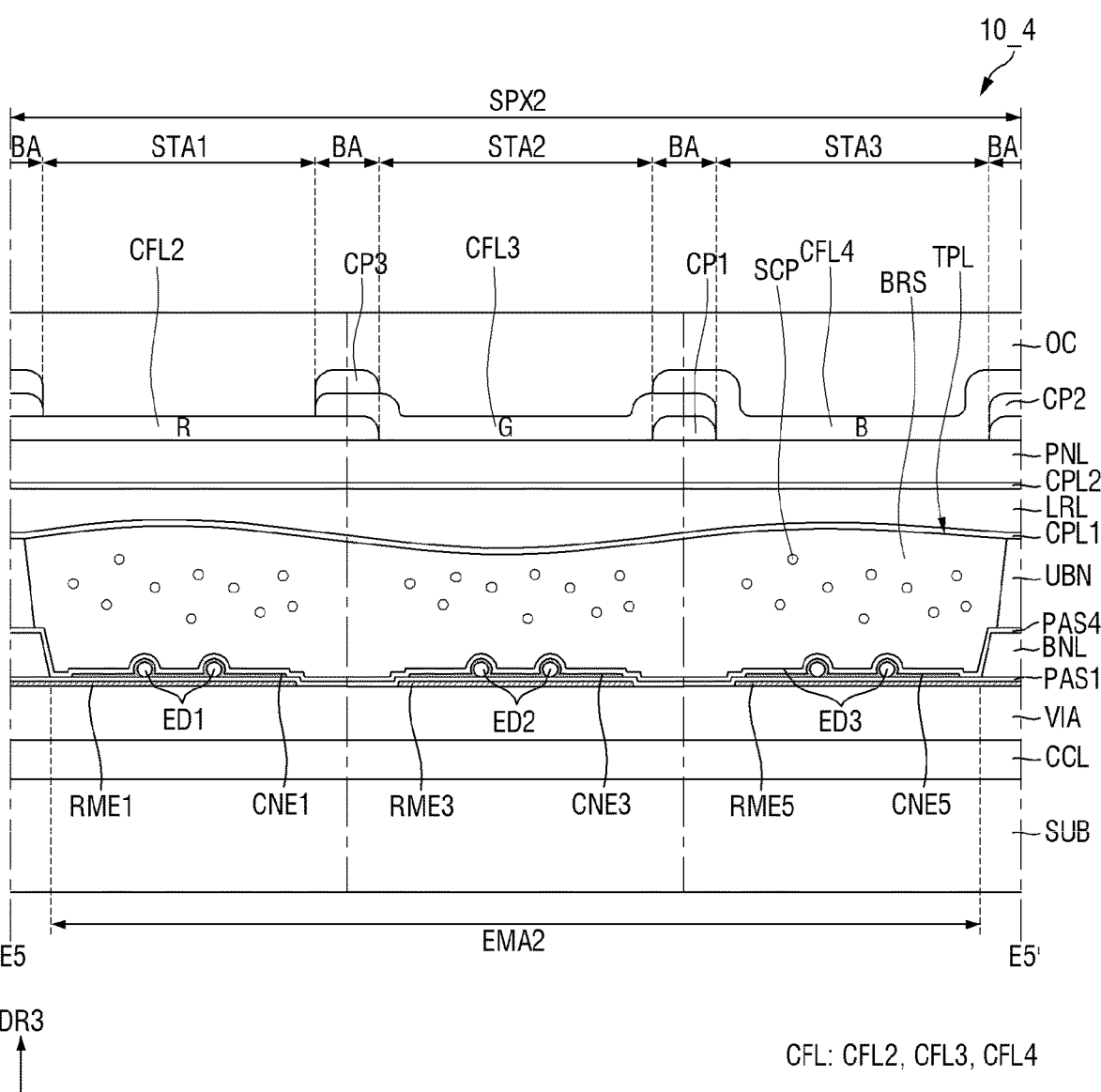
FIG. 32 is a cross-sectional view taken along the line E5-E5' of FIG. 30.

FIG. 30 is a plan view illustrating light transmitting layers disposed in one pixel shown in FIG. 25, FIG. 31 is a cross-sectional view taken along the line E4-E4' in FIG. 30, and FIG. 32 is a cross-sectional view taken along the line E5-E5' of FIG. 30. The structure of the light transmitting layers TPL disposed in one pixel of the display device 10_4 will be described with reference to FIGS. 30 to 32 in addition to FIGS. 23 and 24. In the following description, redundant description will be omitted and differences will be primarily described.

The display device 10_4 may include the plurality of light transmitting layers TPL disposed in the area surrounded, in a plan view, by the upper bank layer UBN of each sub-pixel SPXn. In each of the first sub-pixel SPX1, the second sub-pixel SPX2, the third sub-pixel SPX3, and the fourth sub-pixel SPX4, the light transmitting layer TPL may be disposed on the light emitting elements ED. The light transmitting layer TPL may include a scatterer SCP and a base resin BRS and may emit light emitted from the light emitting element ED in an upward direction without conversion. The first capping layer CPL1, the low refractive layer LRL, the second capping layer CPL2, the planarization layer PNL, the color filter layer CFL, and the overcoat layer OC are disposed on the light transmitting layer TPL. The detailed description thereof is the same as described above.

The light transmitting layer TPL disposed in the first sub-pixel SPX1 is disposed to overlap a plurality of first light emitting elements ED1. The red light of the first color emitted by the first light emitting element ED1 may be emitted through the light transmitting layer TPL and the first color filter layer CFL1, and the red light of the first color may be emitted or displayed from the first light transmitting area TA1 of the first sub-pixel SPX1. Similarly, the light transmitting layer TPL disposed in the third sub-pixel SPX3 is disposed to overlap a plurality of second light emitting elements ED2. The green light of the second color emitted by the second light emitting element ED2 may be emitted through the light transmitting layer TPL and the fifth color filter layer CFL5, and the green light of the second color may be emitted or displayed from the third light transmitting area TA3 of the third sub-pixel SPX3. The light transmitting layer TPL disposed in the fourth sub-pixel SPX4 is disposed to overlap a plurality of third light emitting elements ED3. The blue light of the third color emitted by the third light emitting element ED3 may be emitted through the light transmitting layer TPL and the sixth color filter layer CFL6, and the blue light of the third color may be emitted or displayed from the fourth light transmitting area TA4 of the fourth sub-pixel SPX4.

The light transmitting layer TPL disposed in the second sub-pixel SPX2 may overlap the plurality of first light emitting elements ED1, second light emitting elements ED2, and third light emitting elements ED3. Further, the light transmitting layer TPL may also overlap the plurality of electrodes RME1, RME2, RME3, RME4, RME5, and RME6 spaced apart from each other. The light emitted from the first to third light emitting elements ED1, ED2, and ED3 may be emitted through the light transmitting layer TPL and the second to fourth color filter layers CFL2, CFL3, and CFL4, respectively. In the second light transmitting area TA2 of the second sub-pixel SPX2, the red light of the first color, the green light of the second color, and the blue light of the third color may be emitted simultaneously, or mixed light thereof may be emitted.

Different the embodiment shown in FIGS. 9 to 14, the display device 10_4 according to one embodiment may include the light emitting elements ED emitting lights of different colors in the sub-pixels SPXn with the light transmitting layer TPL disposed thereon. However, similar to the above-described embodiment, the display device 10_4 may include the first type sub-pixels (e.g., the first sub-pixel SPX1, the third sub-pixel SPX3, and the fourth sub-pixel SPX4) emitting any one of the light of the first color, the light of the second color, and the light of the third color, and the second type sub-pixel (e.g., the second sub-pixel SPX2) simultaneously emitting the light of the first color, the light of the second color, and the light of the third color or emitting mixed light thereof.

Figure 33:
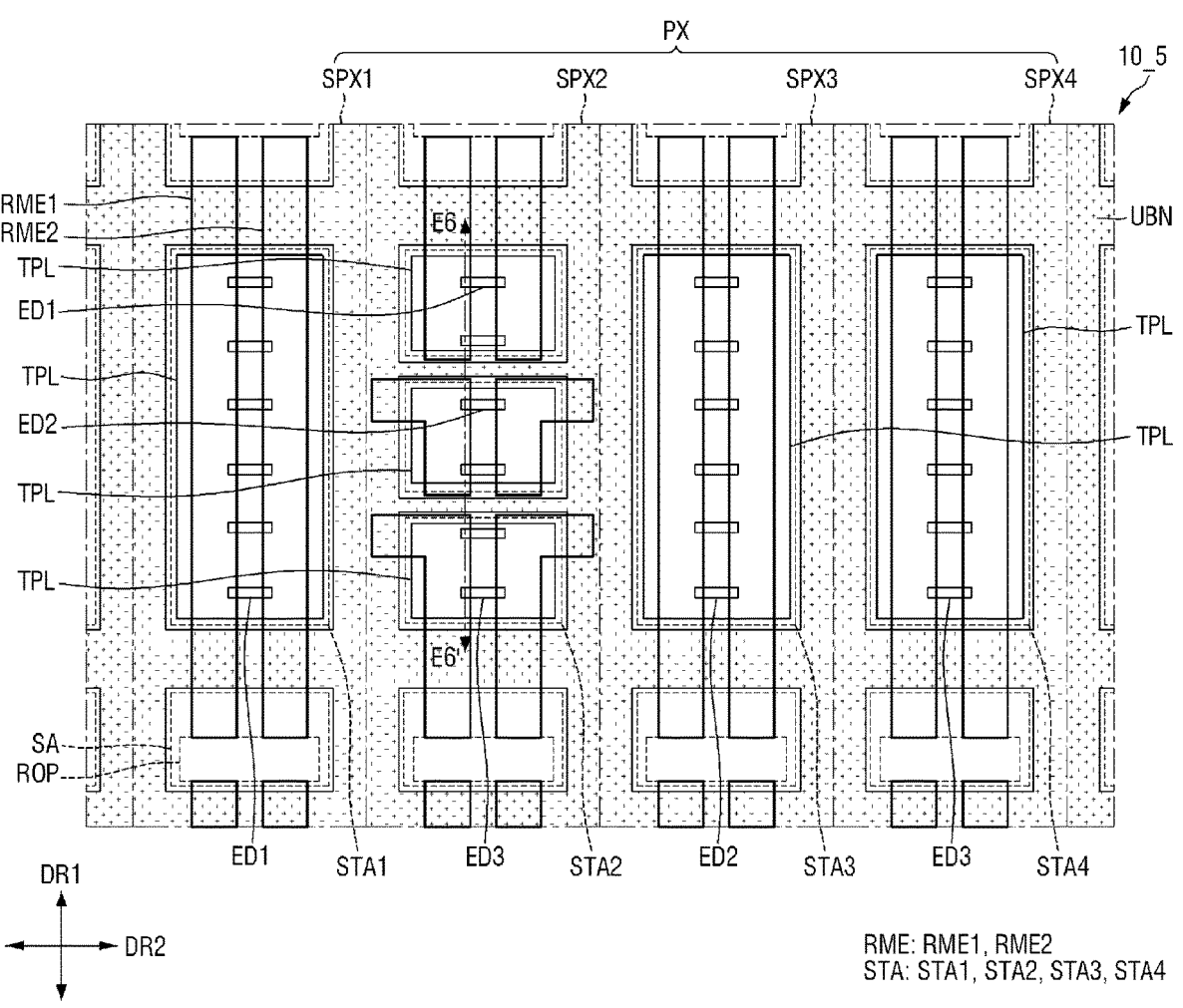
FIG. 33 is a plan view illustrating light transmitting layers disposed in one pixel of a display device according to another embodiment.
Figure 34:
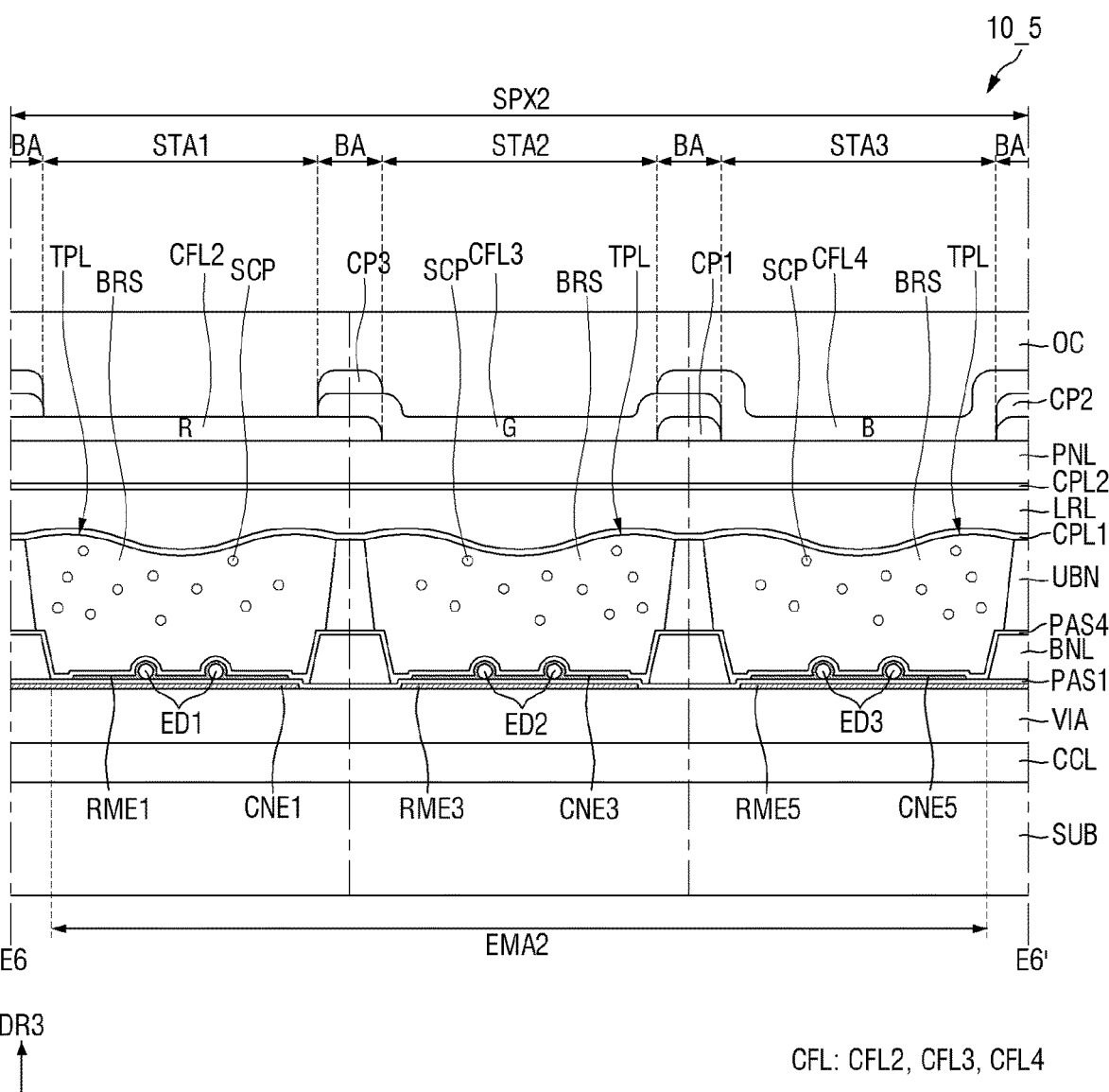
FIG. 34 is a cross-sectional view taken along the line E6-E6' of FIG. 33.

FIG. 33 is a plan view illustrating light transmitting layers disposed in one pixel of a display device according to another embodiment, and FIG. 34 is a cross-sectional view taken along the line E6-E6' of FIG. 33.

Referring to FIGS. 33 and 34, in a display device 10_5 according to one embodiment, the bank layer BNL may be disposed to divide the second emission area EMA2 of the second sub-pixel SPX2 into a plurality of areas, and the upper bank layer UBN may be disposed to distinguish the plurality of sub light transmitting areas STA1, STA2, and STA3. In the second sub-pixel SPX2, different pairs of electrodes RME1, RME2, RME3, RME4, RME5, and RME6 may be disposed to correspond to the plurality of sub-emission areas SEA1, SEA2, and SEA3 distinguished by the bank layer BNL. Different first to third light emitting elements ED1, ED2, and ED3 and the connection electrodes CNE may also be disposed to correspond to the plurality of sub-emission areas SEA1, SEA2, and SEA3 distinguished by the bank layer BNL.

The second light transmitting area TA2 of the second sub-pixel SPX2 may include the plurality of sub light transmitting areas STA1, STA2, and STA3 distinguished by the upper bank layer UBN. In the second sub-pixel SPX2, the light transmitting layers TPL may be disposed in the plurality of areas distinguished by the upper bank layer UBN. The light transmitting layers TPL disposed in the second sub-pixel SPX2 may be spaced apart from each other with the upper bank layer UBN interposed therebetween.

The display device 10_5 may include the light emitting devices ED emitting different color light in the sub-pixels SPXn, and the structure of the bank layer BNL and the upper bank layer UBN may be the same as that in the embodiment shown in FIG. 20. For example, the display device 10_5 may be understood as an embodiment in which aspects of the embodiment shown in FIG. 20 and aspects of the embodiment shown in FIGS. 25 to 32 are combined. Description of the specific structure of the display device 10_5 is substantially the same as those in the above-described embodiments and a detailed description thereof will be omitted.

Figure 35:
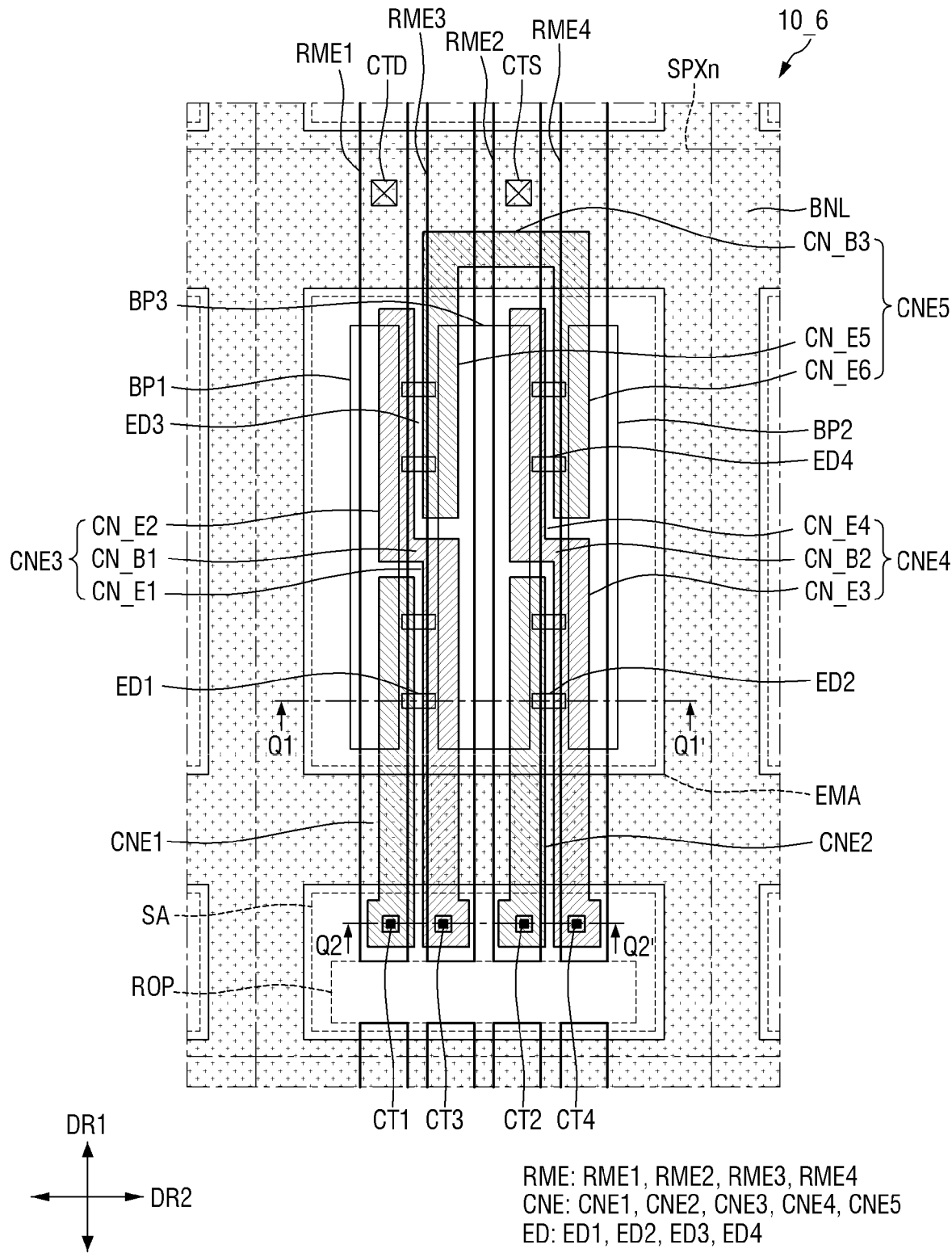
FIG. 35 is a plan view illustrating a sub-pixel of a display device according to another embodiment.
Figure 36:
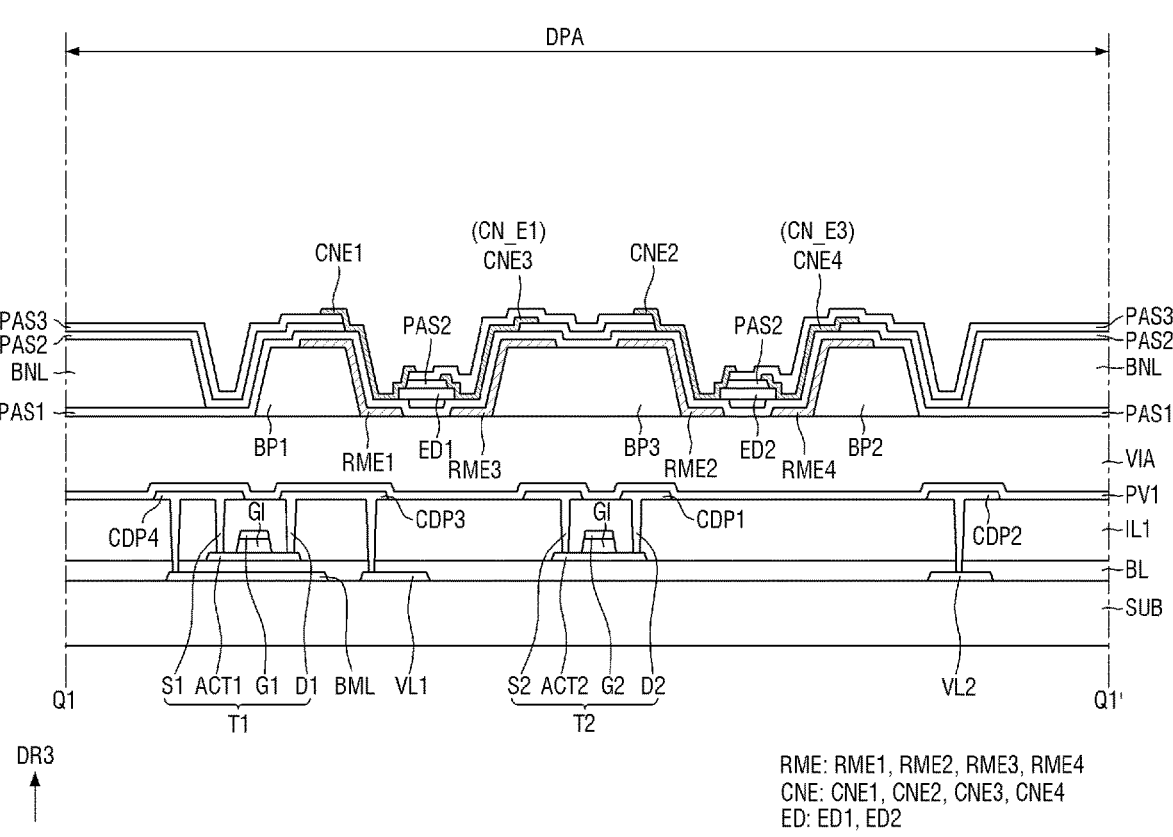
FIG. 36 is a cross-sectional view taken along the line Q1-Q1' of FIG. 35.
Figure 37:
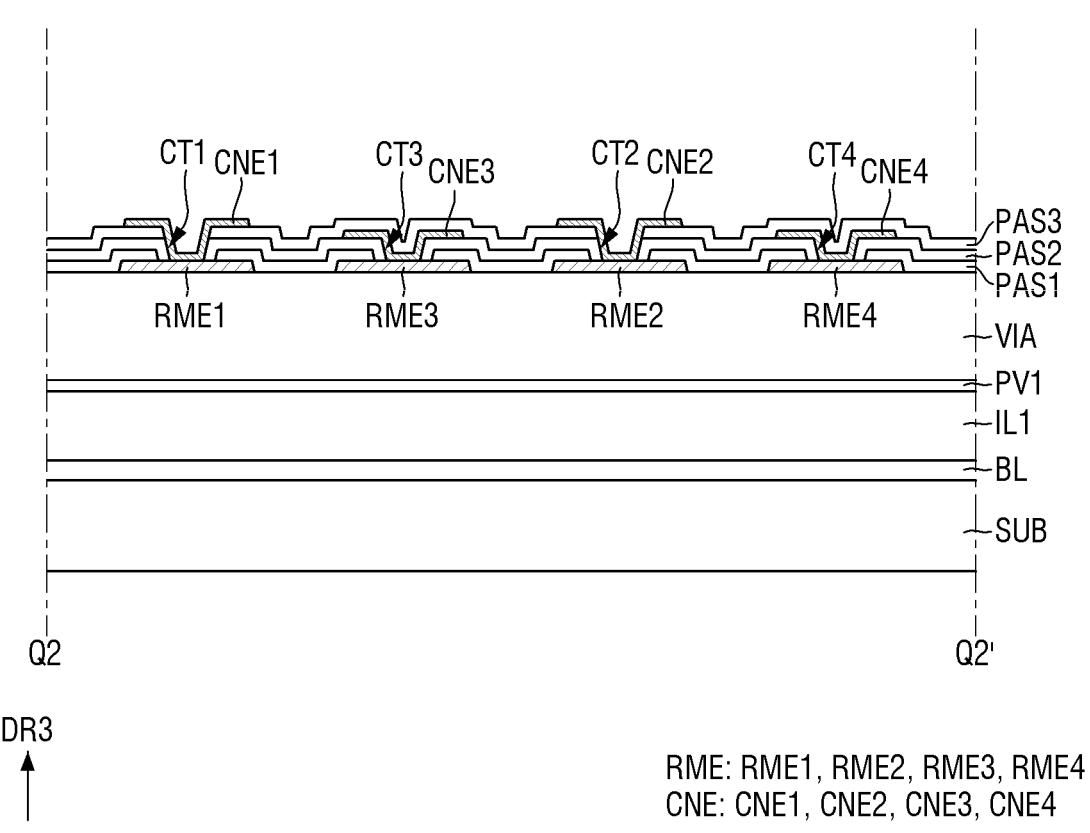
FIG. 37 is a cross-sectional view taken along the line Q2-Q2' of FIG. 35.

FIG. 35 is a plan view illustrating a sub-pixel of a display device according to another embodiment, FIG. 36 is a cross-sectional view taken along the line Q1-Q1' of FIG. 35, and FIG. 37 is a cross-sectional view taken along the line Q2-Q2' of FIG. 35.

FIG. 35 illustrates planar arrangement of electrodes RME (e.g., RME1, RME2, RME3, and RME4), barrier walls BP1, BP2, and BP3, the bank layer BNL, the plurality of light emitting elements ED, connection electrodes CNE (e.g., CNE1, CNE2, CNE3, CNE4, and CNE5) disposed in one pixel PX of a display device 10_6. FIG. 36 illustrates a cross section across both ends (e.g., opposite ends) of the light emitting elements ED (e.g., ED1, ED2, ED3, and ED4) disposed on different electrodes RME, and FIG. 37 illustrates a cross section across a plurality of contact portions CT1, CT2, CT3, and CT4.

Referring to FIGS. 35 to 37, the display device 10_6 may include a greater number of electrodes RME (e.g., RME1, RME2, RME3, and RME4), a greater number of barrier walls BP1, BP2, and BP3, a greater number of light emitting elements ED (e.g., ED1, ED2, ED3, and ED4), and a greater number of connection electrodes CNE (e.g., CNE1, CNE2, CNE3, CNE4, and CNE5). The display device 10_6 is different from the embodiment shown in FIG. 9 in that a greater number of electrodes and a greater number of light emitting elements are included in each sub-pixel SPXn. In the following description, redundant description will be omitted and differences will be primarily described.

The barrier walls BP1, BP2, and BP3 may further include a third barrier wall BP3 disposed between the first barrier wall BP1 and the second barrier wall BP2. The first barrier wall BP1 may be located on the left side in the drawings with respect to the center of the emission area EMA, the second barrier wall BP2 may be located on the right side in the drawings with respect to the center of the emission area EMA, and the third barrier wall BP3 may be located at the center of the emission area EMA. The width of the third barrier wall BP3 measured in the second direction DR2 may be greater than those of the first barrier wall BP1 and the second barrier wall BP2 measured in the second direction DR2. The gap between the barrier walls BP1, BP2, and BP3 in the second direction DR2 may be greater than the gap between the electrodes RME. The first barrier wall BP1 may be disposed to partially overlap the first electrode RME1, and the second barrier wall BP2 may be disposed to partially overlap the fourth electrode RME4. The third barrier wall BP3 may be disposed to partially overlap the second electrode RME2 and the third electrode RME3. At least parts of the electrodes RME may be arranged without overlapping the barrier walls BP1, BP2, and BP3.

The plurality of electrodes RME arranged for each sub-pixel SPXn may further include a third electrode RME3 and a fourth electrode RME4 in addition to a first electrode RME1 and a second electrode RME2.

The third electrode RME3 may be disposed between the first electrode RME1 and the second electrode RME2, and the fourth electrode RME4 may be spaced apart from the third electrode RME3 in the second direction DR2 with the second electrode RME2 interposed therebetween. The plurality of electrodes RME may be sequentially arranged in the order of the first electrode RME1, the third electrode RME3, the second electrode RME2, and the fourth electrode RME4 from the left side to the right side of the sub-pixel SPXn as shown in the drawings. The electrodes RME may face and be spaced apart from each other in the second direction DR2. The plurality of electrodes RME may be spaced apart from the electrodes RME of another sub-pixel SPXn adjacent in the first direction DR1 at the separation portion ROP of the sub-region SA.

From among the plurality of electrodes RME, the first electrode RME1 and the second electrode RME2 may be in contact with the first conductive pattern CDP1 and the second voltage line VL2 disposed thereunder through the electrode contact holes CTD and CTS disposed under the bank layer BNL, respectively, and the third electrode RME3 and the fourth electrode RME4 may not be in contact with the first conductive pattern CDP1 and the second voltage line VL2.

The first insulating layer PAS1 may be disposed in a structure similar to that in the above-described embodiments. The first insulating layer PAS1 may be disposed in the entire display area DPA and may cover the plurality of electrodes RME and the barrier walls BP1, BP2, and BP3.

The plurality of light emitting elements ED may be arranged between the barrier walls BP1, BP2, and BP3 or on different electrodes RME. Some of the light emitting elements ED may be arranged between the first barrier wall BP1 and the third barrier wall BP3, and some other light emitting elements ED may be arranged between the third barrier wall BP3 and the second barrier wall BP2. In accordance with one embodiment, the light emitting element ED may include a first light emitting element ED1 and a third light emitting element ED3 arranged between the first barrier wall BP1 and the third barrier wall BP3, and a second light emitting element ED2 and a fourth light emitting element ED4 arranged between the third barrier wall BP3 and the second barrier wall BP2. Each of the first light emitting element ED1 and the third light emitting element ED3 may be disposed above the first electrode RME1 and the third electrode RME3, and each of the second light emitting element ED2 and the fourth light emitting element ED4 may be disposed above the second electrode RME2 and the fourth electrode RME4. The first light emitting element ED1 and the second light emitting element ED2 may be arranged adjacent to the lower side of the emission area EMA of the corresponding sub-pixel SPXn in the drawings or adjacent to the sub-region SA, and the third light emitting element ED3 and the fourth light emitting element ED4 may be arranged adjacent to the upper side of the emission area EMA of the corresponding sub-pixel SPXn in the drawings.

However, the light emitting elements ED may not be classified according to the arrangement position in the emission area EMA but may be classified according to a connection relationship with the connection electrode CNE, which will be described later. Both ends of each light emitting element ED may be in contact with different connection electrodes CNE according to an arrangement method of the connection electrodes CNE. The light emitting elements ED may be classified into different types of light emitting elements ED according to the type of the connection electrode CNE in contact therewith.

The plurality of connection electrodes CNE may further include, in addition to the first connection electrode CNE1 disposed on the first electrode RME1, the second connection electrode CNE2 disposed on the second electrode RME2, a third connection electrode CNE3, a fourth connection electrode CNE4, and a fifth connection electrode CNE5 arranged across the plurality of electrodes RME.

Different from the embodiment shown in FIGS. 9 to 11, each of the first connection electrode CNE1 and the second connection electrode CNE2 may have a relatively short length extending in the first direction DR1. The first connection electrode CNE1 and the second connection electrode CNE2 may be arranged on the lower side with respect to the center of the emission area EMA. The first connection electrode CNE1 and the second connection electrode CNE2 may be disposed across the emission area EMA and the sub-region SA of the corresponding sub-pixel SPXn and may be in direct contact with the electrode RME through the contact portions CT1 and CT2 formed in the sub-region SA, respectively. The first connection electrode CNE1 may be in direct contact with the first electrode RME1 through the first contact portion CT1 penetrating the first insulating layer PAS1, the second insulating layer PAS2, and the third insulating layer PAS3 in the sub-region SA, and the second connection electrode CNE2 may be in direct contact with the second electrode RME2 through the second contact portion CT2 penetrating the first insulating layer PAS1, the second insulating layer PAS2, and the third insulating layer PAS3 in the sub-region SA.

The third connection electrode CNE3 may include a first extension portion CN_E1 disposed on the third electrode RME3, a second extension portion CN_E2 disposed on the first electrode RME1, and a first connection portion CN_B1 that connects (e.g., extends between) the first extension portion CN_E1 to the second extension portion CN_E2. The first extension portion CN_E1 may be spaced apart from the first connection electrode CNE1 in the second direction DR2, and the second extension portion CN_E2 may be spaced apart from the first connection electrode CNE1 in the first direction DR1. The first extension portion CN_E1 may be disposed on the lower side of the emission area EMA of the corresponding sub-pixel SPXn in the drawings, and the second extension portion CN_E2 may be disposed on the upper side of the emission area EMA in the drawings. The first extension portion CN_E1 and the second extension portion CN_E2 may be disposed in the emission area EMA. The first connection portion CN_B1 may be disposed across the first electrode RME1 and the third electrode RME3 at the central portion of the emission area EMA. The third connection electrode CNE3 may have a shape substantially extending in the first direction DR1 and may have a shape that is bent in the second direction DR2 and extends again in the first direction DR1.

The fourth connection electrode CNE4 may include a third extension portion CN_E3 disposed on the fourth electrode RME4, a fourth extension portion CN_E4 disposed on the second electrode RME2, and a second connection portion CN_B2 that connects (e.g., extends between) the third extension portion CN_E3 to the fourth extension portion CN_E4. The third extension portion CN_E3 may face and may be spaced apart from the second connection electrode CNE2 in the second direction DR2, and the fourth extension portion CN_E4 may be spaced apart from the second connection electrode CNE2 in the first direction DR1. The third extension portion CN_E3 may be disposed on the lower side of the emission area EMA of the corresponding sub-pixel SPXn in the drawings, and the fourth extension portion CN_E4 may be disposed on the upper side of the emission area EMA in the drawings. The third extension portion CN_E3 and the fourth extension portion CN_E4 may be disposed in the emission area EMA. The second connection portion CN_B2 may be disposed across the second electrode RME2 and the fourth electrode RME4 while being adjacent to the center of the emission area EMA. The fourth connection electrode CNE4 may have a shape substantially extending in the first direction DR1 and may have a shape that is bent in the second direction DR2 and extends again in the first direction DR1.

The fifth connection electrode CNE5 may include a fifth extension portion CN_E5 disposed on the third electrode RME3, a sixth extension portion CN_E6 disposed on the fourth electrode RME4, and a third connection portion CN_B3 that connects the fifth extension portion CN_E5 to the sixth extension portion CN_E6. The fifth extension portion CN_E5 may face and may be spaced apart from the second extension portion CN_E2 of the third connection electrode CNE3 in the second direction DR2, and the sixth extension portion CN_E6 may face and may be spaced apart from the fourth extension portion CN_E4 of the fourth connection electrode CNE4 in the second direction DR2. Each of the fifth extension portion CN_E5 and the sixth extension portion CN_E6 may be arranged on the upper side of the emission area EMA, and the third connection portion CN_B3 may be disposed across the third electrode RME3, the second electrode RME2, and the fourth electrode RME4. The fifth connection electrode CNE5 may be disposed to surround, in a plan view, the fourth extension portion CN_E4 of the fourth connection electrode CNE4.

The third connection electrode CNE3 may be in direct contact with the third electrode RME3 through the third contact portion CT3 penetrating the first insulating layer PAS1 and the second insulating layer PAS2 in the sub-region SA, and the fourth connection electrode CNE4 may be in direct contact with the fourth electrode RME4 through the fourth contact portion CT4 penetrating the first insulating layer PAS1 and the second insulating layer PAS2 in the sub-region SA.

However, the disclosure is not limited thereto. In some embodiments, in the display device 10, some of the connection electrodes CNE may be directly connected to the third conductive layer. For example, the first connection electrode CNE1 and the second connection electrode CNE2, which are first type connection electrodes, may be directly connected to the third conductive layer and may not be electrically connected to the electrode RME. A second type connection electrode and a third type connection electrode may not be electrically connected to the electrode RME and may only be connected to the light emitting elements ED.

The first connection electrode CNE1 and the second connection electrode CNE2 may be the first type connection electrodes connected to the electrodes RME1 and RME2 directly connected to the third conductive layer, respectively. The third connection electrode CNE3 and the fourth connection electrode CNE4 may be the second type connection electrodes connected to the electrodes RME3 and RME4 that are not connected to the third conductive layer. The fifth connection electrode CNE5 may be the third type connection electrode that is not connected to the electrode RME. The fifth connection electrode CNE5 may be in contact with the light emitting elements ED without being connected to the electrode RME and may constitute an electrical connection circuit of the light emitting elements ED together with other connection electrodes CNE.

The third connection electrode CNE3 and the fourth connection electrode CNE4, which are the second type connection electrodes, may be connection electrodes in which electrode extension portions extending in the first direction DR1 are not parallel to each other in the second direction DR2. The fifth connection electrode CNE5, which is the third type connection electrode, may be the connection electrode in which electrode extension portions extending in the first direction DR1 are parallel to each other in the second direction DR2. The third connection electrode CNE3 and the fourth connection electrode CNE4 may have a shape that is bent while extending in the first direction DR1, and the fifth connection electrode CNE5 may have a shape surrounding, in a plan view, a part of another connection electrode.

The plurality of light emitting elements ED may be classified into different light emitting elements ED depending on the connection electrodes CNE in contact with both ends of the light emitting elements ED to correspond to the arrangement structure of the connection electrodes CNE. The first light emitting element ED1 and the second light emitting element ED2 may have first ends in contact with the first type connection electrodes and second ends in contact with the second type connection electrodes. The first light emitting element ED1 may be in contact with the first connection electrode CNE1 and the third connection electrode CNE3, and the second light emitting element ED2 may be in contact with the second connection electrode CNE2 and the fourth connection electrode CNE4. The third light emitting element ED3 and the fourth light emitting element ED4 may have first ends in contact with the second type connection electrodes and second ends in contact with the third type connection electrodes. The third light emitting element ED3 may be in contact with the third connection electrode CNE3 and the fifth connection electrode CNE5, and the fourth light emitting element ED4 may be in contact with the fourth connection electrode CNE4 and the fifth connection electrode CNE5.

The plurality of light emitting elements ED may be connected in series through the plurality of connection electrodes CNE. Because the display device 10 according to this embodiment includes a greater number of light emitting elements ED for each sub-pixel SPXn and the light emitting elements ED are connected in series, the light emission amount per unit area may be further increased.

Figure 38:
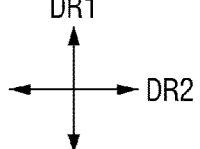
FIG. 38 is a plan view illustrating wavelength conversion layers and light transmitting layers disposed in the first sub-pixel and the second sub-pixel shown in FIG. 35.

FIG. 38 is a plan view illustrating wavelength conversion layers and light transmitting layers disposed in the first sub-pixel and the second sub-pixel shown in FIG. 35.

Referring to FIG. 38, in the display device 10_6, the color control structures TPL and WCL disposed in the first sub-pixel SPX1 and the second sub-pixel SPX2 may have different structures. As described above, the first wavelength conversion layer WCL1 may be disposed in the first sub-pixel SPX1, and the second wavelength conversion layer WCL2, the third wavelength conversion layer WCL3, and the first light transmitting layer TPL1 may be disposed in the second sub-pixel SPX2. The fourth wavelength conversion layer WCL4 may be disposed in the third sub-pixel SPX3, and the second light transmitting layer TPL2 may be disposed in the fourth sub-pixel SPX4. Further, the first to sixth color filter layers CFL1, CFL2, CFL3, CFL4, CFL5, and CFL6 may be disposed to correspond to the color control structures TPL and WCL in each sub-pixel SPXn. This embodiment is different from the embodiment shown in FIGS. 9 to 14 in that four electrodes are arranged as one set and a greater number of light emitting elements ED are connected in series in each sub-pixel SPXn of the display device 10_6. The other descriptions are the same as those described above, and a detailed description thereof will be omitted.

In concluding the detailed description, those skilled in the art will appreciate that many variations and modifications can be made to the embodiments described herein without substantially departing from the principles of the disclosure. Therefore, the described embodiments of the disclosure are to be used and understood in a generic and descriptive sense and not for purposes of limitation.

What is claimed is:

1. A display device comprising:
   a plurality of sub-pixels, each comprising a first electrode and a second electrode extending in a first direction and spaced apart from each other in a second direction and a plurality of light emitting elements on and electrically connected to the first electrode and the second electrode;
   a bank layer respectively extending around and defining a region at where the light emitting elements of each of the sub-pixels are arranged; and
   wherein the sub-pixels comprise:
      a first sub-pixel comprising a first wavelength conversion layer overlapping the light emitting elements in a first region bounded by the bank layer; and
      a second sub-pixel comprising a second wavelength conversion layer, a third wavelength conversion layer, and a first light transmitting layer, each of which overlaps some of the light emitting elements, in a second region bounded by the bank layer,
   wherein the second wavelength conversion layer and the third wavelength conversion layer of the second sub-pixel contain different wavelength conversion particles, wherein the light emitting elements overlapping the second wavelength conversion layer, the third wavelength conversion layer, and the first light transmitting layer of the second sub-pixel, respectively, are on the same first and second electrodes, and
   wherein each of the second wavelength conversion layer, the third wavelength conversion layer, and the first light transmitting layer of the second sub-pixel overlaps different portions of the first electrode and the second electrode.

2. The display device of claim 1, wherein the first wavelength conversion layer overlaps each of the light emitting elements in the first sub-pixel and contains first wavelength conversion particles identical to those of the second wavelength conversion layer.

3. The display device of claim 1, wherein the bank layer divides the second region at where the light emitting elements of the second sub-pixel are arranged into a plurality of sub-emission areas, and
   wherein the second wavelength conversion layer, the third wavelength conversion layer, and the first light transmitting layer are in each of the sub-emission areas.

4. The display device of claim 1, wherein the sub-pixels further comprise a third sub-pixel comprising a fourth wavelength conversion layer overlapping the light emitting elements in a third region bounded by the bank layer, and
   wherein the fourth wavelength conversion layer contains second wavelength conversion particles identical to those of the third wavelength conversion layer.

5. The display device of claim 4, wherein the sub-pixels further comprise a fourth sub-pixel comprising a second light transmitting layer overlapping the light emitting elements in a fourth region bounded by the bank layer.

6. The display device of claim 5, wherein the fourth wavelength conversion layer of the third sub-pixel overlaps the plurality of light emitting elements in the third sub-pixel, and
   wherein the second light transmitting layer of the fourth sub-pixel overlaps the plurality of light emitting elements in the fourth sub-pixel.

7. A display device comprising:
   a plurality of sub-pixels, each comprising a first electrode and a second electrode extending in a first direction and spaced apart from each other in a second direction and a plurality of light emitting elements on and electrically connected to the first electrode and the second electrode;
   a bank layer respectively extending around and defining a region at where the light emitting elements of each of the sub-pixels are arranged; and
   a first color filter layer, a second color filter layer, a third color filter layer, and a fourth color filter layer,
   wherein at least two of the second color filter layer, the third color filter layer, and the fourth color filter layer partially overlap each other,
   wherein the sub-pixels comprise:
      a first sub-pixel comprising a first wavelength conversion layer overlapping the light emitting elements in a first region bounded by the bank layer; and
      a second sub-pixel comprising a second wavelength conversion layer, a third wavelength conversion layer, and a first light transmitting layer, each of which overlaps some of the light emitting elements, in a second region bounded by the bank layer, wherein the second wavelength conversion layer and the third wavelength conversion layer of the second sub-pixel contain different wavelength conversion particles, and wherein the first color filter layer is on the first wavelength conversion layer of the first sub-pixel, the second color filter layer is on the second wavelength conversion layer, the third color filter layer is on the third wavelength conversion layer, and the fourth color filter layer is on the first light transmitting layer of the second sub-pixel.

8. The display device of claim 7, wherein the second wavelength conversion layer, the third wavelength conversion layer, and the first light transmitting layer are spaced apart from each other in the first direction.

9. The display device of claim 7, wherein the second wavelength conversion layer, the third wavelength conversion layer, and the first light transmitting layer are arranged in the first direction and are in contact with each other.

10. The display device of claim 7, wherein the second color filter layer and the third color filter layer are arranged to partially overlap each other, wherein the display device further comprises a color pattern on an overlapping portion of the second color filter layer and the third color filter layer, the color pattern containing the same colorant as that of the fourth color filter layer.

11. The display device of claim 7, wherein the second wavelength conversion layer, the third wavelength conversion layer, and the first light transmitting layer of the second sub-pixel are arranged in the first direction, wherein the third wavelength conversion layer partially overlaps each of the second wavelength conversion layer and the first light transmitting layer, and wherein the third color filter layer partially overlaps each of the second color filter layer and the fourth color filter layer.

12. A display device comprising:

a plurality of sub-pixels comprising a first electrode and a second electrode extending in a first direction and spaced apart from each other in a second direction and a plurality of light emitting elements on the first electrode and the second electrode and electrically connected to the first electrode and the second electrode;

a bank layer extending around a region at where the light emitting elements of the sub-pixels are arranged; and a light transmitting layer in the region bounded by the bank layer, wherein the sub-pixels comprise:

a first sub-pixel electrically connected to the first electrode and the second electrode and comprising a first light emitting element configured to emit light of a first color; and a second sub-pixel comprising a first light emitting element electrically connected to the first electrode and the second electrode and configured to emit light of the first color, a second light emitting element configured to emit light of a second color different from the first color, and a third light emitting element configured to emit light of a third color different from the first color and the second color, and wherein the second sub-pixel comprises:

a third electrode and a fourth electrode electrically connected to the second light emitting element and spaced apart from the first electrode and the second electrode in the first direction, respectively; and a fifth electrode and a sixth electrode electrically connected to the third light emitting element and spaced apart from the third electrode and the fourth electrode in the first direction, respectively.

13. The display device of claim 12, wherein the light transmitting layer in the first sub-pixel overlaps the first light emitting element of the first sub-pixel, and wherein the light transmitting layer in the second sub-pixel overlaps each of the first light emitting element, the second light emitting element, and the third light emitting element of the second sub-pixel.

14. The display device of claim 13, wherein the first light emitting element, the second light emitting element, and the third light emitting element of the second sub-pixel are spaced apart from each other in the first direction, wherein the bank layer extends around each of a region at where the first light emitting element is arranged, a region at where the second light emitting element is arranged, and a region at where the third light emitting element is arranged in the second sub-pixel, and wherein the light transmitting layer in the second sub-pixel is in the region bounded by the bank layer in the second sub-pixel.

15. The display device of claim 13, wherein the sub-pixels further comprise a third sub-pixel electrically connected to the first electrode and the second electrode and comprising the second light emitting element configured to emit light of the second color, and wherein the light transmitting layer in the third sub-pixel overlaps the second light emitting element of the third sub-pixel.

16. The display device of claim 13, wherein the sub-pixels further comprise a fourth sub-pixel electrically connected to the first electrode and the second electrode and comprising the third light emitting element configured to emit light of the third color, and wherein the light transmitting layer in the fourth sub-pixel overlaps the third light emitting element of the fourth sub-pixel.

17. The display device of claim 12, wherein the second sub-pixel comprises a first transistor electrically connected to the first electrode, a second transistor electrically connected to the third electrode, and a third transistor electrically connected to the fifth electrode, and wherein the first transistor, the second transistor, and the third transistor are each electrically connected to a first voltage line configured to receive a first power voltage.

18. The display device of claim 17, wherein each of the second electrode of the first sub-pixel and the second electrode, the fourth electrode, and the sixth electrode of the second sub-pixel is electrically connected to a second voltage line configured to receive a second power voltage different from the first power voltage, and wherein the first sub-pixel comprises one transistor electrically connected to the first electrode and the first voltage line.

* * * * *